United States Patent [19]

Saitoh et al.

[11] Patent Number: 4,701,393

[45] Date of Patent: Oct. 20, 1987

[54] MEMBER WITH LIGHT RECEIVING LAYER OF A-SI(GE) AND A-SI AND HAVING PLURALITY OF NON-PARALLEL INTERFACES

[75] Inventors: Keishi Saitoh, Ibaraki; Masahiro Kanai, Tokyo; Tetsuo Sueda, Chofu; Teruo Misumi, Kawasaki; Yoshio Tsuezuki, Toride; Kyosuke Ogawa, Tokyo, all of Japan

[73] Assignee: Canon Kabushiki Kaisha, Tokyo, Japan

[21] Appl. No.: 720,011

[22] Filed: Apr. 4, 1985

[30] Foreign Application Priority Data

| Apr. 6, 1984 | [JP] | Japan | 59-69599 |
| Apr. 9, 1984 | [JP] | Japan | 59-70474 |
| Apr. 9, 1984 | [JP] | Japan | 59-70475 |
| Apr. 17, 1984 | [JP] | Japan | 59-77283 |
| Apr. 18, 1984 | [JP] | Japan | 59-78080 |
| Apr. 19, 1984 | [JP] | Japan | 59-79006 |

[51] Int. Cl.$^4$ ............................................. G03G 5/085
[52] U.S. Cl. ........................................ 430/57; 430/69; 430/84

[58] Field of Search .................. 430/57, 69, 84, 95

[56] References Cited

U.S. PATENT DOCUMENTS 4,490,450  12/1984  Shimizu et al. ..................... 430/57
4,491,626   1/1985  Kawamura et al. .................. 430/57

*Primary Examiner*—John L. Goodrow
*Attorney, Agent, or Firm*—Fitzpatrick, Cella, Harper & Scinto

[57] ABSTRACT

A light receiving member comprises a light receiving layer of a multi-layer structure having a first layer comprising an amorphous material containing silicon atoms and germanium atoms, a second layer comprising an amorphous material containing silicon atoms and exhibiting photoconductivity and a surface layer having reflection preventive function provided on a substrate successively from the substrate side, said light receiving layer having at least one pair of non-parallel interfaces within a short range and said non-parallel interfaces being arranged in a large number in at least one direction within the plane perpendicular to the layer thickness direction.

91 Claims, 45 Drawing Figures

FIG. 8
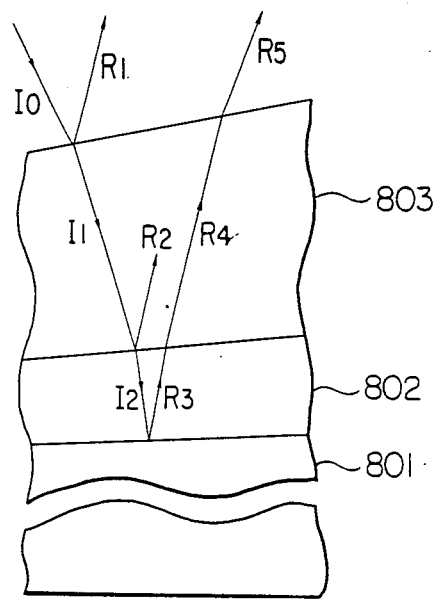
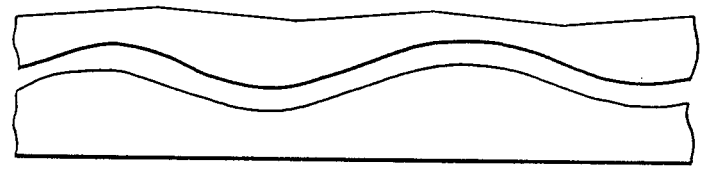
FIG. 9A
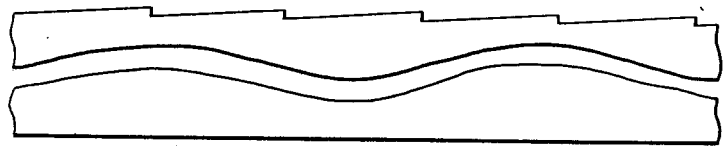
FIG. 9B
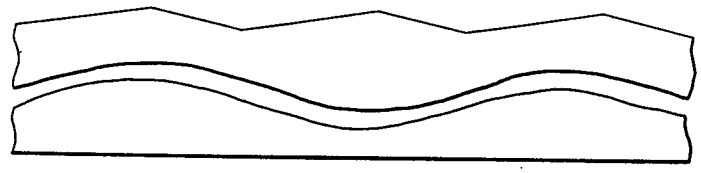
FIG. 9C

MEMBER WITH LIGHT RECEIVING LAYER OF A-SI(GE) AND A-SI AND HAVING PLURALITY OF NON-PARALLEL INTERFACES

CROSS-REFERENCE TO RELATED APPLICATIONS

This application contains subject matter related to commonly assigned, copending Application Ser. Nos. 697,141; 699,868; 705,516; 709,888; 717,821; 740,901; 786,970; 725,751; 726,768, 719,980; 739,867, 740,714; 741,300; 753,078; 752,920 and 753,011.

BACKGROUND OF THE INVENTION

1. Field of the Invention

This invention relates to a light receiving member having sensitivity to electromagnetic waves such as light [herein used in a broad sense, including ultraviolet rays, visible light, infrared rays, X-rays and gamma-rays]. More particularly, it pertains to a light receiving member suitable for using a coherent light such as laser beam.

2. Description of the Prior Art

As the method for recording a digital image information as an image, there have been well known the methods in which an electrostatic latent image is formed by scanning optically a light receiving member with a laser beam modulated corresponding to a digital image information, then said latent image is developed, followed by processing such as transfer or fixing, if desired, to record an image. Among them, in the image forming method employing electrophotography, image recording has been generally practiced with the use of a small size and inexpensive He-Ne laser or a semiconductor laser (generally having an emitted wavelength of 650–820 nm).

In particular, as the light receiving member for electrophotography which is suitable when using a semiconductor laser, an amorphous material containing silicon atoms (hereinafter written briefly as "A-Si") as disclosed in Japanese Laid-open Patent Application Nos. 86341/1979 and 83746/1981 is attracting attention for its high Vickers hardness and non-polluting properties in social aspect in addition to the advantage of being by far superior in matching in its photosensitive region as compared with other kinds of light receiving members.

However, when the photosensitive layer is made of a single A-Si layer, for ensuring dark resistance of $10^{12}$ ohm.cm or higher required for electrophotography while maintaining high photosensitivity, it is necessary to incorporate structurally hydrogen atoms or halogen atoms or boron atoms in addition thereto in controlled form within specific ranges of amounts. Accordingly, control of layer formation is required to be performed severely, whereby tolerance in designing of a light receiving member is considerably limited.

As attempts to enlarge this tolerance in designing, namely to enable effective utilization of its high photosensitivity in spite of somewhat lower dark resistance, there have been proposed a light receiving layer with a multi-layer structure of two or more laminated layers with different conductivity characteristics with formation of a depletion layer within the light receiving layer, as disclosed in Japanese Laid-open Application Nos. 121743/1979, 4053/1982 and 4172/1982, or a light receiving member with a multi-layer structure in which a barrier layer is provided between the substrate and the photosensitive layer and/or on the upper surface of the photosensitive layer, thereby enhancing apparent dark resistance of the light receiving layer as a whole, as disclosed in Japanese Laid-open Patent Application Nos. 52178/1982, 52179/1982, 52180/1982, 58159/1982, 58160/1982 and 58161/1982.

According to such proposals, A-Si type light receiving members have been greatly advanced in tolerance in designing of commercialization thereof or easiness in management of its production and productivity, and the speed of development toward commercialization is now further accelerated.

When carrying out laser recording by use of such a light receiving member having a light receiving layer of a multi-layer structure, due to irregularity in thickness of respective layers, and also because of the laser beam which is an coherent monochromatic light, it is possible that the respective reflected lights reflected from the free surface on the laser irradiation side of the light receiving layer and the layer interface between the respective layers constituting the light receiving layer and between the substrate and the light receiving layer (hereinafter "interface" is used to mean comprehensively both the free surface and the layer interface) may undergo interference.

Such an interference phenomenon results in the so-called interference fringe pattern in the visible image formed and causes a poor iamge. In particular, in the case of forming a medium tone image with high gradation, bad appearance of the image will become marked.

Moreover, as the wavelength region of the semiconductor laser beam is shifted toward longer wavelength, absorption of said laser beam in the photosensitive layer becomes reduced, whereby the above interference phenomenon becomes more marked.

This point is explained by referring to the drawings.

FIG. 1 shows a light $I_0$ entering a certain layer constituting the light receiving layer of a light receiving member, a reflected light $R_1$ from the upper interface 102 and a reflected light $R_2$ reflected from the lower interface 101.

Now, the average layer thickness of the layer is defined as d, its refractive index as n and the wavelength of the light as $\lambda$, and when the layer thickness of a certain layer is ununiform gently with a layer thickness difference of $\lambda/2n$ or more, changes in absorbed light quantity and transmitted light quantity occur depending on to which condition of $2nd=m\lambda$(m is an integer, reflected lights are strengthened with each other) and $2nd=(m+\frac{1}{2})\lambda$(m is an integer, reflected lights are weakened with each other) the reflected lights $R_1$ and $R_2$ conform.

In the light receiving member of a multi-layer structure, the interference effect as shown in FIG. 1 occurs at each layer, and there ensues a synergistic deleterious influence through respective interferences as shown in FIG. 2. For this reason, the interference fringe corresponding to said interference fringe pattern appears on the visible image transferred and fixed on the transfer member to cause bad images.

As the method for cancelling such an inconvenience, it has been proposed to subject the surface of the substrate to diamond cutting to provide unevenness of $\pm 500$ Å–$\pm 10,000$ Å, thereby forming a light scattering surface (as disclosed in Japanese Laid-open Patent Application No. 162975/1983); to provide a light absorbing layer by subjecting the aluminum substrate surface to black Alumite treatment or dispersing carbon, color pigment or dye in a resin (as disclosed in Japanese Laid-open Patent Application No. 165845/1982); and to provide a light scattering reflection preventive layer on the substrate surface by subjecting the aluminum substrate surface to satin-like Alumite treatment or by providing a sandy fine unevenness by sand blast (as disclosed in Japanese Laid-open Patent Application No. 16554/1982).

However, according to these methods of the prior art, the interference fringe pattern appearing on the image could not completely be cancelled.

For example, because only a large number of unevenness with specific sized are formed on the substrate surface according to the first method, although prevention of appearance of interference fringe through light scattering is indeed effected, regular reflection light component yet exists. Therefore, in addition to remaining of the interference fringe by said regular reflection light, enlargement of irradiated spot occurs due to the light scattering effect on the surface of the substrate to be a cause for substantial lowering of resolution.

As for the second method, such a black Alumite treatment is not sufficient for complete absorption, but reflected light from the substrate surface remains. Also, there are involved various inconveniences. For example, in providing a resin layer containing a color pigment dispersed therein, a phenomenon of degassing from the resin layer occurs during formation of the A-Si photosensitive layer to markedly lower the layer quality of the photosensitive layer formed, and the resin layer suffers from a damage by the plasma during formation of A-Si photosensitive layer to be deteriorated in its inherent absorbing function. Besides, worsening of the surface state deleteriously affects subsequent formation of the A-Si photosensitive layer.

In the case of the third method of irregularly roughening the substrate surface, as shown in FIG. 3, for example, the incident light $I_0$ is partly reflected from the surface of the light receiving layer 302 to become a reflected light $R_1$, with the remainder progressing internally through the light receiving layer 302 to become a transmitted light $I_1$. The transmitted light $I_1$ is partly scattered on the surface of the substrate 301 to become scattered lights $K_1, K_2, K_3 \ldots K_n$, with the remainder being regularly reflected to become a reflected light $R_2$, a part of which goes outside as an emitted light $R_3$. Thus, since the reflected light $R_1$ and the emitted light $R_3$ which is an interferable component remain, it is not yet possible to extinguish the interference fringe pattern.

On the other hand, if diffusibility of the surface of the substrate 301 is increased in order to prevent multiple reflections within the light receiving layer 302 through prevention of interference, light will be diffused within the light receiving layer 302 to cause halation, whereby resolution is disadvantageously lowered.

Particularly, in a light receiving member of a multi-layer structure, as shown in FIG. 4, even if the surface of the substrate 401 may be irregularly roughened, the reflected light $R_2$ from the first layer 402, the reflected light $R_1$ from the second layer 403 and the regularly reflected light $R_3$ from the surface of the substrate 401 are interfered with each other to form an interference fringe pattern depending on the respective layer thicknesses of the light receiving member. Accordingly, in a light receiving member of a multi-layer structure, it was impossible to completely prevent appearance of interference fringes by irregularly roughening the surface of the substrate 401.

In the case of irregularly roughening the substrate surface according to the method such as sand blasting, etc., the roughness will vary so much from lot to lot, and there is also nonuniformity in roughness even in the same lot, and therefore production control could be done with inconvenience. In addition, relatively large projections with random distributions are frequently formed, hence causing local breakdown of the light receiving layer during charging treatment.

On the other hand, in the case of simply roughening the surface of the substrate 501 regularly, as shown in FIG. 5, since the light-receiving layer 502 is deposited along the uneven shape of the surface of the substrate 501, the slanted plane of the unevenness of the substrate 501 becomes parallel to the slanted plane of the unevenness of the light receiving layer 502.

Accordingly, for the incident light on that portion, $2nd_1 = m\lambda$ or $2nd_1 = (m + \frac{1}{2})\lambda$ holds, to make it a light portion or a dark portion. Also, in the light receiving layer as a whole, since there is nonuniformity in which the maximum difference among the layer thicknesses $d_1$, $d_2$, $d_3$ and $d_4$ of the light receiving layer is $\lambda/2n$ or more, there appears a light and dark fringe pattern.

Thus, it is impossible to completely extinguish the interference fringe pattern by only roughening regularly the surface of the substrate 501.

Also, in the case of depositing a light receiving layer of a multi-layer structure on the substrate, the surface of which is regularly roughened, in addition to the interference between the regularly reflected light from the substrate surface and the reflected light from the light receiving layer surface as explained for light receiving member of a single layer structure in FIG. 3, interferences by the reflected lights from the interfaces between the respective layers participate to make the extent of appearance of interferance fringe pattern more complicated than in the case of the light receiving member of a single layer structure.

SUMMARY OF THE INVENTION

An object of the present invention is to provide a novel light-receiving member sensitive to light, which has cancelled the drawbacks as described above.

Another object of the present invention is to provide a light-receiving member which is suitable for image formation by use of a coherent monochromatic light and also easy in production management.

Still another object of the present invention is to provide a light-receiving member which can cancel the interference fringe pattern appearing during image formation and appearance of speckles on reversal developing at the same time and completely.

Still another object of the prevent invention is to provide a light-receiving member which is high in dielectric strength and photosensitivity and excellent in electrophotographic characteristics.

It is also another object of the present invention to provide a light-receiving member, which can provide an image of high quality which is high in density, clear in halftone and high in resolution and is suitable for electrophotography.

Still another object of the present invention is to provide a light receiving member which is capable of reducing light reflection from the surface of the light receiving member and utilizing incident light efficiently.

According to the present invention, there is provided a light receiving member comprising a light receiving layer of a multi-layer structure having a first layer comprising an amorphous material containing silicon stoms and germanium atoms, a second layer comprising an amorphous material containing silicon atoms and exhibiting photoconductivity and a surface layer having reflection preventive function provided on a substrate successively from the substrate side, said light receiving layer having at least one pair of non-parallel interfaces within a short range and said non-parallel interfaces being arranged in a large number in at least one direction within the plane perpendicular to the layer thickness direction.

BRIEF DESCRIPTION OF THE DRAWINGS

FIG. 8 is a schematic illustration of no appearance of interference fringe in the case of non-parallel interfaces between respective layers;

FIGS. 9 (A), (B) and (C) are schematic illustrations of the surface condition of typical substrates;

DESCRIPTION OF THE PREFERRED EMBODIMENTS

Referring now to the accompnaying drawings, the present invention is to be described in detail.

FIG. 6 is a schematic illustration for explanation of the basic principle of the present invention.

In the present invention, on a substrate (not shown) having a fine uneven shape smaller than the resolution required for the device, a light-receiving layer of a multi-layer constitution is provided along the uneven slanted plane, with the thickness of the second layer 602 being continuously changed from $d_5$ to $d_6$, as shown enlarged in a part of FIG. 6, and therefore the interface 603 and the interface 604 have respective gradients. Accordingly, the coherent light incident on this minute portion (short range region) l [indicated schematically in FIG. 6(C), and its enlarged view shown in FIG. 6(A)] undergoes interference at said minute portion l to form a minute interference fringe pattern.

Figure 7A:
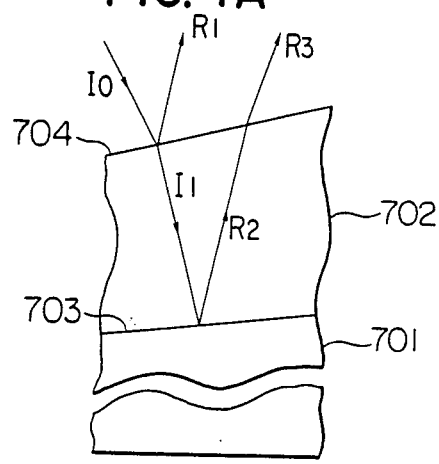
FIGS. 7 (A), (B) and (C) are schematic illustration of comparison of the reflected light intensity between the case of parallel interfaces and non-parallel interfaces between the respective layers of a light-receiving member.
Figure 7B:
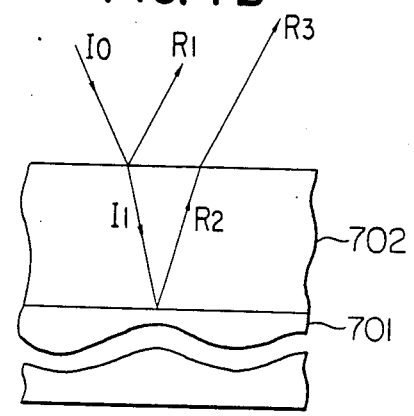

Also, as shown in FIG. 7, when the interface 703 between the first layer 701 and the second layer 702 and the free surface 704 are non-parallel to each other, the reflected light $R_1$ and the emitted light $R_3$ are different in direction of progress from each other relative to the incident light $I_0$ as shown in FIG. 7(A), and therefore the degree of interference will be reduced as compared with the case (FIG. 7(B)) when the interfaces 703 and 704 are parallel to each other.

Figure 7C:
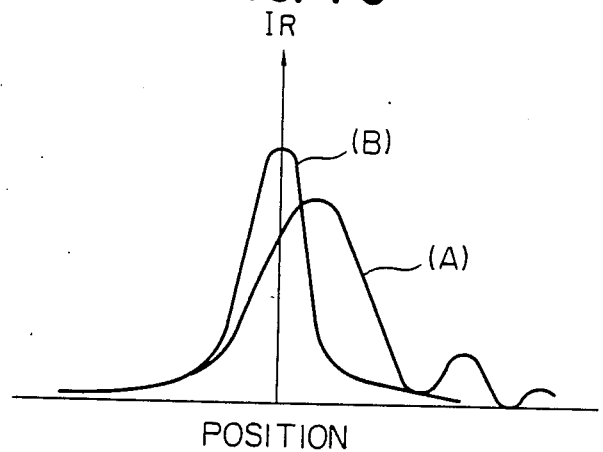

Accordingly, as shown in FIG. 7(C), as compared with the case "(B)" where a pair of the interfaces are in parallel relation, the difference in lightness and darkness in the interference fringe pattern becomes negligibly small even if interfered, if any, in the non-parallel case "(A)".

Figure 1:
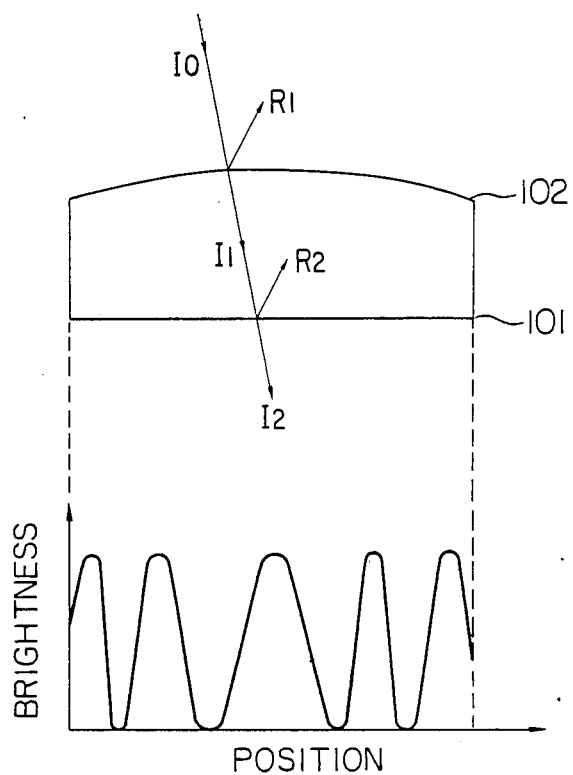
FIG. 1 is a schematic illustration of interference fringe in general.
Figure 2:
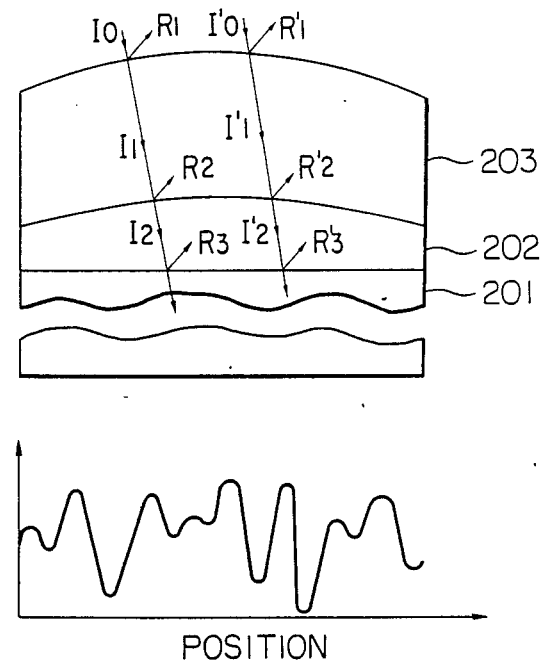
FIG. 2 is a schematic illustration of interference fringe in the case of a multi-layer light-receiving member.
Figure 3:
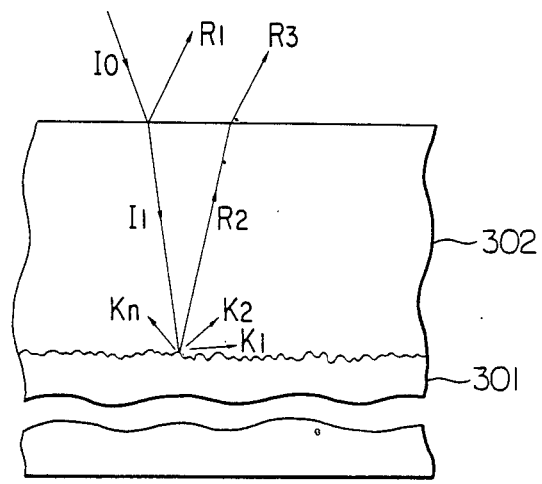
FIG. 3 is a schematic illustration of interference fringe by scattered light.
Figure 4:
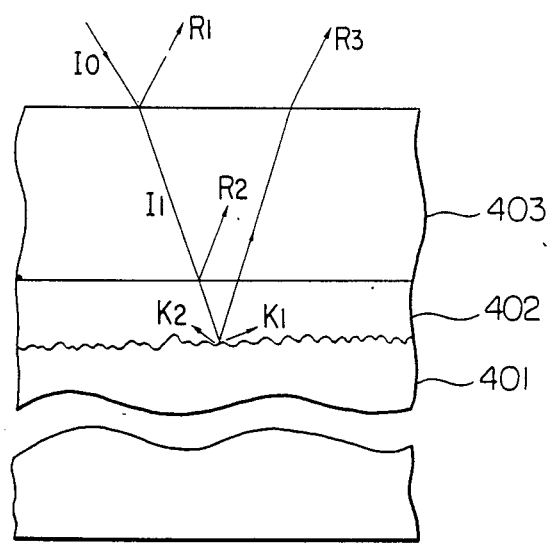
FIG. 4 is a schematic illustration of interference fringe by scattered light in the case of a multi-layer light-receiving member.
Figure 5:
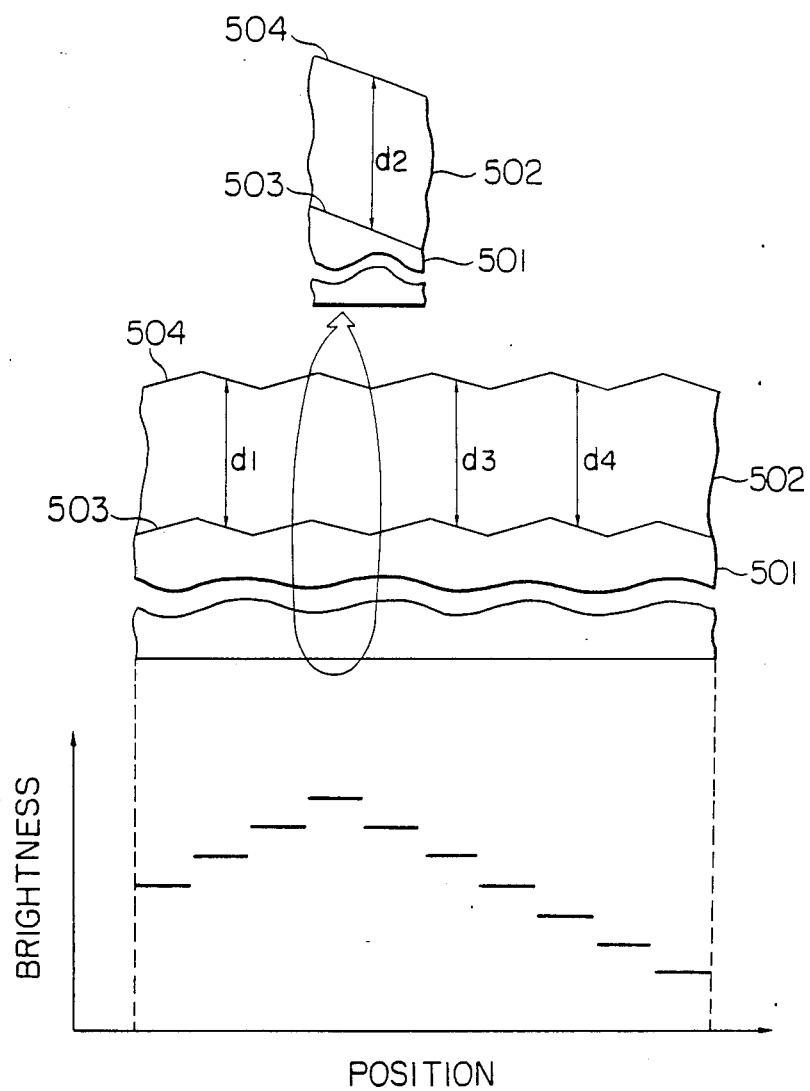
FIG. 5 is a schematic illustration of interference fringe in the case where the interfaces of respective layers of a light-receiving member are parallel to each other.
Figure 6A:
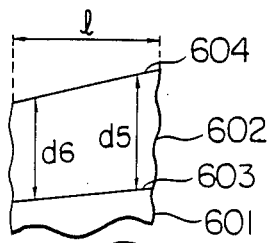
FIGS. 6 (A), (B), (C), and (D) are schematic illustrations of no appearance of interference fringe in the case of non-parallel interfaces between respective layers of a light-receiving member.
Figure 6B:
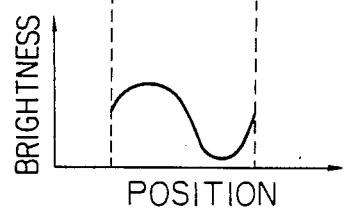
Figure 6C:
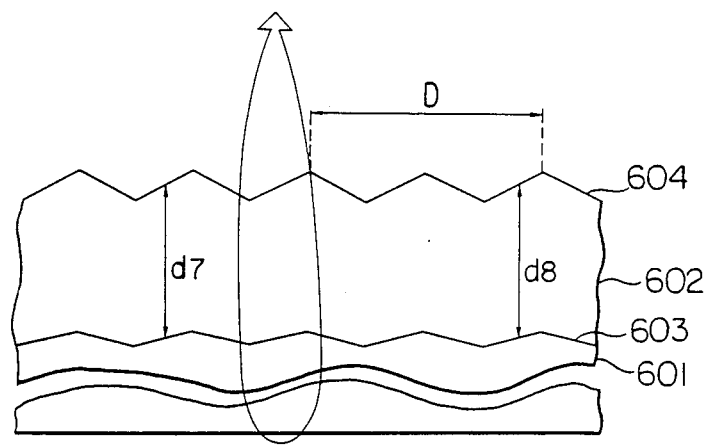
Figure 6D:
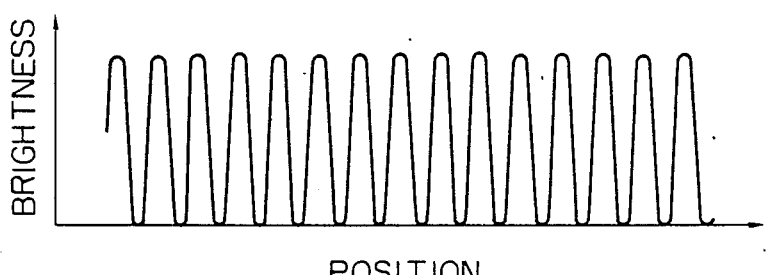

The same is the case, as shown in FIG. 6, even when the layer thickness of the layer 602 may be macroscopically ununiform ($d_7 \neq d_8$), and therefore the incident light quantity becomes uniform all over the layer region (see FIG. 6(D)).

To describe about the effect of the present invention when coherent light is transmitted from the irradiation side to the first layer in the case of a light-receiving layer of a multi-layer structure, reflected lights $R_1$, $R_2$, $R_3$, $R_4$ and $R_5$ exsit in connection with the incident light $I_0$. Accordingly, at the respective layers, the same phenomenon as described with reference to FIG. 7 occurs.

Therefore, when considered for the light-receiving layer as a whole, interference occurs as a synergetic effect of the respective layers and, according to the present invention, appearance of interference can further be prevented as the number of layers constituting the light-receiving layer is increased.

The interference fringe occurring within the minute portion cannot appear on the image, because the size of the minute portion is smaller than the spot size of the irradiated light, namely smaller than the resolution limit. Further, even if appeared on the image, there is no problem at all, since it is less than resolving ability of the eyes.

In the present invention, the slanted plane of unevenness should desirably be mirror finished in order to direct the reflected light assuredly in one direction.

The size l (one cycle of uneven shape) of the minute portion suitable for the present invention is $l \leq L$, wherein L is the spot size of the irradiation light.

Further, in order to accomplish more effectively the objects of the present invention, the layer thickness difference ($d_5$–$d_6$) at the minute portion 1 should desirably be as follows:

$d_5 - d_6 \geq \lambda/2n$ (where $\lambda$ is the wavelength of the irradiation light and n is the refractive index of the second layer 602).

In the present invention, within the layer thickness of the minute portion 1 (hereinafter called as "minute column") in the light-receiving layer of a multi-layer structure, the layer thicknesses of the respective layers are controlled so that at least two interfaces between layers may be in non-parallel relationship, and, provided that this condition is satisfied, any other pair of two interfaces between layers may be in parallel relationship within said minute column.

However, it is desirable that the layers forming parallel interfaces should be formed to have uniform layer thicknesses so that the difference in layer thickness at any two positions may be not more than:

$\lambda/2n$ (n: refractive index of the layer).

For formation of the respective layers of the first layer and the second layer constituting the light-receiving layer, in order to accomplish more effectively and easily the objects of the present invention, the plasma chemical vapor deposition method (PCVD method), the optical CVD method and thermal CVD method can be employed, because the layer thickness can accurately be controlled on the optical level thereby.

The unevenness to be provided on the substrate surface can be formed by fixing a bite having a V-shaped cutting blade at a predetermined position on a cutting working machine such as milling machine, lathe, etc., and cut working accurately the substrate surface by, for example, moving regularly in a certain direction while rotating a cylindrical substrate according to a program previously designed as desired, thereby forming to a desired unevenness shape, pitch and depth. The reverse-V-shaped linear projection produced by the unevenness formed by such a cutting working has a spiral structure with the center axis of the cylindrical substrate as its center. The spiral structure of the reverse-V-shaped projection may be made into a mutiple spiral structure such as double or triple structure or a crossed spiral structure.

Alternatively, a straight line structure along the center axis may also be introduced in addition to the spiral structure.

The shape of the longitudinal section of the protruded portion of the unevenness provided on the substrate surface is made reverse-V-shape in order to ensure managed ununiformization of layer thickness within minute columns of respective layers and good adhesion as well as desired electrical contact between the substrate and the layer provided directly on said substrate, and it should preferably be made as shown in FIG. 9 as isosceles triangle, a right triangle or a scalene triangle. Of these shapes, an isosceles triangle and a right triangle are preferred.

In the present invention, the respective dimensions of the unevenness provided on the substrate surface under managed condition are set so as to accomplish effectively the objects of the present invention in view of the following points.

More specifically, in the first place, the A-Si layer constituting the light receiving layer is sensitive to the structure of the surface on which the layer formation is effected, and the layer quality will be changed greatly depending on the surface condition.

Accordingly, it is desirable to set dimensions of the unevenness to be provided on the substrate surface so that lowering in layer quality of the A-Si layer may not be brought about.

Secondly, when there is extreme unevenness on the free surface of the light-receiving layer, cleaning cannot frequently be performed completely in cleaning step after image formation.

Further, in case of practicing blade cleaning, there is involved the problem that the blade will be damaged more earlier.

As the result of investigations of the problems is layer deposition as described above, problems in process of electrophotography and the conditions for prevention of interference fringe pattern, it has been found that the pitch at the recessed portion on the substrate surface should preferably be 500 μm to 0.3 μm, more preferably 200 μm to 1 μm, most preferably 50 μm to 5 μm.

It is also desirable that the maximum depth of the recessed portion should preferably be made 0.1 μm to 5 μm, more preferably 0.3 μm to 3 μm, most preferably 0.6 μm to 2 μm. When the pitch and the maximum depth of the recessed portions on the substrate surface are within the ranges as specified above, the gradient of the slanted plane at the recessed portion (or linear projection) may preferably be 1° to 20°, more preferably 3° to 15°, most preferably 4° to 10°.

On the other hand, the maximum of the difference in the layer thickness based on such an uniformness in layer thickness of the respective layers formed on such a substrate should preferably be made 0.1 μm to 2 μm within the same pitch, more preferably 0.1 μm to 1.5 μm, most preferably 0.2 μm to 1 μm.

The thickness of the surface layer having reflection preventive function should preferably be determined as follows in order to exhibit fully its reflection preventive function.

When the refractive index of the material for the surface layer is defined as n and the wavelength of the light irradiated is as λ, the thickness of the surface layer having reflection preventive function may preferably be:

$$d = \frac{\lambda}{4n} m \text{ (}\underline{m}\text{ is an odd number).}$$

Also, as the material for the surface layer, when the second layer on which the surface layer is to be deposited is defined as $n_a$, a material having the following refractive index is most preferred:

$$n = \sqrt{n_a}.$$

By taking such optical conditions into considerations, the layer thickness of the reflection preventive layer may preferably be 0.05 to 2 μm, provided that the wavelength of the light for exposure is within the wavelength region of from near infrared light to visible light.

In the present invention, the material to be effectively used as having reflection preventive function may include, for example, inorganic fluorides, inorganic oxides or inorganic nitrides such as $MgF_2$, $Al_2O_3$, $ZrO_2$, $TiO_2$, ZnS, $CeO_2$, $CeF_2$, $SiO_2$, SiO, $Ta_2O_5$, $AlF_3$, NaF, $Si_3N_4$ and the like or organic compounds such as polyvinyl chloride, polyamide resin, polyimide resin, vinylidene fluoride, melamine resin, epoxy resin, phenol resin, cellulose acetate and others.

These materials can be formed into the surface layer according to the vapor deposition method, the sputtering method, the plasma chemical vapor deposition method (PCVD), the optical CVD method, the thermal CVD method and the coating method, since the layer thickness can be controlled accurately at optical level in order to accomplish the objects of the present invention more effectively.

Further, the light-receiving layer in the light-receiving member of the present invention has a multi-layer structure comprising a first layer constituted of an amorphous material containing silicon atoms and germanium atoms and a second layer constituted of an amorphous material containing silicon atoms and exhibiting photoconductivity provided on a substrate successively from the substrate side, and therefore can exhibit very excellent electrical, optical and photoconductive characteristics, dielectric strength as well as good use environmental characteristics.

In particular, when it is applied as a light-receiving member for electrophotography, there is no influence of residual potential on image formation at all, with its electrical properties being stable with high sensitivity and high SN ratio, also excellent in light fatigue resistance and repeated use characteristics, whereby it is possible to obtain repeatedly and stably images of high quality with high density, clear halftone and high resolution.

Further, the light-receiving member of the present invention is high in photosensitivity over the all visible light regions, particularly in photosensitivity to the light of longer wavelength region and is therefore excellent in matching to semiconductor laser and also rapid in light response.

Referring now the drawings, the light-receiving member of the present invention is to be described in detail.

Figure 10:
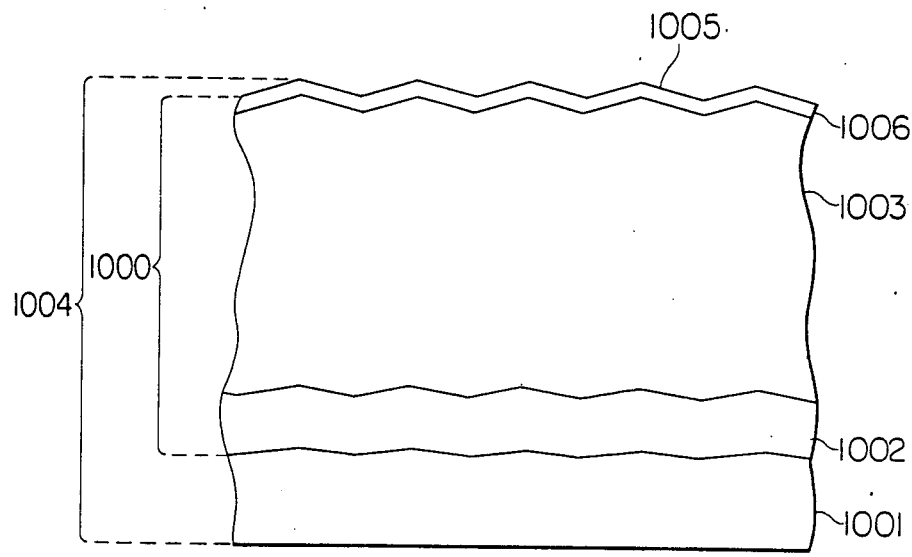
FIG. 10 is a schematic illustration of the layer constitution of a light-receiving member.

FIG. 10 is a schematic illustration of construction for explanation of the layer constitution of the light receiving member according to an embodiment of the present invention.

The light receiving member shown in FIG. 10 has a light receiving layer 1000 on a substrate 1001 for light receiving member 1004, the light receiving member having a free surface 1005 on one end surface thereof.

The light receiving layer has a layer structure, having a first layer (G) 1002 constituted of an amorphous material containing silicon atoms and germanium atoms, optionally together with hydrogen atoms and/or halogen atoms (X) (hereinafter abbreviated as A-SiGe(H,X), a second layer (S) 1003 constituted of A-Si optionally containing hydrogen atoms and/or halogen atoms (X) (hereinafter abbreviated as "A-Si(H,X)") and having photoconductivity and a surface layer 1006 having reflection preventive function laminated successively from the substrate 1001 side.

The germanium atoms contained in the first layer (G) 1002 may be contained so that the distribution state may be uniform within the first layer (G), or they can be contained continuously in the layer thickness direction in said first layer (G) 1002, being more enriched at the substrate 1001 side toward the side opposite to the side where said substrate 1001 is provided (the surface 1005 side of the light-receiving layer 1001).

When the distribution state of the germanium atoms contained in the first layer (G) is ununiform in the layer thickness direction, it is desirable that the distribution state should be made uniform in the interplanar direction in parallel to the surface of the substrate.

In the present invention, in the second layer (S) provided on the first layer (G), no germanium atoms is contained and by forming a light-receiving layer to such a layer structure, the light-receiving member obtained can be excellent in photosensitivity to the light with wavelengths of all the regions from relatively shorter wavelength to relatively longer wavelength, including visible light region.

Also, when the distribution state of germanium atoms in the first layer (G) is ununiform in the layer thickness direction, the germanium atoms are distributed continuously throughout the whole layer region while giving a change in distribution concentration C of the germanium atoms in the layer thickness direction which is decreased from the substrate toward the second layer (S), and therefore affinity between the first layer (G) and the second layer (S) is excellent. Also, as described as hereinafter, by extremely increasing the distribution concentration C of germanium atoms at the end portion on the substrate side extremely great, the light on the longer wavelength side which cannot substantially be absorbed by the second layer (S) can be absorbed in the first layer (G) substantially completely, when employing a semiconductor laser, whereby interference by reflection from the substrate surface can be prevented.

Also, in the light-receiving member of the present invention, the respective amorphous materials constituting the first layer (G) and the second layer (S) have the common constituent of silicon atoms, and therefore chemical stability can sufficiently be ensured at the laminated interface.

FIGS. 11 through 19 show typical examples of distribution in the layer thickness direction of germanium atoms contained in the first layer region (G) of the light-receiving member in the present invention.

In FIGS. 11 through 19, the abscissa indicates the content C of germanium atoms and the ordinate the layer thickness of the first layer (G), $t_B$ showing the position of the end surface of the first layer (G) on the substrate side and $t_T$ the position of the end surface of the first layer (G) on the side opposite to the substrate side. That is, layer formation of the first layer (G) containing germanium atoms proceeds from the $t_B$ side toward the $t_T$ side.

Figure 11:
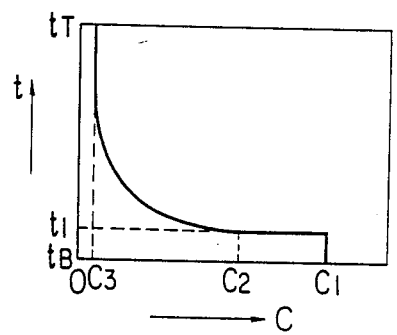
FIGS. 11 through 19 are schematic illustrations of the distribution states of germanium atoms in the first layer.

In FIG. 11, there is shown a first typical embodiment of the depth profile of germanium atoms in the layer thickness direction contained in the first layer (G).

In the embodiment as shown in FIG. 11, from the interface position $t_B$ at which the surface, on which the first layer (G) containing germanium atoms is to be formed, comes into contact with the surface of said first layer (G) to the position $t_1$, germanium atoms are contained in the first layer (G) formed, while the distribution concentration C of germanium atoms taking a constant value of $C_1$, the concentration being gradually decreased from the concentration $C_2$ continuously from the position $t_1$ to the interface position $t_T$. At the interface position $t_T$, the distribution concentration C of germanium atoms is made $C_3$.

Figure 12:
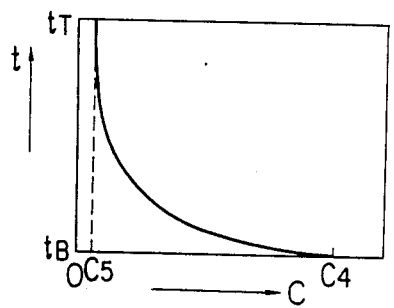

In the embodiment shown in FIG. 12, the distribution concentration C of germanium atoms contained is decreased gradually and continuously from the position $t_B$ to the position $t_T$ from the concentration $C_4$ until it becomes the concentration $C_5$ at the position $t_T$.

Figure 13:
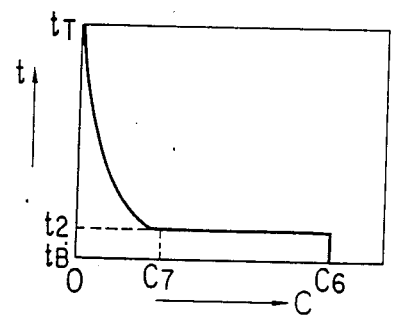

In case of FIG. 13, the distribution concentration C of germanium atoms is made constant as $C_6$ at the position $t_B$, gradually decreased continuously from the position $t_2$ to the position $t_T$, and the concentration C is made substantially zero at the position $t_T$ (substantially zero herein means the content less than the detectable limit).

Figure 14:
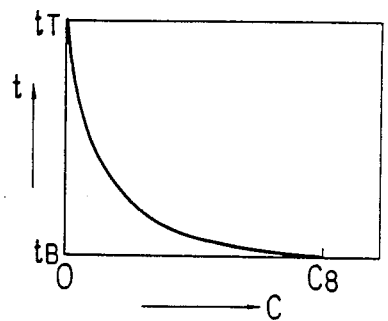

In case of FIG. 14, germanium atoms are decreased gradually and continuously from the position $t_B$ to the position $t_T$ from the concentration $C_8$, until it is made substantially zero at the position $t_T$.

Figure 15:
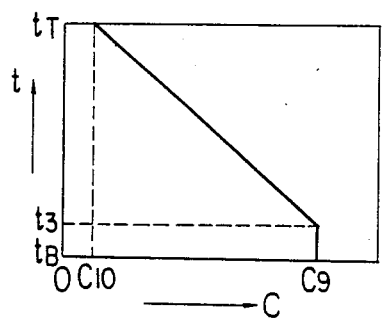

In the embodiment shown in FIG. 15, the distribution concentration C of germanium atoms is constantly $C_9$ between the position $t_B$ and the position $t_3$, and it is made $C_{10}$ at the position $t_T$. Between the position $t_3$ and the position $t_T$, the concentration C is decreased as a first order function from the position $t_3$ to the position $t_T$.

Figure 16:
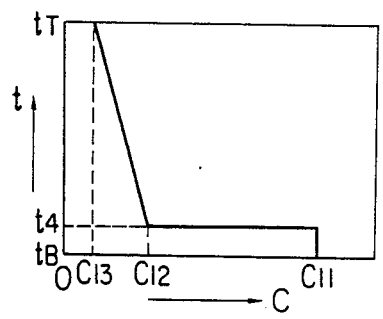

In the embodiment shown in FIG. 16, there is formed a depth profile such that the distribution concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 17:
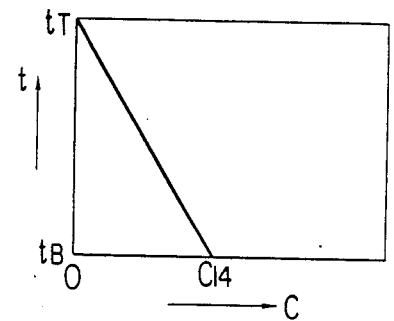

In the embodiment shown in FIG. 17, the distribution concentration C of germanium atoms is decreased as a first order function from the concentration $C_{14}$ to zero from the position $t_B$ to the position $t_T$.

Figure 18:
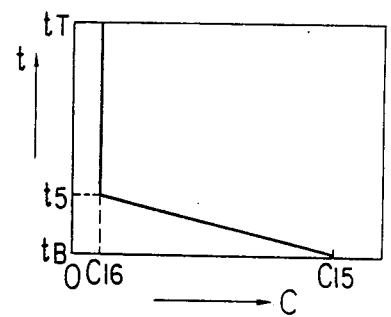

In FIG. 18, there is shown an embodiment, where the distribution concentration C of germanium atoms is decreased as a first order function from the concentration $C_{15}$ to $C_{16}$ from the position $t_B$ to $t_5$ and made constantly at the concentration $C_{16}$ between the position $t_5$ and $t_T$.

Figure 19:
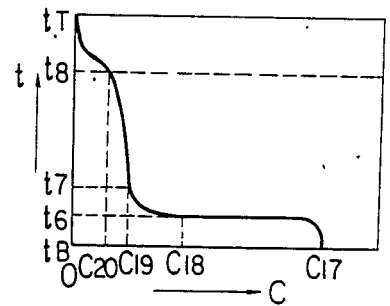

In the embodiment shown in FIG. 19, the distribution concentration C of germanium atoms is at the concentration $C_{17}$ at the position $t_B$, which concentration $C_{17}$ is initially decreased gradually and abruptly near the position $t_6$ to the position $t_6$, until it is made the concentration $C_{18}$ at the position $t_6$.

Between the position $t_6$ and the position $t_7$, the concentration is initially decreased abruptly and thereafter gradually, until it is made the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer (G) in the direction of the layer thickness by referring to FIGS. 11 through 19, when the distribution state of germanium atoms is ununiform in the layer thickness direction, the first layer (G) is provided desirably in a depth profile so as to have a portion enriched in distribution concentration C of germanium atoms on the substrate side and a portion depleted in distribution concentration C of germanium atoms considerably lower than that of the substrate side on the interface $t_T$ side.

The first layer (G) constituting the light-receiving member in the present invention is desired to have a localized region (A) containing germanium atoms at a relatively higher concentration on the substrate side as described above.

In the present invention, the localized region (A), as explained in terms of the symbols shown in FIG. 11 through FIG. 19, may be desirably provided within $5\mu$ from the interface position $t_B$.

In the present invention, the above localized region (A) may be made to be identical with the whole of the layer region ($L_T$) on the interface position $t_B$ to the thickness of $5\mu$, or alternatively a part of the layer region ($L_T$).

It may suitably be determined depending on the characteristics required for the light-receiving layer to be formed, whether the localized region (A) is made a part or whole of the layer region ($L_T$).

The localized region (A) may preferably be formed according to such a layer formation that the maximum value Cmax of the concentrations of germanium atoms in a distribution in the layer thickness direction may preferably be 1000 atomic ppm or more, more preferably 5000 atomic ppm or more, most preferably $1 \times 10^4$ atomic ppm or more based on silicon atoms.

That is, according to the present invention, it is desirable that the layer region (G) containing germanium atoms is formed so that the maximum value Cmax of the distribution concentration C may exist within a layer thickness of $5\mu$ from the substrate side (the layer region within $5\mu$ thickness from $t_B$).

In the present invention, the content of germanium atoms in the first layer (G), which may suitably be determined as desired so as to achieve effectively the objects of the present invention, may preferably be 1 to $9.5 \times 10^5$ atomic ppm, more preferably 100 to $8 \times 10^5$ atomic ppm, most preferably 500 to $7 \times 10^5$ atomic ppm.

In the present invention, the layer thickness of the first layer (G) and the thickness of the second layer (S) are one of the important factors for accomplishing effectively the objects of the present invention, and therefore sufficient care should desirably be paid in designing of the light-receiving member so that desirable characteristics may be imparted to the light-receiving member formed.

In the present invention, the layer thickness $T_B$ of the first layer (G) may preferably be 30 Å to $50\mu$, more preferably 40 Å to $40\mu$, most preferably 50 Å to $30\mu$.

On the other hand, the layer thickness T of the second layer (S) may be preferably 0.5 to $90\mu$, more preferably 1 to $80\mu$, most preferably 2 to $50\mu$.

The sum of the above layer thicknesses T and $T_B$, namely ($T + T_B$) may be suitably determined as desired in designing of the layers of the light-receiving member, based on the mutual organic relationship between the characteristics required for both layer regions and the characteristics required for the whole light-receiving layer.

In the light-receiving member of the present invention, the numerical range for the above ($T_B + T$) may generally be from 1 to $100\mu$, preferably 1 to $80\mu$, most preferably 2 to $50\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer (G) is $1 \times 10^5$ atomic ppm or more, the layer thicknesses $T_B$ should desirably be made considerably thinner, preferably $30\mu$ or less, more preferably $25\mu$ or less, most preferably $20\mu$ or less.

In the present invention, illustrative of halogen atoms (X), which may optionally be incorporated in the first layer (G) and the second layer (S) constituting the light-receiving layer, are fluorine, chlorine, bormine and iodine, particularly preferably fluorine and chlorine.

In the present invention, formation of the first layer (G) constituted of A-SiGe(H,X) may be conducted according to the vacuum deposition method utilizing discharging phenomenon, such as glow discharge method, sputtering method or ion-plating method. For example, for formation of the first layer (G) constituted of A-SiGe(H,X) according to the glow discharge method, the basic procedure comprises introducing a starting gas for Si supply capable of supplying silicon atoms (Si), a starting gas for Ge supply capable of supplying germanium atoms (Ge) optionally together with a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting layer formation on the surface of a substrate placed at a predetermined position while controlling the depth profile of germanium atoms according to a desired rate of change curve to form a layer constituent of A-SiGe (H,X). Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, a gas for introduction of hydrogen atoms (H) and/or a gas for introduction of halogen atoms (X) may be introduced, if desired, into a deposition chamber for sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred because of easiness in handling during layer formation and high efficiency for supplying Si.

As the substances which can be used as the starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred because of easiness in handling during layer formation and high efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable hydrogenated silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the light-receiving member of the present invention is formed according to the glow discharge method by employment of such a silicon compound containing halogen atoms, it is possible to form the first layer (G) constituted of A-SiGe containing halogen atoms on a desired substrate without use of a hydrogenated silicon gas as the starting gas capable of supplying Si together with the starting gas for Ge supply.

In the case of forming the first layer (G) containing halogen atoms according to the glow discharge method, the basic procedure comprises introducing, for example, a silicon halide as the starting gas for Si supply, a hydrogenated germanium as the starting gas for Ge supply and gas such as Ar, $H_2$, He, etc. at a predetermined mixing ratio into the deposition chamber for formation of the first layer (G) and exciting glow discharge to form a plasma atmosphere of these gases, whereby the first layer (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

For formation of the first layer (G) comprising A-SiGe (H,X) according to the reactive sputtering method of the ion plating method, for example, in the case of the sputtering method, two sheets of a target of Si and a target of Ge or a target of Si and Ge is employed and subjected to sputtering in a desired gas plasma atmosphere. In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer (G) gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $siH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing halogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer (G).

For introducing hydrogen atoms structurally into the first layer (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer (G) constituting the light-receiving layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the first layer (G), for example, the substrate temperature and/or the amount of the starting materials used for incorporation of hydrogen atoms (H) or halogen atoms (X) to be introduced into the deposition device system, discharging power, etc. may be controlled.

In the present invention, for formation of the second layer (S) constituted of A-Si(H,X), the starting materials (I) for formation of the first layer (G), from which the starting materials for the starting gas for supplying Ge are omitted, are used as the starting materials (II) for formation of the second layer (S), and layer formation can be effected following the same procedure and conditions as in formation of the first layer (G).

More specifically, in the present invention, formation of the second layer region (S) constituted of a-Si(H,X) may be carried out according to the vacuum deposition method utilizing discharging phenomenon such as the glow discharge method, the sputtering method or the ion-plating method. For example, for formation of the second layer (S) constituted of A-Si(H,X) according to the glow discharge method, the basic procedure comprises introducing a starting gas for Si supply capable of supplying silicon atoms (Si) as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising A-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer (S) constituting the light-receiving layer to be formed should preferably be 1 to 40 atomic %, more preferably 5 to 30 atomic %, most preferably 5 to 25 atomic %.

In the light-receiving member 1004, by incorporating a substance (C) for controlling conductivity in at least the first layer (G) 1002 and/or the second layer (S) 1003, desired conductivity characteristics can be given to the layer containing said substance (C).

In this case, the substance (C) for controlling conductivity may be contained throughout the whole layer region in the layer containing the substance (C) or contained locally in a part of the layer region of the layer containing the substance (C).

Also, in the layer region (PN) containing said substance (C), the distribution state of said substance (C) in the layer thickness direction may be either uniform or nonuniform, but desirably be made uniform within the plane in parallel to the substrate surface. When the distribution state of the substance (C) is nonuniform in the layer thickness direction, and when the substance (C) is to be incorporated in the whole layer region of the first layer (G), said substance (C) is contained in the first layer (G) so that it may be more enriched on the substrate side of the first layer (G).

Thus, in the layer region (PN), when the distribution concentration in the layer thickness direction of the above substance (C) is made non-uniform, optical and electrical junction at the contacted interface with other layers can further be improved.

In the present invention, when the substance (C) for controlling conductivity is incorporated in the first layer (G) so as to be locally present in a part of the layer region, the layer region (PN) in which the substance (C) is to be contained is provided as an end portion layer region of the first layer (G), which is to be determined case by case suitably as desired depending on.

In the present invention, when the above substance (C) is to be incorporated in the second layer (S), it is desirable to incorporate the substance (C) in the layer region including at least the contacted interface with the first layer (G).

When the substance (C) for controlling conductivity is to be incorporated in both the first layer (G) and the second layer (S), it is desirable that the layer region containing the substance (C) in the first layer (G) and the layer region containing the substance (C) in the second layer (S) may contact each other.

Also, the above substance (C) contained in the first layer (G) may be either the same as or different from that contained in the second layer (S), and their contents may be either the same or different.

However, in the present invention, when the above substance (C) is of the same kind in the both layers, it is preferred to make the content in the first layer (G) sufficiently greater, or alternatively to incorporate substances (C) with different electrical characteristics in respective layers desired.

In the present invention, by incorporating a substance (C) for controlling conductivity in at least the first layer (G) and/or the second layer (S) constituting the light-receiving layer, conductivity of the layer region containing the substance (C) [which may be either a part or the whole of the layer region of the first layer (G) and/or the second layer (S)] can be controlled as desired. As a substance (C) for controlling conductivity characteristics, there may be mentioned so called impurities in the field of semiconductors. In the present invention, there may be included p-type impurities giving p-type conductivity characteristics and n-type impurities and/or giving n-type conductivity characteristics to A-

Si(H,X) and/or A-SiGe(H,X) constituting the light receiving layer to be formed.

More specifically, there may be mentioned as p-type impurities atoms belonging to the group III of the periodic table (Group III atoms), such as B (boron), Al (aluminum), Ga(gallium), In(indium), Tl(thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) may be suitably be determined depending on the conductivity required for said layer region (PN), or when said layer region (PN) is provided in direct contact with the substrate, the organic relationships such as relation with the characteristics at the contacted interface with the substrate, etc.

Also, the content of the substance (C) for controlling conductivity is determined suitably with due considerations of the relationships with characteristics of other layer regions provided in direct contact with said layer region or the characteristics at the contacted interface with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light-receiving layer can be effectively inhibited when the free surface of the light-receiving layer is subjected to the charging treatment to $\oplus$ polarity. On the other hand, when the substance to be incorporated is a n-type impurity, migration of positive holes injected from the substrate side into the light-receiving layer may be effectively inhibited when the free surface of the light-receiving layer is subjected to the charging treatment to $\ominus$ polarity.

In the case as mentioned above, the layer region (Z) at the portion excluding the above layer region (PN) under the basic constitution of the present invention as described above may contain a substance for controlling conductivity of the other polarity, or a substance for controlling conductivity having characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the layer region (PN) and the layer region (Z), the content in the layer region (Z) should preferably be 30 atomic ppm or less.

In the present invention, it is also possible to provide a layer region containing a substance for controlling conductivity having one polarity and a layer region containing a substance for controlling conductivity having the other polarity in direct contact with each other, thus providing a so called depletion layer at said contact region.

In short, for example, a layer containing the aforesaid p-type impurity and a layer region containing the aforesaid n-type impurity are provided in the light-receiving layer in direct contact with each other to form the so called p-n junction, whereby a depletion layer can be provided.

FIGS. 27 through 35 show typical examples of the depth profiles in the layer thickness direction of the substance (C) contained in the layer region (PN) in the light-receiving layer of the present invention. In each of these Figures, representations of layer thickness and concentration are shown in rather exaggerated forms for illustrative purpose, since the difference between respective Figures will be indistinct if represented by the real values as such, and it should be understood that these Figures are schematic in nature. As practical distribution, the values of ti ($1 \leq i \leq 9$) or Ci ($1 \leq i \leq 17$) should be chosen so as to obtain desired distribution concentration lines, or values obtained by multiplying the distribution curve as a whole with an appropriate coefficient should be used.

In FIGS. 27 through 35, the abscissa shows the distribution concentration C of the substance (C), and the ordinate the layer thickness of the layer region (PN), $t_B$ indicating the position of the end surface on the substrate side of the layer region (G) and $t_T$ the position of the end surface on the side opposite to the substrate side. Thus, layer formation of the layer region (PN) containing the substance (C) proceeds from the $t_B$ side toward the $t_T$ side.

Figure 27:
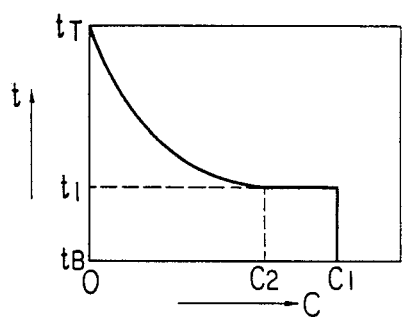
FIGS. 27 through 35 are schematic illustrations of the distribution state of the substance (C) in the layer region (PN).

FIG. 27 shows a first typical example of the depth profile of the substance (C) in the layer thickness direction contained in the layer region (PN).

In the embodiment shown in FIG. 27, from the interface position $t_B$ where the surface at which the layer region (PN) containing the substance (C) contacts the surface of said layer (G) to the position $t_1$, the substance (C) is contained in the layer region (PN) formed while the distribution concentration C of the substance (C) taking a constant value of $C_1$, and the concentration is gradually decreased from the concentration $C_2$ continuously from the position $t_1$ to the interface position $t_T$. At the interface position $t_T$, the distribution concentration C of the substance (C) is made substantially zero (here substantially zero means the case of less than detectable limit).

Figure 28:
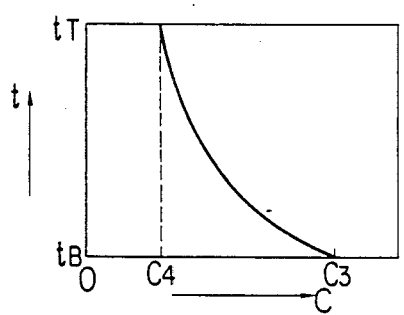

In the embodiment shown in FIG. 28, the distribution concentration C of the substance (C) contained is decreased from the position $t_B$ to the position $t_T$ gradually and continuously from the concentration $C_3$ to the concentration $C_4$ at $t_T$.

Figure 29:
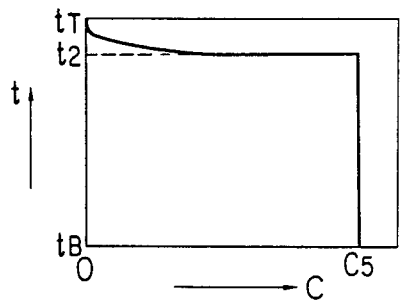

In the case of FIG. 29, from the position $t_B$ to the position $t_2$, the distribution concentration C of the substance (C) is made constantly at $C_5$, while between the position $t_2$ and the position $t_T$, it is gradually and continuously decreased, until the distribution concentration is made substantially zero at the position $t_T$.

Figure 30:
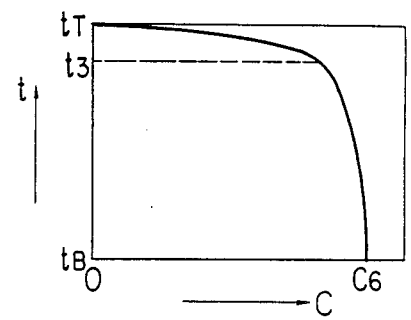

In the case of FIG. 30, the distribution concentration C of the substance (C) is first decreased continuously and gradually from the concentration $C_6$ from the position $t_B$ to the position $t_3$, from where it is abruptly decreased to substantially zero at the position $t_T$.

Figure 31:
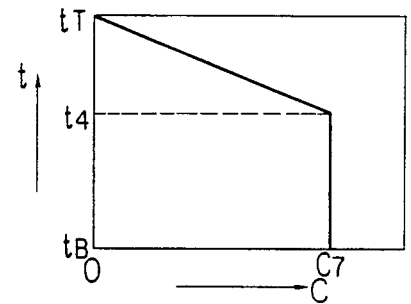

In the embodiment shown in FIG. 31, the distribution concentration of the substance (C) is constantly $C_7$ between the position $t_B$ and the position $t_T$, and the distribution concentration is made zero at the position $t_T$. Between the $t_4$ and the position $t_T$, the distribution concentration C is decreased as a first order function from the position $t_4$ to the position $t_T$.

Figure 32:
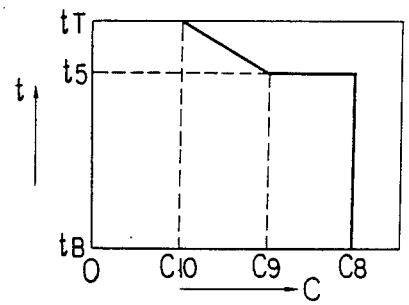

In the embodiment shown in FIG. 32, the distribution concentration C takes a constant value of $C_8$ from the position $t_B$ to the position $t_5$, while it was decreased as a first order function from the concentration $C_9$ to the concentration $C_{10}$ from the position $t_5$ to the position $t_T$.

Figure 33:
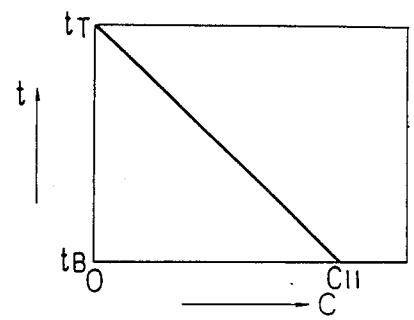

In the embodiment shown in FIG. 33, from the position $t_B$ to the position $t_T$, the distribution concentration C of the substance (C) is decreased continuously as a first order function from the concentration $C_{11}$ to zero.

Figure 34:
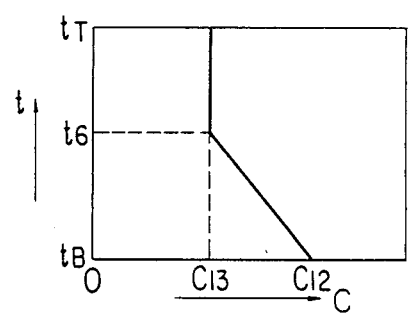

In FIG. 34, there is shown an embodiment, in which, from the position $t_B$ to the position $t_6$, the distribution concentration C of the substance C is decreased as a first order function from the concentration $C_{12}$ to the concentration $C_{13}$, and the concentration is made a constant value of $C_{13}$ between the position $t_6$ and the position $t_T$.

Figure 35:
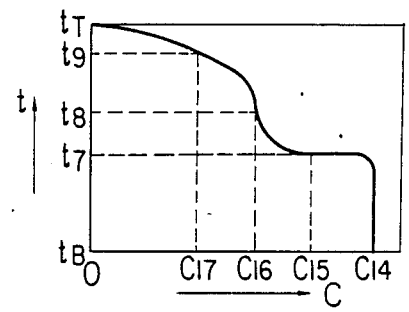

In the embodiment shown in FIG. 35, the distribution concentration C of the substance (C) is $C_{14}$ at the position $t_B$, which is gradually decreased initially from $C_{14}$ and then abruptly near the position $t_7$, where it is made $C_{15}$ at the position $t_7$.

Between the position $t_7$ and the position $t_8$, the concentration is initially abruptly decreased and then moderately gradually, until it becomes $C_{16}$ at the position $t_8$, and between the position $t_8$ and the position $t_9$, the concentration is gradually decreased to reach $C_{17}$ at the position $t_9$. Between the position $t_9$ and the position $t_T$, the concentration is decreased from $C_{17}$, following the curve with a shape as shown in Figure, to substantially zero.

As described above by referring to some typical examples of depth profiles in the layer thickness direction of the substance (C) contained in the layer region (PN) shown FIGS. 27 through 35, it is desirable in the present invention that a depth profile of the substance (C) should be provided in the layer region (PN) so as to have a portion with relatively higher distribution concentration C of the substance (C) on the substrate side, while having a portion on the interface $t_T$ side where said distribution concentration is made considerably lower as compared with the substrate side.

The layer region (PN) constituting the light-receiving member in the present invention is desired to have a localized region (B) containing the substance (C) preferably at a relatively higher concentration on the substrate side as described above.

In the present invention, the localized region (B) as explained in terms of the symbols shown in FIGS. 27 through 35, may be desirably provided within $5\mu$ from the interface position $t_B$.

In the present invention, the above localized region (B) may be made to be identical with the whole of the layer region (L) from the interface position $t_B$ to the thickness of $5\mu$, or alternatively a part of the layer region (L).

It may suitably be determined depending on the characteristics required for the light-receiving layer to be formed whether the localized region (B) should be made a part or the whole of the layer region (L).

For formation of the layer region (PN) containing the aforesaid substance (C) by incorporating a substance (C) for controlling conductivity such as the group III atoms or the group V atoms structurally into the light-receiving layer, a starting material for introduction of the group III atoms or a starting material for introduction of the group V atoms may be introduced under gaseous state into a deposition chamber together with other starting materials for formation of the respective layers during layer formation.

As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydrides such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $SbCl$, $BiH_3$, $BiCl_3$, $BiBr_3$ and the like effectively as the starting material for introduction of the group V atoms.

The substrate to be used in the present invention may be either electroconductive or insulating. As the electroconductive substrate, there may be mentioned metals such as NiCr, stainless steel, Al, Cr, Mo, Au, Nb, Ta, V, Ti, Pt, Pd etc. or alloys thereof.

As insulating substrates, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the light-receiving member 1004 in FIG. 10 is to be used as the light-receiving member for electrophotography, it may desirably be formed into an endless belt or a cylinder for use in continuous high speed copying. The substrate may have a thickness, which is conveniently determined so that the light-receiving member as desired may be formed. When the light-receiving member is required to have a flexibility, the substrate is made as thin as possible, so far as the function of a support can be exhibited. However, in such a case, the thickness is generally 10μ or more from the points of fabrication and handling of the substrate as well as its mechanical strength.

Figure 26:
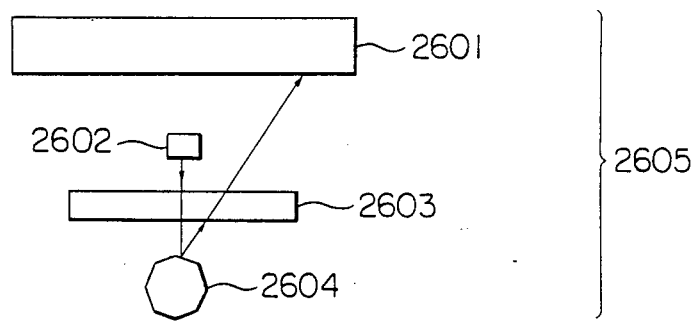
FIG. 26 is a schematic illustration of the image exposure device employed in Examples.
Figure 26:
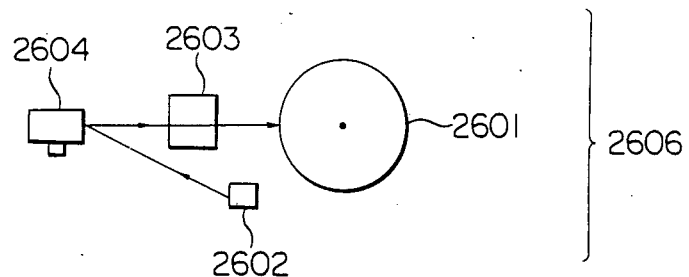

FIG. 26 is a schematic illustration of an example of the image forming device employing electrophotographic technique in which the light receiving member of the present invention is mounted.

In this Figure, 2601 is a drum-shaped light receiving member of the present invention prepared for use in electrophotography, 2602 is a semiconductor laser device which is the light source for apply exposure on the light receiving member 2601 corresponding to the information to be recorded, 2603 is a fθ lens, 2604 is a polygon-mirror, 2605 shows the plane view of the device and 2606 shows the side view of the device.

In FIG. 26, devices to be generally employed for practicing electrophotographic image formation, such as developing device, transfer device, fixing device, cleaning device, etc., are not shown.

Next, an example of the process for producing the light-receiving member of this invention is to be briefly described.

Figure 20:
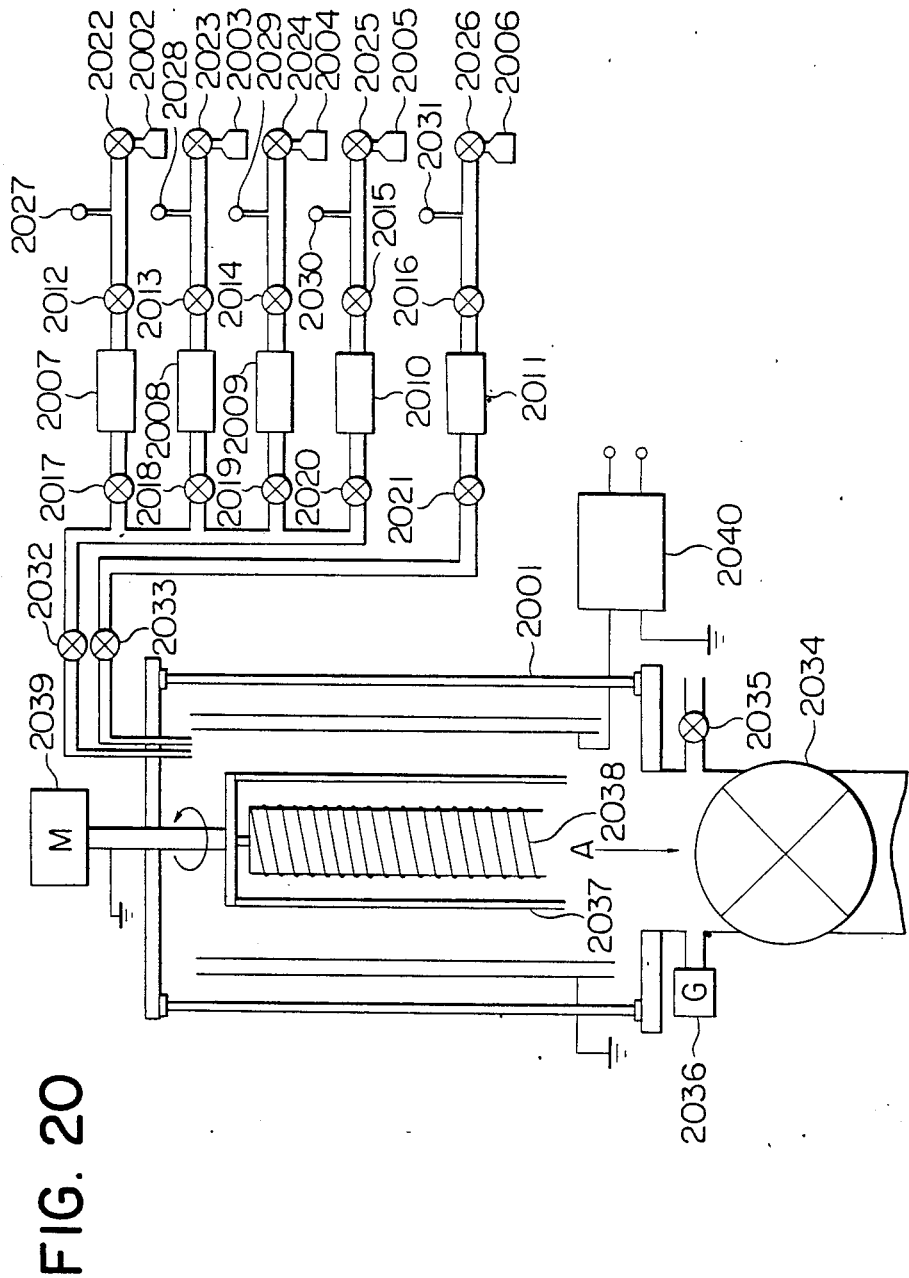
FIG. 20 is a schematic illustration of the vacuum deposition device for preparation of the light-receiving members employed in Examples.

FIG. 20 shows one example of a device for producing a light-receiving member.

In the gas bombs 2002 to 2006, there are hermetically contained starting gases for formation of the light receiving member of the present invention. For example, 2002 is a bomb containing $SiH_4$ gas (purity 99.999%, hereinafter abbreviated as $SiH_4$), 2003 is a bomb containing $GeH_4$ gas (purity 99.999%, hereinafter abbreviated as $GeH_4$), 2004 is a bomb containing $SiF_4$ gas (purity 99.99%, hereinafter abbreviated as $SiF_4$), 2005 is bomb containing $B_2H_6$ gas diluted with $H_2$ (purity 99.999%, hereinafter abbreviated as $B_2H_6/H_2$) and 2006 is a bomb containing $H_2$ gas (purity: 99.999%).

For allowing these gases to flow into the reaction chamber 2001, on confirmation of the valves 2022 to 2026 of the gas bombs 2002 to 2006 and the leak valve 2035 to be closed, and the inflow valves 2012 to 2016, the outflow valves 2017 to 2021 and the auxiliary valves 2032 and 2033 to be opened, the main valve 2034 is first opened to evacuate the reaction chamber 2001 and the gas pipelines. As the next step, when the reading on the vacuum indicator 2036 becomes above $5 \times 10^{-6}$ Torr, the auxiliary valves 2032, 2033 and the outflow valves 2017 to 2021 are closed.

Referring now to an example of forming a light receiving layer on the cylindrical substrate 2037, $SiH_4$ gas from the gas bomb 2002, $GeH_4$ gas from the gas bomb 2003, $B_2H_6/H_2$ gas from the gas bomb 2005 and $H_2$ gas from the gas bomb 2006 are permitted to flow into the mass-flow controllers 2007, 2008 2010 and 2011, respectively, by opening the valves 2022, 2023, 2025 and 2026 and controlling the pressures at the output pressure gauges 2027, 2028, 2030 and 2031 to 1 $Kg/cm^2$ and opening gradually the inflow valves, 2012, 2013, 2015 and 2016, respectively. Subsequently, the outflow valves 2017, 2018, 2020 and 2021 and the auxiliary valves 2023 and 2033 were gradually opened to permit respective gases to flow into the reaction chamber 2001. The outflow valves 2017, 2018, 2020 and 2021 are controlled so that the flow rate ratio of $SiH_4$ gas, $GeH_4$ gas, $B_2H_6/H_2$ gas, and $H_2$ gas may have a desired value and opening of the main valve 2034 is also controlled while watching the reading on the vacuum indicator 2036 so that the pressure in the reaction chamber 2001 may reach a desired value. And, after confirming that the temperature of the substrate 2037 is set at 50° to 400° C. by the heater 2038, the power source 2040 is set at a desired power to excite glow discharge in the reaction chamber 2001, simultaneously with controlling of the distribution concentrations of germanium atoms and boron atoms to be contained in the layer formed by carrying out the operation to change gradually the openings of the valves 2018, 2020 by the manual method or by means of an externally driven motor, etc. thereby changing the flow rates of $GeH_4$ gas and $B_2H_6$ gas according to previously designed change rate curves.

By maintaining the glow discharge as described above for a desired period time, the first layer (G) is formed on the substrate 2037 to a desired thickness. At the stage when the first layer (G) is formed to a desired thickness, the second layer (S) containing substantially no germanium atom can be formed on the first layer (G) by maintaining glow discharge according to the same conditions and procedure as those in formation of the first layer (G) except for closing completely the outflow valve 2018 and changing, if desired, the discharging conditions. Also, in the respective layers of the first layer (G) and the second layer (S), by opening or closing as desired the outflow valve 2020, boron atoms may be contained or not, or boron atoms may be contained only in a part of the layer region of the respective layers.

On the light receiving member whose layers up to the above second layer (S) have been formed, the surface layer is formed according to the sputtering method.

In the device shown in FIG. 20, a material for the surface layer is placed all over the cathode electrode and $H_2$ gas is replaced with Ar gas.

Next, the light receiving member whose layers up to the second layer (S) have been formed is set in the device, followed by sufficient evacuation of the device, and then Ar gas is introduced to a predetermined inner pressure. And, by introduction of a predetermined high frequency power, the material on the cathode electrode is sputtered to form the surface layer on the second layer (S).

During layer formation, it is desirable to rotate the substrate 2037 by a motor 2039 in order to effect uniformization of layer formation.

The present invention is described in more detail by referring to the following Examples.

EXAMPLE 1

By means of a lathe, twenty two aluminum substrates were worked to have the surface characteristics of No. 101A shown in Table 1A.

By use of the preparation device shown in FIG. 20, following various procedures under the conditions as shown in Table 2A, layers up to the second layer were deposited on the above 22 aluminum substrates.

Next, under the conditions as shown in Table 6A, the surface layers were deposited on these 22 aluminum substrates, respectively.

The layer thickness distribution of the light-receiving member for electrophotography of A-Si type thus prepared was measured by an electron microscope to find that the average layer thickness difference was 0.1 μm between the center and both ends of the A-Ge:H layer and 2 μm between the center and both ends of the A-Si:H layer, with the layer thickness difference at the minute portion being 0.02 μm in the A-SiGe:H layer and 0.03 μm in the A-Si:H layer.

The light-receiving member for electrophotography as prepared above was subjected to image exposure by means of a device as shown in FIG. 26 (wavelength of laser beam: 789 nm, spot diameter 80 μm), followed by development and transfer to obtain an image. The image was free from any interference fringe pattern observed and proved to be satisfactory for practical application.

EXAMPLE 2

By means of a lathe, an aluminum substrate was worked by the same manner as in Example 1 to have the surface characteristic of No. 102 A shown in Table 1A.

Next, by use of the preparation device shown in FIG. 20, following the same procedures as in Example 1 under the conditions as shown in Table 3A, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 μm between the center and both ends of the A-SiGe:H layer and 2 μm between the center and both ends of the A-Si:H layer, with the layer thickness difference at the minute portion being 0.03 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from an interference fringe pattern observed and proved to be satisfactory for practical application.

EXAMPLE 3

By means of a lathe, an aluminum substrate was worked by the same manner as in Example 1 to have the surface characteristic of No. 103 A shown in Table 1A.

Next, by use of the preparation device shown in FIG. 20, following the same procedures as in Example 1 under the conditions as shown in Table 4A, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.6 μm between the center and both ends of the A-SiGe:H layer and 2 μm between the center and both ends of the A-Si:H layer, with the layer thickness difference at the minute portion being 0.1 μm in the A-SiGe:H layer and 0.3 μm in the A-Si:H layer.

The light-receiving member for electrophotography was prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 4

By means of a lathe, an aluminum substrate was worked by the same manner as in Example 1 to have the surface characteristic of No. 104 A shown in Table 1A.

Next, by use of the preparation device shown in FIG. 20, following the same procedures as in Example 1 under the conditions as shown in Table 5A, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.8 μm between the center and both ends of the A-SiGe:H layer and 2 μm between the center and both ends of the A-Si:H layer, with the layer thickness difference at the minute portion being 0.15 μm in the A-SiGe:H layer and 0.3 μm in the A-Si:H layer.

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 5

Figure 21:
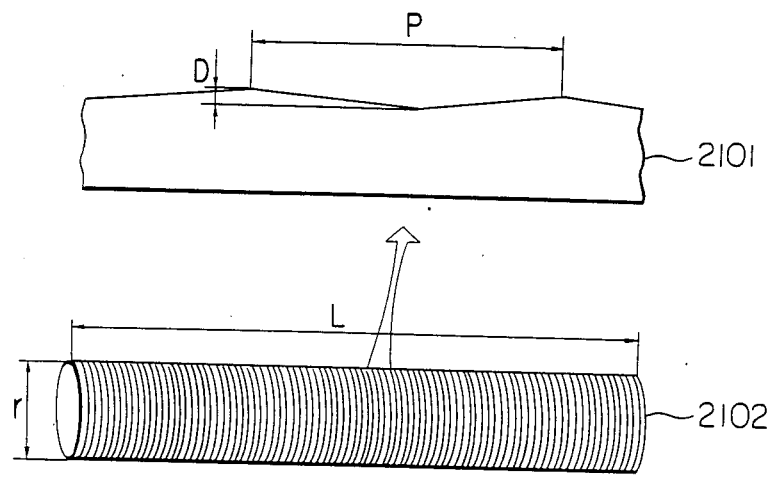
FIG. 21 is a schematic illustration of the surface states of the aluminum substrates employed in Examples.

By means of a lathe, an aluminum substrate [length (L): 357 mm, outerdiameter (r): 80 mm] was worked as shown in FIG. 21 (P: pitch, D: depth) under the conditions shown in Table 2B (Nos. 201B–204B).

Next, light-receiving members for electrophotography of A-Si type were prepared following various procedures using the preparation device in FIG. 20 under the conditions shown in Table 1B (Sample Nos. 201B–204B).

Figure 22:
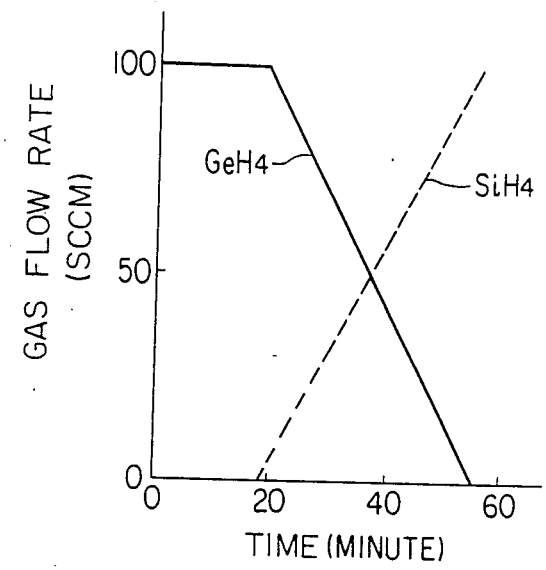
FIGS. 22 through 25, FIGS. 36 through 42, FIGS. 43 through 45, are schematic illustrations of the changes in gas flow rates of the respective gases in Examples.

In forming the A-Si:Ge:H layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 22.

The thickness of each layer of the light-receiving members thus prepared was measured using an electron microscope to obtain the results as shown in Table 2B (Nos. 201B–204B).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No 201B–204B, no interference fringe pattern was observed and proved to be satisfactory for practical application.

EXAMPLE 6

By means of a lathe, an aluminum substrate [length (L): 357 mm, outerdiameter (r): 80 mm] was worked as shown in FIG. 21 (P: pitch, D: depth) under the conditions shown in Table 3B (Sample Nos. 301B–304B).

Next, light-receiving members for electrophotography of A-Si:H were prepared following various procedures using the preparation device in FIG. 20 under the conditions shown in Table 1B (Sample Nos. 301B–304B).

Figure 23:
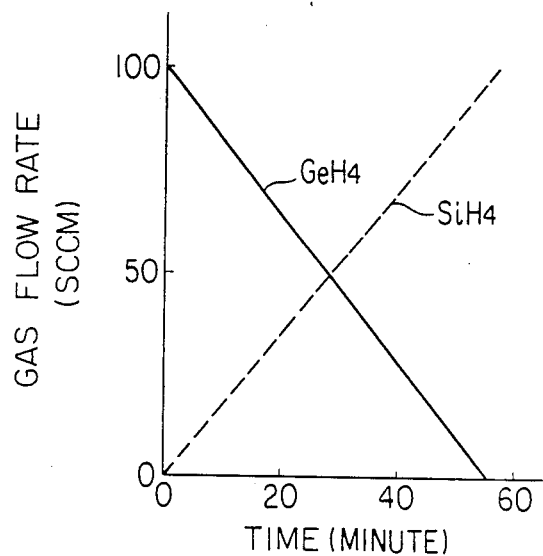

In forming the A-Si:Ge:H layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 23.

The thickness of each layer of the light-receiving members thus prepared was measured using an electron microscope to obtain the results as shown in Table 3B (Nos. 301B–304B).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 301B–304B, no interference fringe pattern was observed and proved to be satisfactory for practical application.

EXAMPLE 7

By means of a lathe, an aluminum substrate [Length (L): 357 mm, outerdiameter (r): 80 mm] was worked as shown in FIG. 21 (P: pitch, D: depth) under the conditions shown in Table 5B (Sample Nos. 501B–504B).

Next, light-receiving members for electrophotography of A-Si type were prepared following various procedures using the device in FIG. 20 under the conditions shown in Table 4B (Sample Nos. 501B–504B).

Figure 24:
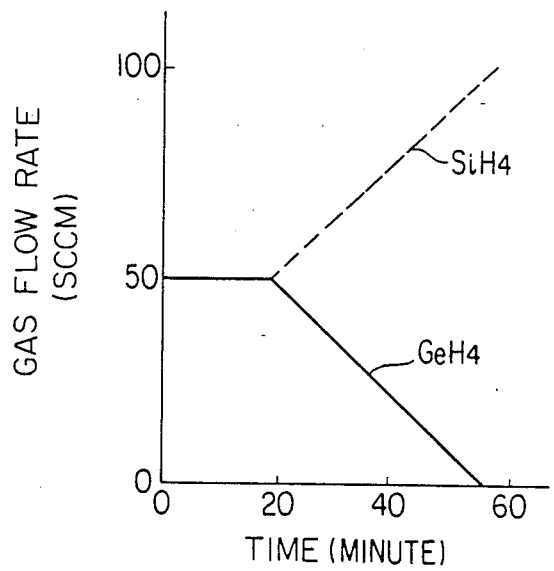

In forming the A-Si:Ge:H layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 24.

The thickness of each layer of the light-receiving members thus prepared was measured using an electron microscope to obtain the results as shown in Table 5B (Nos. 501B–504B).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 501B–504B, no interference fringe pattern was observed and proved to be satisfactory for practical application.

EXAMPLE 8

By means of a lathe, an aluminum substrate [length (L): 357 mm, outerdiameter (r): 80 mm] was worked as shown in FIG. 21 (P: pitch, D: depth) under the conditions shown in Table 6B (Sample Nos. 601B–604B).

Next, light-receiving members for electrophotography of A-Si type were prepared following various procedures using the preparation device in FIG. 20 under the conditions shown in Table 4B (Sample Nos. 601B–604B).

Figure 25:
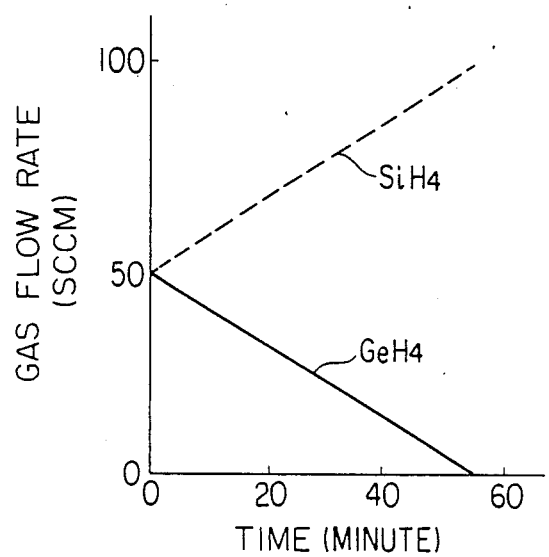

In forming the A-Si:Ge:H layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 25.

The thickness of each layer of the light-receiving members thus prepared was measured using an electron microscope to obtain the results as shown in Table 6B (Nos. 601B–604B).

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601B–604B, no interference fringe pattern was observed and proved to be satisfactory for practical application.

EXAMPLE 9

Twenty two light-receiving members having the same layer constitution as the Sample No. 201B in Example 5 up to the second layer were prepared and respective surface layers were deposited thereon under the conditions in Table 29B (Condition No. 2901B–2922B).

The light-receiving members for electrophotography as prepared above were subjected to image exposure by means of a device as shown in FIG. 26 (wavelength of laser beam: 780 nm, spot diameter 80 μm), followed by development and transfer to obtain images. In any of the images, no interference fringe pattern was observed and proved to be satisfactory for practical application.

EXAMPLE 10

By means of a lathe, an aluminum substrate [length (L): 357 mm, outer diameter (r): 80 mm] was worked as shown in FIG. 21 (P: pitch, D: depth) under the conditions shown in Table 2C (Cylinder Nos. 201C–204C).

Next, light-receiving members for electrophotography were prepared following various procedures using the deposition device in FIG. 20 under the conditions shown in Table 1C (Sample No. 201C–204C).

The thickness of each layer of the light-receiving members thus prepared was measured using an electron microscope to obtain the results as shown in Table 2C (Nos. 201C–204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 11

By means of a lathe, an aluminum substrate [length (L): 357 mm, outer diameter (r): 80 mm] was worked as shown in FIG. 21 (P: pitch, D: depth) under the conditions shown in Table 4C (Cylinder Nos. 401C–404C).

Next, a light-receiving member for electrophotography was prepared following various procedures using the deposition device in FIG. 20 under the conditions as shown in Table 3C (Sample Nos. 401C–404C).

The thickness of each layer of the light-receiving members thus prepared was measured using an electron microscope to obtain the results as shown in Table 4C (Nos. 401C–404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 12

By means of a lathe, an aluminum substrate [length (L): 357 mm, outerdiameter (r): 80 mm] was worked as shown in FIG. 21 (P: pitch, D: depth) under the conditions shown in Table 6C (Cylinder Nos. 601C–604C).

Next, a light-receiving member for electrophotography was prepared following various procedures using the film deposition device in FIG. 20 under the conditions as shown in Table 5C (Sample Nos. 601C–604C).

The thickness of each layer of the light-receiving members thus prepared was measured using an electron microscope to obtain the results as shown in Table 6C (Nos. 601C–604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 13

By means of a lathe, an aluminum substrate [length (L): 357 mm, outerdiameter (r): 80 mm] was worked as shown in FIG. 21 (P: pitch, D: depth) under the conditions shown in Table 8C (Cylinder Nos. 801C–804C).

Next, a light-receiving member for electrophotography was prepared following various procedures using the deposition device in FIG. 20 under the conditions as shown in Table 7C (Sample Nos. 801C–804C).

The thickness of each layer of the light-receiving members thus prepared was measured using an electron microscope to obtain the results as shown in Table 8C (Nos. 801C–804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 14

By means of a lathe, an aluminum substrate [length (L): 357 mm, outerdiameter (r): 80 mm] was worked as shown in FIG. 21 (P: pitch, D: depth) under the conditions shown in Table 10C (Cylinder Nos. 1001C–1004C).

Next, a light-receiving member for electrophotography was prepared following various procedures using the film deposition device in FIG. 20 under the conditions as shown in Table 7C (Sample Nos. 1001C–1004C).

The thickness of each layer of the light-receiving members thus prepared was measured using an electron microscope to obtain the results as shown in Table 10C (Nos. 1001C–1004C).

The light-receiving member for electrophotography was prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 15

By means of a lathe, an aluminum substrate [length (L): 357 mm, outerdiameter (r): 80 mm] was worked as shown in FIG. 21 (P: pitch, D: depth) under the conditions shown in Table 12C (Cylinder Nos. 1201C–1204C).

Next, a light-receiving member for electrophotography was prepared following various procedures using the film deposition device in FIG. 20 under the conditions as shown in Table 11C (Sample Nos. 1201C–1204C).

The thickness of each layer of the light-receiving members thus prepared was measured using an electron microscope to obtain the results as shown in Table 12C (Nos. 1201C–1204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 16

By means of a lathe, an aluminum substrate [length (L): 357 mm, outerdiameter (r): 80 mm] was worked as shown in FIG. 21 (P: pitch, D: depth) under the conditions shown in Table 14C (Cylinder Nos. 1401C–1404C).

Next, a light-receiving member for electrophotography was prepared following various procedures using the deposition device in FIG. 20 under the conditions as shown in Table 13C (Sample Nos. 1401C–1404C).

The thickness of each layer of the light-receiving members thus prepared was measured using an electron microscope to obtain the results as shown in Table 14C (Nos. 1401C–1404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 17

By means of a lathe, an aluminum substrate [length (L): 357 mm, outerdiameter (r): 80 mm] was worked as shown in FIG. 21 (P: pitch, D: depth) under the conditions shown in Table 16C (Cylinder Nos. 1601C–1604C).

Next, a light-receiving member for electrophotography was prepared following various procedures using the deposition device in FIG. 20 under the conditions as shown in Table 15C (Sample Nos. 1601C–1604C).

The thickness of each layer of the light-receiving members thus prepared was measured using an electron microscope to obtain the results as shown in Table 16C (Nos. 1601C–1604C).

The light-receiving member for electrophotography as prepared above was subjected to image exposure by means of a device as shown in FIG. 26 (wavelength of laser beam: 780 mm, spot diameter 80 μm), followed by development and transfer to obtain an image. The image was free from any interference fringe pattern observed and proved to be satisfactory for practical application.

EXAMPLE 18

By means of a lathe, an aluminum substrate [length (L): 357 mm, outerdiameter (r): 80 mm] was worked as shown in FIG. 21 (P: pitch, D: depth) under the conditions shown in Table 18C (Cylinder Nos. 1801C–1804C).

Next, a light-receiving member for electrophotography was prepared following various procedures using the film deposition device in FIG. 20 under the conditions as shown in Table 17C (Sample Nos. 1801C–1804C).

The thickness of each layer of the light-receiving members thus prepared was measured using an electron microscope to obtain the results as shown in Table 18C (Nos. 1801C–1804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 19

By means of a lathe, an aluminum substrate [length (L): 357 mm, outerdiameter (r): 80 mm] was worked as shown in FIG. 21 (P: pitch, D: depth) under the conditions shown in Table 20C (Cylinder Nos. 2001C–2004C).

Next, a light-receiving member for electrophotography was prepared following various procedures using the film deposition device in FIG. 20 under the conditions as shown in Table 19A (Sample Nos. 2001C–2004C).

The thickness of each layer of the light-receiving members thus prepared was measured using an electron microscope to obtain the results as shown in Table 20C (Nos. 2001C–2004C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 20

By means of a lathe, an aluminum substrate [length (L): 357 mm, outerdiameter (r): 80 mm] was worked as shown in FIG. 21 (P: pitch, D: depth) under the conditions shown in Table 22C (Cylinder Nos. 2201C–2204C).

Next, a light-receiving member for electrophotography was prepared following various procedures using the film deposition device in FIG. 20 under the conditions as shown in Table 21C (Sample Nos. 2201C–2204C).

The thickness of each layer of the light-receiving members thus prepared was measured using an electron microscope to obtain the results as shown in Table 22C (Nos. 2201C–2204C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 21

By means of a lathe, an aluminum substrate [length (L): 357 mm, outerdiameter (r): 80 mm] was worked as shown in FIG. 21 (P: pitch, D: depth) under the conditions shown in Table 24C (Cylinder Nos. 2401C–2404C).

Next, a light-receiving member for electrophotography was prepared following various procedures using the film deposition device in FIG. 20 under the conditions as shown in Table 23C (Sample Nos. 2401C–2404C).

The thickness of each layer of the light-receiving members thus prepared was measured using an electron microscope to obtain the results as shown in Table 24C (Nos. 2401C–2404C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 22

By means of a lathe, an aluminum substrate [length (L): 357 mm, outerdiameter (r): 80 mm] was worked as shown in FIG. 11 (P: pitch, D: depth) under the conditions shown in Table 26C (Cylinder Nos. 2601C–2604C).

Next, a light-receiving member for electrophotography was prepared following various procedures using the film deposition device in FIG. 20 under the conditions as shown in Table 25C (Sample Nos. 2601C–2604C).

The thickness of each layer of the light-receiving members thus prepared was measured using an electron microscope to obtain the results as shown in Table 26C (Nos. 2601C–2604C).

The light-receiving member for electrophotography as prepared above was subjected to image exposure by means of a device as shown in FIG. 26 (wavelength of laser beam: 780 nm, spot diameter 80 μm), followed by development and transfer to obtain an image. The image was free from any interference fringe pattern observed and proved to be satisfactory for practical application.

EXAMPLE 23

By means of a lathe, an aluminum substrate [length (L): 357 mm, outerdiameter (r): 80 mm] was worked as shown in FIG. 21 (P: pitch, D: depth) under the conditions shown in Table 28C (Cylinder Nos. 2801C–2804C).

Next, light-receiving members for electrophotography of a-Si:H were prepared following various procedures using the deposition device in FIG. 20 under the conditions shown in Table 27C (Sample Nos. 2802C–2804C).

The thickness of each layer of the light-receiving members thus prepared was measured using an electron microscope to obtain the results as shown in Table 28C (Nos. 2801C–2804C).

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 24

For examples 10 through 23, light-receiving members for electrophotography were prepared by use of PH$_3$ gas diluted with H$_2$ to 3000 vol. ppm in place of B$_2$H$_6$ gas diluted with H$_2$ to 3000 vol. ppm. (Sample Nos. 2901C–2913C).

Other preparation conditions were the same as in Examples 10 through 23.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 25

Twenty two light-receiving members having the same layer constitution as the Sample No. 201C in Example 10 up to the second layer were prepared and respective surface layers were deposited thereon under the conditions in Table 29C (Condition Nos. 2901C–2922C).

The light-receiving members for electrophotography as prepared above were subjected to image exposure by means of a device as shown in FIG. 26 (wavelength of laser beam: 780 nm, spot diameter 80 μm), followed by development and transfer to obtain images. In any of the images, no interference fringe pattern was observed and proved to be satisfactory for practical application.

EXAMPLE 26

By means of a lathe, an aluminum substrate [length (L): 357 mm, outerdiameter (r): 80 mm] was worked as shown in FIG. 21 (P: pitch, D: depth) under the conditions shown in Table 2D (Sample Nos. 201D–204D).

Next, light-receiving members for electrophotography of A-Si type were prepared following various procedures using the deposition device in FIG. 20 under the conditions shown in Table 1D (Sample Nos. 201D–204D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 22.

The thickness of each layer of the light-receiving members thus prepared was measured using an electron microscope to obtain the results as shown in Table 2D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 201D–204D, no interference fringe pattern was observed and proved to be satisfactory for practical application.

EXAMPLE 27

By means of a lathe, an aluminum substrate [length (L): 357 mm, outerdiameter (r): 80 mm] was worked as shown in FIG. 21 (P: pitch, D: depth) under the conditions shown in Table 3D (Sample Nos. 301D–304C).

Next, light-receiving members for electrophotography of A-Si type were prepared following various procedures using the deposition device in FIG. 20 under the conditions shown in Table 1D (Sample Nos. 301D–304D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 23.

The thickness of each layer of the light-receiving members thus prepared was measured using an electron microscope to obtain the results as shown in Table 3D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 301D–304D, no interference fringe pattern was observed and proved to be satisfactory for practical application.

EXAMPLE 28

By means of a lathe, an aluminum substrate [length (L): 357 mm, outerdiameter (r): 80 mm] was worked as shown in FIG. 21 (P: pitch, D: depth) under the conditions shown in Table 5D (Sample Nos. 501D–504D).

Next, light-receiving members for electrophotography of A-Si type were prepared following various procedures using the deposition device in FIG. 20 under the conditions shown in Table 4D (Sample Nos. 501D–504D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 24.

The thickness of each layer of the light-receiving members thus prepared was measured using an electron microscope to obtain the results as shown in Table 5D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 501D–405D, no interference fringe pattern was observed and proved to be satisfactory for practical application.

EXAMPLE 29

By means of a lathe, an aluminum substrate [length (L): 357 mm, outerdiameter (r): 80 mm] was worked as shown in FIG. 21 (P: pitch, D: depth) under the conditions shown in Table 6D (Sample Nos. 601D–604D).

Next, light-receiving members for electrophotography of A-Si type were prepared following various procedures using the deposition device in FIG. 20 under the conditions shown in Table 4D (Sample Nos. 601D–604D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 25.

The thickness of each layer of the light-receiving members thus prepared was measured using an electron microscope to obtain the results as shown in Table 6D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601D-604D, no interference fringe pattern was observed and proved to be satisfactory for practical application.

EXAMPLE 30

By means of a lathe, an aluminum substrate [length (L): 357 mm, outerdiameter (r): 80 mm] was worked as shown in FIG. 21 (P: pitch, D: depth) under the conditions shown in Table 2D.

Next, light-receiving members for electrophotography were prepared following various procedures using the deposition device in FIG. 20 under the conditions shown in Table 7D (Samples Nos. 802D-804D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 22.

The thickness of each layer of the light-receiving members thus prepared was measured using an electrion microscope to obtain the results as shown in Table 8D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 31

By means of a lathe, an aluminum substrate [length (L): 357 mm, outerdiameter (r): 80 mm] was worked as shown in FIG. 21 (P: pitch, D: depth) under the conditions shown in Table 10D.

Next, light-receiving members for electrophotography were prepared following various procedures using the deposition device in FIG. 20 under the conditions shown in Table 9D (Sample Nos. 1001D-1004D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 24.

The thickness of each layer of the light-receiving members thus prepared was measured using an electron microscope to obtain the results as shown in Table 10D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images no interference fringe pattern was observed and proved to be satisfactory for practical application.

EXAMPLE 32

By means of a lathe, an aluminum substrate [length (L): 357 mm, outerdiameter (r): 80 mm] was worked as shown in FIG. 21 (P: pitch, D: depth) under the conditions shown in Table 12D.

Next, light-receiving members for electrophotography were prepared following various procedures using the deposition device in FIG. 20 under the conditions shown in Table 11D (Sample Nos: 1201D-1204D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 25.

The thickness of each layer of the light-receiving members thus prepared was measured using an electron microscope to obtain the results as shown in Table 12D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images no interference fringe pattern was observed and proved to be satisfactory for practical application.

EXAMPLE 33

By means of a lathe, an aluminum substrate [length (L): 357 mm, outerdiameter (r): 80 mm] was worked as shown in FIG. 21 (P: pitch, D: depth) under the conditions shown in Table 14D.

Next, light-receiving members for electrophotography were prepared following various procedures using the deposition device in FIG. 20 under the conditions shown in Table 13D (Sample Nos. 1401D-1404D).

In forming the A-Si Ge:H:B layer of the first layer, the respective mass flow controllers 1236 and 1232 for GeH$_4$ and SiH$_4$ were controlled by a computer (HP 9845B) so that the flow rates of GeH$_4$ and SiH$_4$ became as shown in FIG. 23.

The thickness of each layer of the light-receiving members thus prepared was measured using an electron microscope to obtain the results as shown in Table 14D.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images no interference fringe pattern was observed and proved to be satisfactory for practical application.

EXAMPLE 34

For examples 26 through 33, light-receiving members for electrophotography were prepared by use of PH$_3$ gas diluted with H$_2$ to 3000 vol. ppm in place of B$_2$H$_6$ gas diluted with H$_2$ to 3000 vol. ppm (Sample Nos. 2001D-2032D).

Other preparation conditions were the same as in Examples 26 through 33.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 35

On the aluminum substrate of No. 201D in Table 2D in Example 26, layers were formed to the second layer under the conditions as shown in 1D, and surface layers were formed following Table 15D (Condition No. 1501D-1522D).

For the above Samples, image evaluations were conducted similarly as in Example 26. As the result, no interference pattern was observed and satisfactory practical electrophotographic characteristics with high sensitivity could be obtained.

EXAMPLE 36

By means of a lathe, an aluminum substrate was worked to have the surface characteristic of No. 101E shown in Table 1E.

Next, by use of the deposition device shown in FIG. 20, following various procedures under the conditions as shown in Table 2E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 $\mu$m between the center and both ends of the first layer and 2 $\mu$m between the center and both ends of the second layer, with the layer thickness difference at the minute portion being less than 0.1 $\mu$m in the first layer and 0.3 $\mu$m in the second layer.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 37

By means of a lathe, an aluminum substrate was worked by the same manner as in Example 36 to have the surface characteristic of No. 102E shown in Table 1E.

Next, by use of the deposition device shown in FIG. 20, following the same procedures as in Example 36 under the conditions as shown in Table 3E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.1 $\mu$m between the center and both ends of the first layer and 2 $\mu$m between the center and both ends of the second layer, with the layer thickness difference at the minute portion being less than 0.1 $\mu$m in the first layer and 0.3 $\mu$m in the second layer.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 38

By means of a lathe, an aluminum substrate was worked by the same manner as in Example 36 to have the surface characteristic of No. 103E shown in Table 1E.

Next, by use of the deposition device shown in FIG. 20, following the same procedures as in Example 36 under the conditions as shown in Table 4E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.6 $\mu$m between the center and both ends of the first layer and 2 $\mu$m between the center and both ends of the second layer, with the layer thickness differences at the minute portion being 0.1 $\mu$m in the first layer and 0.3 $\mu$m in the second layer.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 39

By means of a lathe, an aluminum substrate was worked by the same manner as in Example 36 to have the surface characteristic of No. 104E shown in Table 1E.

Next, by use of the deposition device shown in FIG. 20, following the same procedures as in Example 36 under the conditions as shown in Table 5E, a light-receiving member for electrophotography of A-Si type was deposited on the above aluminum substrate.

The layer thickness distribution of the light-receiving member for electrophotography of A-Si type thus prepared was measured by an electron microscope to find that the average layer thickness difference was 0.8 $\mu$m between the center and both ends of the first layer and 2 $\mu$m between the center and both ends of the second layer, with the layer thickness difference at the minute portion being 0.15 $\mu$m in the first layer and 0.3 $\mu$m in the second layer.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. The image was free from any interference fringe pattern observed and proved to be satisfactory for practical application.

EXAMPLE 40

By means of a lathe, an aluminum substrate [length (L): 357 mm, outerdiameter (r): 80 mm] was worked as shown in FIG. 21 (P: pitch, D: depth) under the conditions shown in Table 7E, Next, light-receiving members for electrophotography were prepared following various procedures using the deposition device in FIG. 20 under the conditions shown in Table 6E (Sample Nos. 701E–704E).

Figure 43:
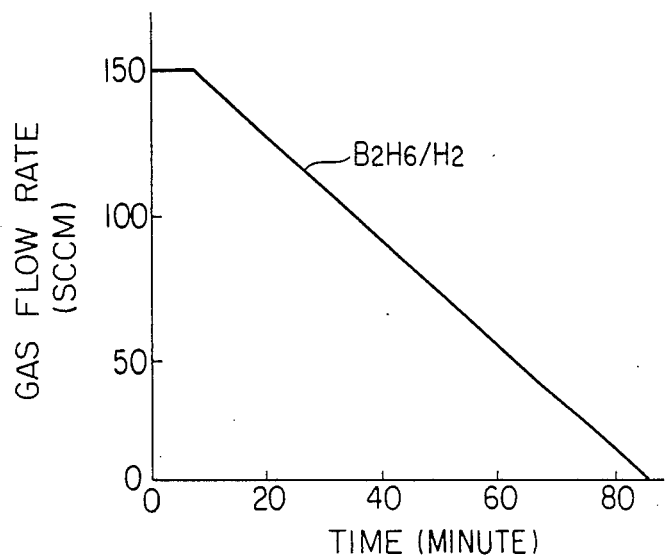

In forming the layer containing boron, the mass flow controller 2010 for $B_2H_6/H_2$ was controlled by a computer (HP 9845B) so that the flow rate of $B_2H_6/H_2$ became as shown in FIG. 43.

The thickness of each layer of the light-receiving members thus prepared was measured using an electron microscope to obtain the results as shown in Table 7E.

The light-receiving member for electrophotography as prepared above was subjected to image exposure by means of a device as shown in FIG. 26 (wavelength of laser beam: 780 nm, spot diameter 80 $\mu$m), followed by development and transfer to obtain an image. In the images, no interference fringe pattern was observed and proved to be satisfactory for practical application.

EXAMPLE 41

By means of a lathe, an aluminum substrate [length (L): 357 mm, outerdiameter (r): 80 mm] was worked as shown in FIG. 21 (P: pitch, D: depth) under the conditions shown in Table 9E.

Next, light-receiving members for electrophotography were prepared following various procedures using the deposition device in FIG. 20 under the conditions shown in Table 8E (Sample Nos. 901E–904E).

Figure 44:
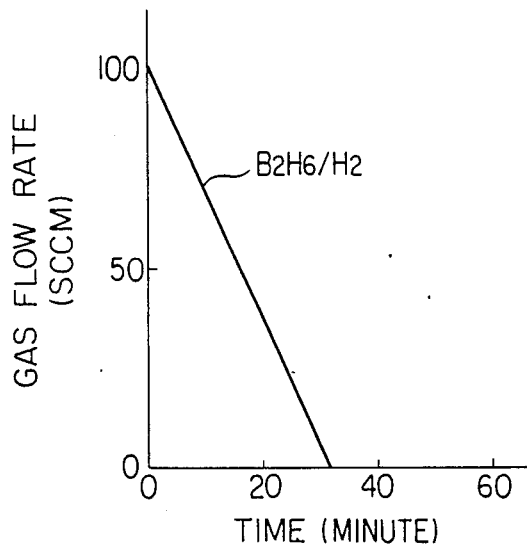

In forming the layer containing boron, the mass flow controller 2010 for $B_2H_6/H_2$ was controlled by a computer (HP 9845B) so that the flow rates of $B_2H_6/H_2$ became as shown in FIG. 44.

The thickness of each layer of the light-receiving members thus prepared was measured using an electron microscope to obtain the results as shown in Table 9E.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 42

By means of a lathe, an aluminum substrate [length (L): 357 mm, outerdiameter (r): 80 mm] was worked as shown in FIG. 21 (P: pitch, D: depth) under the conditions shown in Table 11E.

Next, light-receiving members for electrophotography were prepared following various procedures using the deposition device in FIG. 20 under the conditions shown in Table 10E (Sample Nos. 1101E–1104E).

Figure 45:
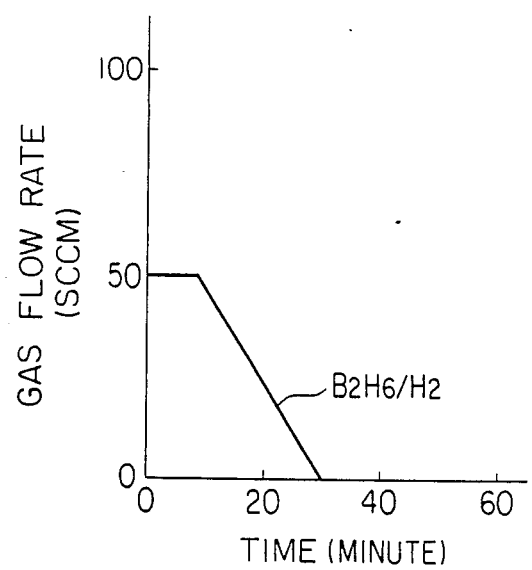

In forming the layer containing boron, the mass flow controller 2010 for $B_2H_6/H_2$ was controlled by a computer (HP 9845B) so that the flow rates of $B_2H_6/H_2$ became as shown in FIG. 45.

The thickness of each layer of the light-receiving members thus prepared was measured using an electron microscope to obtain the results as shown in Table 11E.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 43

By means of a lathe, an aluminum substrate [length (L): 357 mm, outerdiameter (r): 80 mm] was worked as shown in FIG. 21 (P: pitch, D: depth) under the conditions shown in Table 13E.

Next, light-receiving members for electrophotography were prepared following various procedures using the deposition device in FIG. 20 under the conditions shown in Table 12E (Sample Nos. 1301E–1304E).

Figure 39:
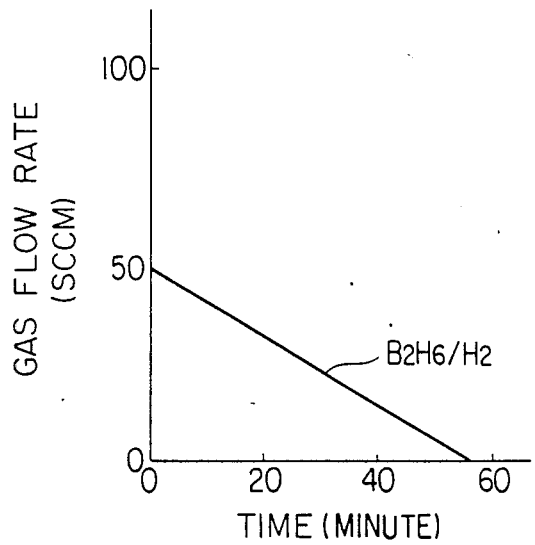
Figure 40:
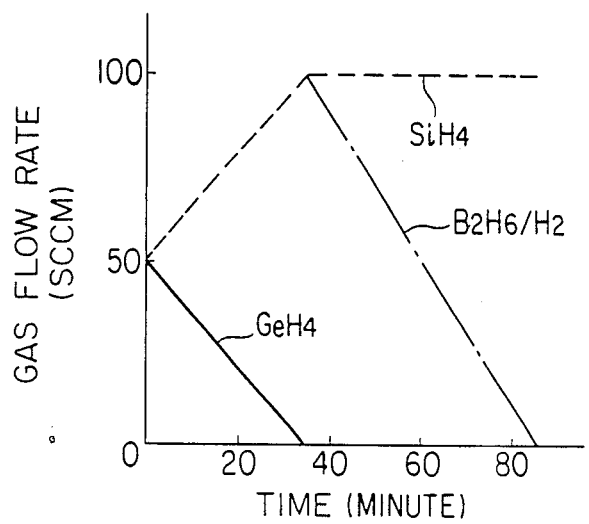
Figure 41:
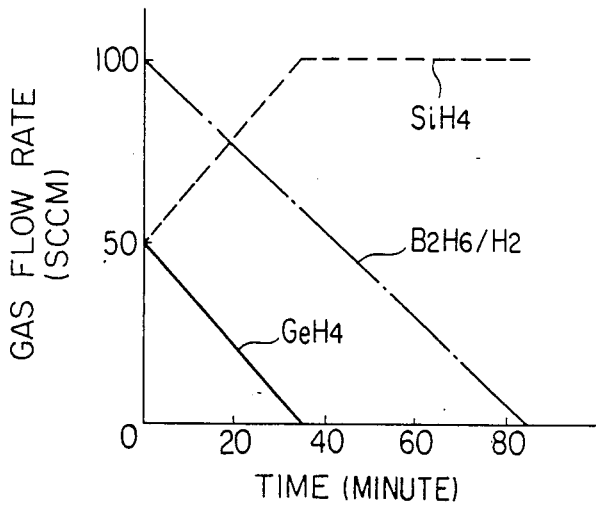
Figure 42:
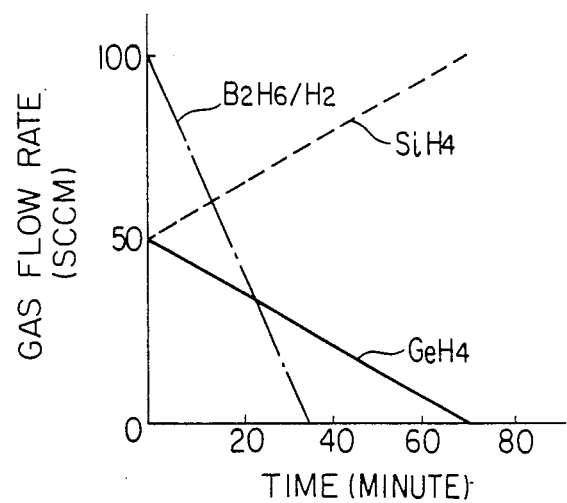

In forming the layer containing boron, the mass flow controller 2010 for $B_2H_6/H_2$ was controlled by a computer (HP 9845B) so that the flow rate of $B_2H_6/H_2$ became as shown in FIG. 39.

The thickness of each layer of the light-receiving members thus prepared was measured using an electron microscope to obtain the results as shown in Table 13E.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 44

For examples 36 through 43, light-receiving members for electrophotography were prepared by use of $PH_3$ gas diluted with $H_2$ to 3000 vol. ppm in place of $B_2H_6$ gas diluted with $H_2$ to 3000 vol. ppm (Sample Nos. 2001E–2020E).

Other preparation conditions were the same as in Examples 36 through 43.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images, no interference fringe pattern was observed and proved to be satisfactory for practical application.

EXAMPLE 45

On the aluminum substrate of No. 101E in Table 2E in Example 36, layers were formed to the second layer under the conditions as shown in 2E, and surface layers were formed following Table 14E (Condition No. 1401E–1422E).

For the above Samples, image evaluations were conducted similarly as in Example 36. As the result, no interference pattern was observed and satisfactory practical electrophotographic characteristics with high sensitivity could be obtained.

EXAMPLE 46

By means of a lathe, four kinds of aluminum substrates [length (L): 357 mm, outerdiameter (r): 80 mm] were worked as shown in FIG. 21 (P: pitch, D: depth) under the conditions shown in Table 2F.

Next, light-receiving members for electrophotographic of A-Si type were prepared following various procedures using the deposition device in FIG. 20 under the conditions shown in Table 1F (Sample Nos. 201F–204F).

Figure 36:
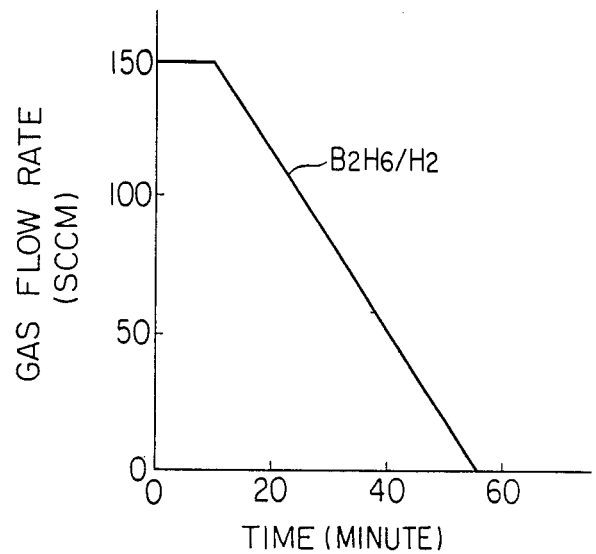

In the first layer, the respective mass flow controllers 2007, 2008 and 2010 were controlled by a computer (HP 9845B) so that the flow rates of $GeH_4$, $SiH_4$, $B_2H_6/H_2$ became as shown in FIG. 22 and FIG. 36.

The thickness of each layer of the light-receiving members thus prepared was measured using an electron microscope to obtain the results as shown in Table 2F.

The light-receiving member for electrophotographic as prepared above was subjected to image exposure by means of a device as shown in FIG. 26 (wavelength of laser beam: 780 nm, spot diameter 80 μm), followed by development and transfer to obtain an image. In any of the images of No. 201F–204F, no interference fringe pattern was observed and proved to be satisfactory for practical application.

EXAMPLE 47

By means of a lathe, four kinds of aluminum substrates [length (L): 357 mm, outerdiameter (r): 80 mm] were worked as shown in FIG. 21 (P: pitch, D: depth) under the conditions shown in Table 3F.

Next, light-receiving members for electrophotography of A-Si type were prepared following various procedures using the deposition device in FIG. 20 under the conditions shown in Table 1F (Sample Nos. 301F–304F).

Figure 37:
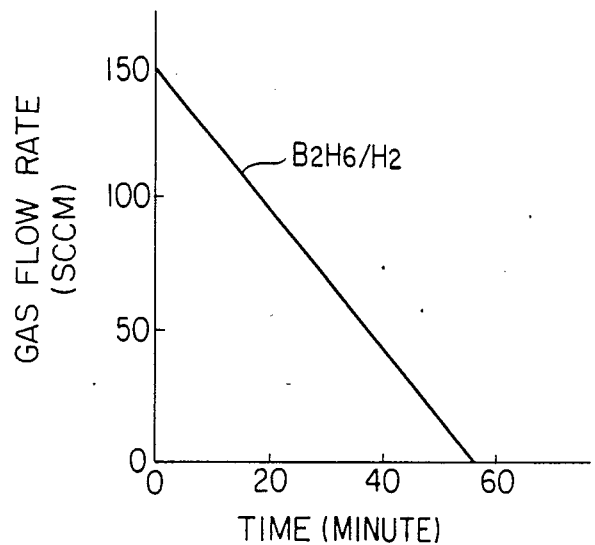

In forming the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 23 and FIG. 37.

The thickness of each layer of the light-receiving members thus prepared was measured using an electron microscope to obtain the results as shown in Table 2F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 301F–304F, no interference fringe pattern was observed and proved to be satisfactory for practical application.

EXAMPLE 48

By means of a lathe, four kinds of aluminum substrates [length (L): 357 mm, outerdiameter (r): 80 mm] were worked as shown in FIG. 21 (P: pitch, D: depth) under the conditions shown in Table 5F.

Next, light-receiving members for electrophotography of A-Si type were prepared following various procedures using the deposition device in FIG. 20 under the conditions shown in Table 4F (Sample Nos. 501F–504F).

Figure 38:
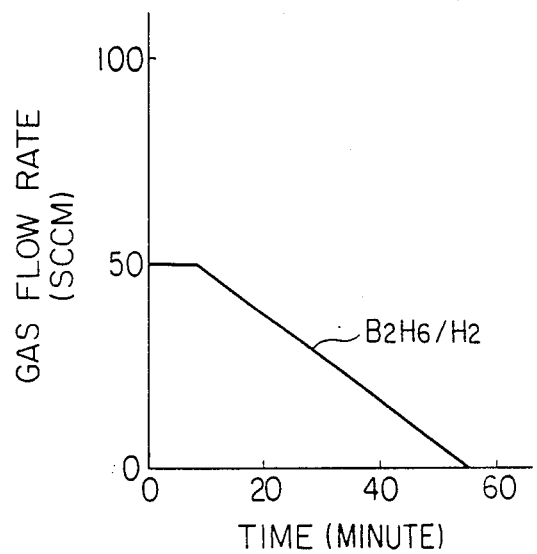

In forming the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 24 and FIG. 38.

The thickness of each layer of the light-receiving members thus prepared was measured using an electron microscope to obtain the results as shown in Table 5F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 501F–504F, no interference fringe pattern was observed and proved to be satisfactory for practical application.

EXAMPLE 49

By means of a lathe, four kinds of aluminum substrates [length (L): 357 mm, outerdiameter (r): 80 mm] were worked as shown in FIG. 21 (P: pitch, D: depth) under the conditions shown in Table 6F.

Next, light-receiving members for electrophotography A-Si type were prepared following various procedures using the deposition device in FIG. 20 under the conditions shown in Table 4F (Sample Nos. 601F–604F).

In forming the first layer, the respective mass flow controllers 2007, 2008 and 2010 were controlled by a computer (HP 9845B) so that the flow rates of $GeH_4$, $SiH_4$ and $B_2H_6/H_2$ became as shown in FIGS. 25 and 39.

The thickness of each layer of the light-receiving members thus prepared was measured using an electron microscope to obtain the results as shown in Table 6F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In any of the images of No. 601F–604F, no interference fringe pattern was observed and proved to be satisfactory for practical application.

EXAMPLE 50

By means of a lathe, four kinds of aluminum substrates [length (L): 357 mm, outerdiameter (r): 80 mm] were worked as shown in FIG. 21 (P: pitch, D: depth) under the conditions shown in Table 8F.

Next, light-receiving members for electrophotography were prepared following various procedures using the deposition device in FIG. 20 under the conditions shown in Table 7F (Sample Nos. 801F–804F).

In forming the A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 22.

The thickness of each layer of the light-receiving members thus prepared was measured using an electron microscope to obtain the results as shown in Table 8F.

The light-receiving member for electrophotograhy as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 51

By means of a lathe, four kinds of aluminum substrates [length (L): 357 mm, outerdiameter (r): 80 mm] were worked as shown in FIG. 21 (P: pitch, D: depth) under the conditions shown in Table 10F.

Next, light-receiving members for electrophotography were prepared following various procedures using the deposition device in FIG. 20 under the conditions shown in Table 9F (Sample Nos. 1001F–1004F).

In forming the A layer and the first layer, the respective mass flow controllers 2007, 2008 and 2010 were controlled by a computer (HP 9845B) so that the flow rates of $GeH_4$, $SiH_4$ and $B_2H_6/H_2$ became as shown in FIG. 22.

The thickness of each layer of the light-receiving members thus prepared was measured using an electron microscope to obtain the results as shown in Table 10F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 52

By means of a lathe, an aluminum substrate [length (L): 357 mm, outerdiameter (r): 80 mm] was worked as shown in FIG. 21 (P: pitch, D: depth) under the conditions shown in Table 12F.

Next, light-receiving members for electrophotography were prepared following various procedures using the deposition device in FIG. 20 under the conditions shown in Table 11F (Sample Nos. 1201F–1204F).

In forming the A layer and the first layer, the respective mass flow controllers 2007, 2008 and 2010 were controlled by a computer (HP 9845B) so that the flow rates of GeH$_4$, SiH$_4$ and B$_2$H$_6$/H$_2$ became as shown in FIG. 22.

The thickness of each layer of the light-receiving members thus prepared was measured using an electron microscope to obtain the results as shown in Table 12F.

The light-receiving member for electrophotography as prepared above was subjected to image exposure by means of a device as shown in FIG. 26 (wavelength of laser beam: 780 nm, spot diameter 80 μm), followed by development and transfer to obtain an image. In the images, no interference fringe pattern was observed and proved to be satisfactory for practical application.

EXAMPLE 53

On the aluminum substrate of No. 201F in Table 2F in Example 46, layers were formed up to the second layer under the conditions as shown in 1F, and surface layers were formed following Table 13F (Condition No. 1301F–1322F).

For the above Samples, image evaluations were conducted similarly as in Example 46. As the result, no interference pattern was observed and satisfactory practical electrophotographic characteristics with high sensitivity could be obtained.

TABLE 1A

| Cylinder No. | 101A | 102A | 103A | 104A |
|---|---|---|---|---|
| Pitch (μm) | 50 | 40 | 25 | 10 |
| Depth (μm) | 2.1 | 1.7 | 0.8 | 0.6 |
| Angle (degree) | 5.0 | 4.8 | 3.7 | 6.8 |

TABLE 2A

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 10 | 1 |
|  | GeH$_4$ | 100 |  |  |  |
| Second layer | H$_2$ | 300 | 300 | 24 | 20 |
|  | SiH$_4$ | 300 |  |  |  |
| Surface layer | Al$_2$O$_3$ target |  | 300 | 1 | 0.359 |
|  | Ar | 30 |  |  |  |

TABLE 3A

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 14 | 3 |
|  | SiH$_4$ | 50 |  |  |  |
|  | GeH$_4$ | 100 |  |  |  |
| Second layer | H$_2$ | 300 | 300 | 24 | 20 |
|  | SiH$_4$ | 300 |  |  |  |
| Surface layer | SiO$_2$ target |  | 300 | 1 | 0.393 |
|  | Ar | 30 |  |  |  |

TABLE 4A

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 12 | 5 |
|  | SiH$_4$ | 100 |  |  |  |
|  | GeH$_4$ | 50 |  |  |  |
| Second layer | H$_2$ | 300 | 300 | 24 | 20 |
|  | SiH$_4$ | 300 |  |  |  |
| Surface layer | MgF$_2$ target |  | 300 | 1 | 0.424 |
|  | Ar | 30 |  |  |  |

TABLE 5A

| Layer constitution | Starting gas | Gas flow rate (SCCM) | Discharging power (W) | Deposition rate (Å/sec) | Layer thickness (μm) |
|---|---|---|---|---|---|
| First layer | H$_2$ | 300 | 100 | 8 | 7 |
|  | SiH$_4$ | 135 |  |  |  |
|  | GeH$_4$ | 15 |  |  |  |
| Second layer | H$_2$ | 300 | 300 | 24 | 20 |
|  | SiH$_4$ | 300 |  |  |  |
| Surface layer | CeO$_2$ target |  | 300 | 1 | 0.262 |
|  | Ar | 30 |  |  |  |

TABLE 6A

| Condition No. | 601A | 602A | 603A | 604A | 605A | 606A | 607A | 608A | 609A | 610A |
|---|---|---|---|---|---|---|---|---|---|---|
| Material for surface layer | ZrO$_2$ | | TiO$_2$ | | ZrO$_2$/TiO$_2$ = 6/1 | | TiO$_2$/ZrO$_2$ = 3/1 | | CeO$_2$ | |
| Index of refraction | 2.00 | | 2.26 | | 2.09 | | 2.20 | | 2.23 | |
| Layer thickness (μm) | 0.0975 | 0.293 | 0.0863 | 0.259 | 0.0933 | 0.280 | 0.0886 | 0.266 | 0.0874 | 0.262 |

| Condition No. | 611A | 612A | 613A | 614A | 615A | 616A | 617A | 618A | 619A | 620A | 621A | 622A |
|---|---|---|---|---|---|---|---|---|---|---|---|---|
| Material for surface layer | ZnS | | Al$_2$O$_3$ | | CeF$_3$ | | Al$_2$O$_3$/ZrO$_2$ = 1.68 | | MgF$_2$ | | SiO$_2$ | |
| Index of refraction | 2.24 | | 1.63 | | 1.60 | | 1.68 | | 1.38 | | 1.49 | |
| Layer thickness (μm) | 0.0871 | 0.261 | 0.120 | 0.359 | 0.123 | 0.366 | 0.116 | 0.348 | 0.141 | 0.424 | 0.131 | 0.393 |

TABLE 1B

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$GeH_4 + SiH_4 = 100$ | 300<br>100 → 0<br>0 → 100 | 100 | 9 | 3 |
| Second layer | $H_2$<br>$SiH_4$ | 300<br>300 | 300 | 24 | 20 |
| Surface layer | $Al_2O_3$ target<br>Ar | 30 | 300 | 1 | 0.6 |

TABLE 2B

| | No. | 201B | 202B | 203B | 204B |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3B

| | No. | 301B | 302B | 303B | 304B |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 4B

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$GeH_4 + SiH_4 = 100$ | 300<br>50 → 0<br>50 → 100 | 100 | 9 | 3 |
| Second layer | $H_2$<br>$SiH_4$ | 300<br>300 | 300 | 24 | 20 |
| Surface layer | $MgF_2$ target<br>Ar | 30 | 300 | 1 | 0.424 |

TABLE 5B

| | No. | 501B | 502B | 503B | 504B |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 6B

| | No. | 601B | 602B | 603B | 604B |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 7B

| Condition No. | 701B | 702B | 703B | 704B | 705B | 706B | 707B | 708B | 709B | 710B |
|---|---|---|---|---|---|---|---|---|---|---|
| Material for surface layer | $ZrO_2$ | | $TiO_2$ | | $ZrO_2/TiO_2 = 6/1$ | | $TiO_2/ZrO_2 = 3/1$ | | $CeO_2$ | |
| Index of refraction | 2.00 | | 2.26 | | 2.09 | | 2.20 | | 2.23 | |
| Layer thickness (μm) | 0.0975 | 0.293 | 0.0863 | 0.259 | 0.0933 | 0.280 | 0.0886 | 0.266 | 0.0874 | 0.262 |

| Condition No. | 711B | 712B | 713B | 714B | 715B | 716B | 717B | 718B | 719B | 720B | 721B | 722B |
|---|---|---|---|---|---|---|---|---|---|---|---|---|
| Material for surface layer | ZnS | | $Al_2O_3$ | | $CeF_3$ | | $Al_2O_3/ZrO_2 =$ | | $MgF_2$ | | $SiO_2$ | |
| Index of refraction | 2.24 | | 1.63 | | 1.60 | | 1.68 | | 1.38 | | 1.49 | |
| Layer thickness (μm) | 0.0871 | 0.261 | 0.120 | 0.359 | 0.123 | 0.366 | 0.116 | 0.348 | 0.141 | 0.424 | 0.131 | 0.393 |

TABLE 1C

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$B_2H_6/H_2$<br>(=3000 vol ppm) | 300<br>100<br>100 | 100 | 10 | 3 |
| Second layer | $H_2$<br>$SiH_4$ | 300<br>300 | 300 | 24 | 20 |
| Surface layer | $SiO_2$ target<br>Ar | 30 | 300 | 1 | 0.393 |

TABLE 2C

| | | No. | | | |
|---|---|---|---|---|---|
| | | 201C | 202C | 203C | 204C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving | Difference in average layer thickness | 1 | 1 | 1 | 1 |

TABLE 2C-continued

|  |  | No. | | | |
|---|---|---|---|---|---|
|  |  | 201C | 202C | 203C | 204C |
| layer | between center and both ends in first layer (μm) |  |  |  |  |
|  | Difference in layer thickness of minute portion in first layer (μm) | 0.2 | 0.15 | 0.1 | 0.25 |
|  | Difference in average | 3 | 3 | 3 | 3 |

TABLE 2C-continued

|  | No. | | | |
|---|---|---|---|---|
|  | 201C | 202C | 203C | 204C |
| layer thickness between center and both ends in second layer (μm) |  |  |  |  |
| Difference in layer thickness of minute portion in second layer (μm) | 0.55 | 0.4 | 0.3 | 0.6 |

TABLE 3C

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 1 |
|  | | $GeH_4$ | 100 | | | |
|  | | $B_2H_6/H_2$ (= 3000 vol ppm) | 100 | | | |
| Second layer | Layer A | $H_2$ | 300 | 100 | 8 | 5 |
|  | | $SiH_4$ | 100 | | | |
|  | | $B_2H_6/H_2$ (= 3000 vol ppm) | 100 | | | |
|  | Layer B | $H_2$ | 300 | 300 | 24 | 20 |
|  | | $SiH_4$ | 300 | | | |
| Surface layer | | $MgF_2$ target | | 300 | 1 | 0.424 |
|  | | Ar | 30 | | | |

TABLE 4C

|  |  | No. | | | |
|---|---|---|---|---|---|
|  |  | 401C | 402C | 403C | 404C |
| Surface structure of Al substrate | Pitch (μm) | 50 | 40 | 25 | 10 |
|  | Depth (μm) | 2.1 | 1.7 | 0.8 | 0.6 |
|  | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
|  | Difference in layer thickness of minute portion in first layer (μm) | 0.04 | 0.03 | 0.02 | 0.05 |
|  | Second layer — Difference in average layer thickness between center and both ends in layer A (μm) | 1.5 | 1.5 | 1.5 | 1.5 |
|  | Difference in layer thickness of minute portion in layer A (μm) | 0.2 | 0.12 | 0.1 | 0.3 |
|  | Difference in average layer thickness between center and both ends in layer B (μm) | 3 | 3 | 3 | 3 |
|  | Difference in layer thickness of minute portion in layer B (μm) | 0.55 | 0.4 | 0.3 | 0.6 |

TABLE 5C

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 1 |
|  | | $GeH_4$ | 100 | | | |
|  | | $B_2H_6/H_2$ (= 3000 vol ppm) | 50 | | | |
| Second layer | Layer A | $H_2$ | 300 | 100 | 8 | 5 |
|  | | $SiH_4$ | 100 | | | |
|  | | $B_2H_6/H_2$ (= 3000 vol ppm) | 100 | | | |
|  | Layer | $H_2$ | 300 | 300 | 24 | 20 |

TABLE 5C-continued

| Layer constitution | | Starting gas | Gas flow rate (SCCM) | Discharging power (W) | Deposition rate (Å/sec) | Layer thickness (μm) |
|---|---|---|---|---|---|---|
| Surface layer | B | SiH₄ CeO₂ target Ar | 300 30 | 300 | 1 | 0.262 |

TABLE 6C

| | | No. 601C | 602C | 603C | 604C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.4 | 0.6 |

TABLE 7C

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ GeH₄ B₂H₆/H₂ (= 3000 vol ppm) | 300 100 150 | 100 | 10 | 1 |
| Second layer | Layer A | H₂ SiH₄ B₂H₆/H₂ (= 3000 vol ppm) | 300 100 100 | 100 | 8 | 5 |
| | Layer B | H₂ SiH₄ | 300 300 | 300 | 24 | 20 |
| Surface layer | | Al₂O₃ target Ar | 30 | 400 | 1.5 | 0.359 |

TABLE 8C

| | | No. 801C | 802C | 803C | 804C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | 0.05 | 0.04 | 0.03 | 0.06 |
| | Second layer — Difference in average layer thickness between center and both ends in layer A (μm) | 1.6 | 1.6 | 1.6 | 1.6 |
| | Difference in layer | 0.2 | 0.13 | 0.11 | 0.3 |

TABLE 8C-continued

|  | No. | | | |
|---|---|---|---|---|
|  | 801C | 802C | 803C | 804C |
| thickness of minute portion in layer A (μm) Difference in average layer thickness between center and both ends in layer B (μm) | 3.1 | 3.1 | 3.1 | 3.1 |
| Difference in layer thickness of minute portion in layer B (μm) | 0.55 | 0.4 | 0.4 | 0.6 |

TABLE 9C

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 1 |
|  | | $GeH_4$ | 100 | | | |
| Second layer | Layer A | $H_2$ | 300 | 100 | 8 | 5 |
|  | | $SiH_4$ | 100 | | | |
|  | | $B_2H_6/H_2$ (= 3000 vol ppm) | 100 | | | |
|  | Layer B | $H_2$ | 300 | 300 | 24 | 20 |
|  | | $SiH_4$ | 300 | | | |
| Surface layer | | $CeF_3$ target | | 300 | 1 | 0.366 |
|  | | Ar | 30 | | | |

TABLE 10C

| | | No. | | | |
|---|---|---|---|---|---|
| | | 1001C | 1002C | 1003C | 1004C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.05 | 0.04 | 0.03 | 0.06 |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.39 | 0.6 |

TABLE 11C

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
|  | | $GeH_4$ | 100 | | | |
|  | | $B_2H_6/H_2$ (= 3000 vol ppm) | 100 | | | |
|  | Layer B | $H_2$ | 300 | 100 | 10 | 2 |
|  | | $GeH_4$ | 100 | | | |
| Second layer | | $H_2$ | 300 | 300 | 24 | 20 |
|  | | SiH | 300 | | | |
| Surface layer | | $Al_2O_3$ target | | 300 | 1 | 0.359 |

TABLE 11C-continued

| Layer constitution | Starting gas | Gas flow rate (SCCM) | Discharging power (W) | Deposition rate (Å/sec) | Layer thickness (μm) |
|---|---|---|---|---|---|
| | Ar | 30 | | | |

TABLE 12C

| | | No. | | | |
|---|---|---|---|---|---|
| | | 1201C | 1202C | 1203C | 1204C |
| Surface structure pf Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.1 | 0.1 | 0.1 | 0.12 |
| | | Difference in average layer thickness between center and both ends in layer B (μm) | 0.22 | 0.22 | 0.22 | 0.22 |
| | | Difference in layer thickness of minute portion in layer B (μm) | 0.11 | 0.1 | 0.1 | 0.13 |
| | Difference in average layer thickness between center and both ends in second layer (μm) | | 3 | 3 | 3 | 3 |
| | Difference in layer thickness of minute portion in second layer (μm) | | 0.55 | 0.4 | 0.39 | 0.6 |

TABLE 13C

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | GeH | 100 | | | |
| | Layer B | $H_2$ | 300 | 100 | 10 | 22 |
| | | $GeH_4$ | 100 | | | |
| | | $B_2H_6/H_2$ (= 3000 vol ppm) | 100 | | | |
| Second layer | | $H_2$ | 300 | 300 | 24 | 20 |
| | | $SiH_4$ | 300 | | | |
| Surface layer | | $SiO_2$ target | | 300 | 1 | 0.393 |
| | | Ar | 30 | | | |

TABLE 14C

| | | No. | | | |
|---|---|---|---|---|---|
| | | 1401C | 1402C | 1403C | 1404C |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.1 | 0.1 | 0.1 | 0.12 |
| | | Difference in average layer thickness between center and both ends in layer B (μm) | 0.22 | 0.22 | 0.22 | 0.22 |
| | | Difference in layer thickness of minute portion in layer B (μm) | 0.11 | 0.1 | 0.1 | 0.13 |
| | Difference in average layer thickness between center and both ends in second layer (μm) | | 3 | 3 | 3 | 3 |

TABLE 14C-continued

| | No. | | | |
|---|---|---|---|---|
| | 1401C | 1402C | 1403C | 1404C |
| Difference in layer thickness of minute portion in second layer (μm) | 0.55 | 0.4 | 0.39 | 0.6 |

TABLE 15C

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 5 |
| | $GeH_4$ | 50 | | | |
| | $SiH_4$ | 50 | | | |
| | $B_2H_6/H_2$ (= 3000 vol ppm) | 100 | | | |
| Second layer | $H_2$ | 300 | 300 | 24 | 20 |
| | $SiH_4$ | 300 | | | |
| Surface layer | $TiO_2$ target | | 400 | 2 | 0.259 |
| | Ar | 30 | | | |

TABLE 16C

| No. | 1601C | 1602C | 1603C | 1604C |
|---|---|---|---|---|
| Surface structure of Al  Pitch (μm) | 50 | 40 | 25 | 10 |
| Depth (μm) | 2.1 | 1.7 | 0.8 | 0.6 |
| Angle (degree) | 5.0 | 4.8 | 3.7 | 6.8 |

TABLE 16C-continued

| No. | 1601C | 1602C | 1603C | 1604C |
|---|---|---|---|---|
| substrate Thickness of light receiving layer  Difference in average layer thickness between center and both ends in first layer (μm) | 1.5 | 1.5 | 1.5 | 1.5 |
| Difference in layer thickness of minute portion in first layer (μm) | 0.2 | 0.12 | 0.1 | 0.3 |
| Difference in average layer thickness between center and both ends in second layer (μm) | 3 | 3 | 3 | 3 |
| Difference in layer thickness of minute portion in second layer (μm) | 0.55 | 0.4 | 0.3 | 0.6 |

TABLE 17C

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ (= 3000 vol ppm) | 100 | | | |
| Second layer | Layer A | $H_2$ | 300 | 100 | 8 | 3 |
| | | $GeH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $Al_2O_3/ZrO_2$ = 1/1 target | 30 | 300 | 1 | 0.348 |
| | | Ar | | | | |

TABLE 18C

| No. | | 1801C | 1802C | 1803C | 1804C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.14 | 0.12 | 0.1 | 0.16 |
| Second layer | Difference in average layer thickness between center and both ends in layer A (μm) | 0.3 | 0.3 | 0.3 | 0.3 |
| | Difference in layer thickness of minute portion in layer A (μm) | 0.2 | 0.14 | 0.13 | 0.21 |
| | Difference in average layer thickness between center and both ends in layer B (μm) | 3 | 3 | 3 | 3 |
| | Difference in layer thickness of minute | 0.57 | 0.4 | 0.3 | 0.6 |

TABLE 18C-continued

| No. | 1801C | 1802C | 1803C | 1804C |
|---|---|---|---|---|
| portion in layer B (μm) | | | | |

TABLE 19C

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 2 |
| | | GeH₄ | 50 | | | |
| | | SiH₄ | 50 | | | |
| | | B₂H₆/H₂ (= 3000 vol ppm) | 50 | | | |
| Second layer | Layer A | H₂ | 300 | 100 | 8 | 3 |
| | | SiH₄ | 100 | | | |
| | | B₂H₆/H₂ (= 3000 vol ppm) | 100 | | | |
| | Layer B | H₂ | 300 | 300 | 24 | 20 |
| | | SiH₄ | 300 | | | |
| Surface layer | | ZrO₂ target Ar | 30 | 300 | 1 | 0.293 |

TABLE 20C

| | No. | 2001C | 2002C | 2003C | 2004C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.13 | 0.11 | 0.1 | 0.2 |
| | Second layer Difference in average layer thickness between center and both ends in layer A (μm) | 0.4 | 0.4 | 0.4 | 0.4 |
| | Difference in layer thickness of minute portion in layer A (μm) | 0.13 | 0.12 | 0.11 | 0.2 |
| | Difference in average layer thickness between center and both ends in layer B (μm) | 3 | 3 | 3 | 3 |
| | Difference in layer thickness of minute portion in layer B (μm) | 0.6 | 0.5 | 0.4 | 0.7 |

TABLE 21C

| Layer constitution | | Starting gas | Gas flow rate (SCCM) | Discharging power (W) | Deposition rate (Å/sec) | Layer thickness (μm) |
|---|---|---|---|---|---|---|
| First layer | | H₂ | 300 | 100 | 10 | 2 |
| | | GeH₄ | 50 | | | |
| | | SiH₄ | 50 | | | |
| | | B₂H₆/H₂ (= 3000 vol ppm) | 150 | | | |
| Second layer | Layer A | H₂ | 300 | 100 | 8 | 3 |
| | | SiH₄ | 100 | | | |
| | | B₂H₆/H₂ (= 3000 vol ppm) | 100 | | | |
| | Layer B | H₂ | 300 | 300 | 24 | 20 |
| | | SiH₄ | 300 | | | |
| Surface layer | | SiO₂ target Ar | 30 | 300 | 1 | 0.393 |

TABLE 22C

| | No. | 2201C | 2202C | 2203C | 2204C |
|---|---|---|---|---|---|
| Surface structure | Pitch (μm) | 50 | 40 | 25 | 10 |
| | Depth (μm) | 2.1 | 1.7 | 0.8 | 0.6 |

TABLE 22C-continued

| | No. | 2201C | 2202C | 2203C | 2204C |
|---|---|---|---|---|---|
| of Al substrate | Angle (degree) | 5.0 | 4.8 | 3.7 | 6.8 |
| Thickness of light receiving layer | Difference in average layer thickness between center and both ends in first layer ($\mu$m) | 0.2 | 0.2 | 0.2 | 0.2 |
| | Difference in layer thickness of minute portion in first layer ($\mu$m) | 0.12 | 0.11 | 0.1 | 0.14 |
| | Second layer — Difference in average layer thickness between center and both ends in layer A ($\mu$m) | 0.4 | 0.4 | 0.4 | 0.4 |
| | Difference in layer thickness of minute portion in layer A ($\mu$m) | 0.17 | 0.15 | 0.13 | 0.18 |
| | Difference in average layer thickness between center and both ends in layer B ($\mu$m) | 3.2 | 3.2 | 3.2 | 3.2 |
| | Difference in layer thickness of minute portion in layer B ($\mu$m) | 0.6 | 0.55 | 0.5 | 0.7 |

TABLE 23C

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | | $H_2$ | 300 | 100 | 10 | 2 |
| | | $SiH_4$ | 50 | | | |
| | | $GeH_4$ | 50 | | | |
| Second layer | Layer A | $H_2$ | 300 | 100 | 8 | 3 |
| | | $GeH_4$ | 100 | | | |
| | | $B_2H_6/H_2$ (= 3000 vol ppm) | 100 | | | |
| | Layer B | $H_2$ | 300 | 300 | 24 | 20 |
| | | $SiH_4$ | 300 | | | |
| Surface layer | | $TiO_2$ target Ar | 30 | 300 | 1 | 0.259 |

TABLE 24C

| | No. | 2401C | 2402C | 2403C | 2404C |
|---|---|---|---|---|---|
| Surface structure of Al substrate | Pitch ($\mu$m) | 50 | 40 | 25 | 10 |
| | Depth ($\mu$m) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer ($\mu$m) | 0.2 | 0.2 | 0.2 | 0.2 |
| | Difference in layer thickness of minute portion in first layer ($\mu$m) | 0.12 | 0.11 | 0.1 | 0.14 |
| | Second layer — Difference in average layer thickness between center and both ends in layer A ($\mu$m) | 0.4 | 0.4 | 0.4 | 0.4 |
| | Difference in layer thickness of minute portion in layer A ($\mu$m) | 0.17 | 0.15 | 0.13 | 0.18 |
| | Difference in average layer thickness between center and both ends in layer B ($\mu$m) | 3.2 | 3.2 | 3.2 | 3.2 |
| | Difference in layer thickness of minute portion in layer B ($\mu$m) | 0.6 | 0.55 | 0.5 | 0.7 |

TABLE 25C

| Layer constitution | | Starting gas | Gas flow rate (SCCM) | Discharging power (W) | Deposition rate (Å/sec) | Layer thickness ($\mu$m) |
|---|---|---|---|---|---|---|
| First layer | Layer A | $H_2$ | 300 | 100 | 10 | 2 |
| | | $GeH_4$ | 50 | | | |

TABLE 25C-continued

| Layer constitution | Starting gas | Gas flow rate (SCCM) | Discharging power (W) | Deposition rate (Å/sec) | Layer thickness (μm) |
|---|---|---|---|---|---|
| | SiH$_4$ | 50 | | | |
| | B$_2$H$_6$/H$_2$ (= 3000 vol ppm) | 100 | | | |
| Layer B | H$_2$ | 300 | 100 | 10 | 2 |
| | GeH$_4$ | 50 | | | |
| | SiH$_4$ | 50 | | | |
| Second layer | H$_2$ | 300 | 300 | 24 | 20 |
| | SiH$_4$ | 300 | | | |
| Surface layer | CeF$_3$ target Ar | 30 | 300 | 1 | 0.366 |

TABLE 26C

| No. | | 2601C | 2602C | 2603C | 2604C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer Difference in average layer thickness between center and both ends in layer A (μm) | 0.2 | 0.2 | 0.2 | 0.2 |
| | Difference in layer thickness of minute portion in layer A (μm) | 0.13 | 0.11 | 0.1 | 0.15 |
| | Difference in average layer thickness between center and both ends in layer B (μm) | 0.2 | 0.2 | 0.2 | 0.2 |
| | Difference in layer thickness of minute portion in layer B (μm) | 0.13 | 0.12 | 0.11 | 0.14 |
| | Difference in average layer thickness between center and both ends in second layer (μm) | 3 | 3 | 3 | 3 |
| | Difference in layer thickness of minute portion in second layer (μm) | 0.5 | 0.4 | 0.4 | 0.6 |

TABLE 27C

| Layer constitution | Starting gas | Gas flow rate (SCCM) | Discharging power (W) | Deposition rate (Å/sec) | Layer thickness (μm) |
|---|---|---|---|---|---|
| First layer Layer A | H$_2$ | 300 | 100 | 10 | 2 |
| | SiH$_4$ | 50 | | | |
| | GeH$_4$ | 50 | | | |
| Layer B | H$_2$ | 300 | 100 | 10 | 2 |
| | GeH$_4$ | 50 | | | |
| | SiH$_4$ | 50 | | | |
| | B$_2$H$_6$/H$_2$ (= 3000 vol ppm) | 100 | | | |
| Second layer | H$_2$ | 300 | 300 | 24 | 20 |
| | SiH$_4$ | 300 | | | |
| Surface layer | SiO$_2$ target Ar | 30 | 300 | 1 | 0.424 |

TABLE 28C

| No. | | 2801C | 2802C | 2803C | 2804C |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer Difference in average layer thickness between center and both ends in layer A (μm) | 0.2 | 0.2 | 0.2 | 0.2 |
| | Difference in layer thickness of minute portion in layer A (μm) | 0.11 | 0.11 | 0.1 | 0.13 |
| | Difference in average | 0.21 | 0.21 | 0.21 | 0.21 |

TABLE 28C-continued

| No. | 2801C | 2802C | 2803C | 2804C |
|---|---|---|---|---|
| layer thickness between center and both ends in layer B (μm) | | | | |
| Difference in layer thickness of minute portion in layer B (μm) | 0.13 | 0.12 | 0.11 | 0.14 |
| Difference in average layer thickness between center and both ends in second layer (μm) | 3 | 3 | 3 | 3 |
| Difference in layer thickness of minute portion in second layer (μm) | 0.4 | 0.35 | 0.3 | 0.5 |

TABLE 29C

| Condition No. | 2901C | 2902C | 2903C | 2904C | 2905C | 2906C | 2907C | 2908C | 2909C | 2910C | 2911C | 2912C |
|---|---|---|---|---|---|---|---|---|---|---|---|---|
| Material for surface layer | $ZrO_2$ | | $TiO_2$ | | $ZrO_2/TiO_2 = 6/1$ | | $TiO_2/ZrO_2 = 3/1$ | | $CeO_2$ | | $ZnS$ | |
| Index of refraction | 2.00 | | 2.26 | | 2.09 | | 2.20 | | 2.23 | | 2.24 | |
| Layer thickness (μm) | 0.0975 | 0.293 | 0.0863 | 0.259 | 0.0933 | 0.280 | 0.0886 | 0.266 | 0.0874 | 0.262 | 0.0871 | 0.261 |

| Condition No. | 2913C | 2914C | 2915C | 2916C | 2917C | 2918C | 2919C | 2920C | 2921C | 2922C |
|---|---|---|---|---|---|---|---|---|---|---|
| Material for surface layer | $Al_2O_3$ | | $CeF_3$ | | $Al_2O_3/ZrO_2 =$ | | $MgF_2$ | | $SiO_2$ | |
| Index of refraction | 1.63 | | 1.60 | | 1.68 | | 1.38 | | 1.49 | |
| Layer thickness (μm) | 0.120 | 0.359 | 0.123 | 0.366 | 0.116 | 0.348 | 0.141 | 0.424 | 0.131 | 0.393 |

TABLE 1D

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(= 3000 vol ppm) | 300<br>100 → 0<br>0 → 100<br>$GeH_4 + SiH_4 = 100$ | 100 | 9 | 3 |
| Second layer | $H_2$<br>$SiH_4$ | 300<br>300 | 300 | 24 | 20 |
| Surface layer | $SiO_2$ target<br>Ar | <br>30 | 300 | 1 | 0.393 |

TABLE 2D

| Sample No. | | 201D | 202D | 203D | 204D |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.51 | 0.44 | 0.41 | 0.61 |

TABLE 3D

| Sample No. | | 301D | 302D | 303D | 304D |
|---|---|---|---|---|---|
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.19 | 0.14 | 0.1 | 0.25 |
| | Difference in average layer thickness between center and both ends in second layer (μm) | 3.1 | 3.1 | 3.1 | 3.1 |
| | Difference in layer thickness of minute portion in second layer (μm) | 0.45 | 0.42 | 0.39 | 0.50 |

TABLE 4D

| Layer constitution | Starting gas | Gas flow rate (SCCM) | Discharging Power (W) | Deposition rate (Å/sec) | Layer thickness (μm) |
|---|---|---|---|---|---|
| First layer | $H_2$ | 300 | 100 | 10 | 3 |
| | $GeH_4$ | 100 → 0 | | | |
| | $SiH_4$ | 0 → 100 | | | |
| | $B_2H_6/H_2$ | 100 | | | |
| | (= 3000 vol ppm) | $GeH_4 + SiH_4 = 100$ | | | |
| Second layer A | $H_2$ | 300 | 100 | 8 | 5 |
| | $SiH_4$ | 100 | | | |
| | $B_2H_6/H_2$ | 100 | | | |
| | (= 3000 vol ppm) | | | | |
| Layer B | $H_2$ | 300 | 300 | 24 | 20 |
| | $SiH_4$ | 300 | | | |
| Surface layer | $Al_2O_3$ target | | 300 | 1 | 0.359 |
| | Ar | 30 | | | |

TABLE 5D

| | No. | 501D | 502D | 503D | 504D |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| | Second layer Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.3 | 0.6 |

TABLE 6D

| | Sample No. | 601D | 602D | 603D | 604D |
|---|---|---|---|---|---|
| Surface structure of Al substrate | Pitch (μm) | 55 | 45 | 20 | 15 |
| | Depth (μm) | 2.41 | 1.89 | 0.65 | 0.89 |
| | Angle (degree) | 5.0 | 4.8 | 3.7 | 6.8 |
| Thickness of light receiving layer | Difference in average layer thickness between center and both ends in first layer (μm) | 0.1 | 0.1 | 0.1 | 0.1 |
| | Difference in layer thickness of minute portion in first layer (μm) | <0.1 | <0.1 | <0.1 | <0.1 |
| | Second layer Difference in average layer thickness between center and both ends in layer A (μm) | 1.49 | 1.49 | 1.49 | 1.49 |
| | Difference in layer thickness of minute portion in layer A (μm) | 0.2 | 0.12 | 0.1 | 0.3 |
| | Difference in average layer thickness between center and both ends in layer B (μm) | 2.9 | 2.9 | 2.9 | 2.9 |
| | Difference in layer thickness of minute portion in layer B (μm) | 0.51 | 0.44 | 0.41 | 0.61 |

TABLE 7D

| Layer constitution | Starting gas | Gas flow rate (SCCM) | Discharging power (W) | Deposition rate (Å/sec) | Layer thickness (μm) |
|---|---|---|---|---|---|
| First layer | $H_2$<br>$GeH_4$<br>$SiH_4$<br>$B_2H_6/H_2$<br>(= 3000 vol ppm) | 300<br>100 → 0<br>0 → 100<br>100<br>$GeH_4 + SiH_4 = 100$ | 100 | 10 | 3 |
| Second layer | $H_2$<br>$SiH_4$ | 300<br>300 | 300 | 24 | 20 |
| Surface layer | $CeO_2$ target<br>Ar | <br>30 | 300 | 1 | 0.262 |

TABLE 8D

| | Sample No. | 801D | 802D | 803D | 804D |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 1 | 1 | 1 | 1 |
| | Difference in layer thickness of minute portion in first layer (μm) | 0.2 | 0.15 | 0.1 | 0.25 |
| | Difference in average layer thickness between center and both ends in second layer (μm) | 3 | 3 | 3 | 3 |
| | Difference in layer thickness of minute portion in second layer (μm) | 0.55 | 0.4 | 0.3 | 0.6 |

TABLE 9D

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$<br>$GeH_4$<br>$SiH_4$<br>$B_2H_6/H_2$<br>(= 3000 vol ppm) | 300<br>50 → 0<br>50 → 100<br>50<br>$GeH_4 + SiH_4 = 100$ | 100 | 10 | 3 |
| Second layer | Layer A | $H_2$<br>$SiH_4$<br>$B_2H_6/H_2$<br>(= 3000 vol ppm) | 300<br>100<br>100 | 100 | 8 | 5 |
| | Layer B | $H_2$<br>$SiH_4$ | 300<br>300 | 300 | 24 | 20 |
| Surface Layer | | $CeF_4$ target<br>Ar | <br>30 | 300 | 1 | 0.366 |

TABLE 10D

| | | Sample No. | 1001D | 1002D | 1003D | 1004D |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | | Difference in average layer thickness between center and both ends in first layer (μm) | 0.12 | 0.12 | 0.12 | 0.12 |
| | | Difference in layer thickness of minute portion in first layer (μm) | 0.1> | 0.1> | 0.1> | 0.1> |
| | Second layer | Difference in average layer thickness between center and both ends in layer A (μm) | 1.5 | 1.5 | 1.5 | 1.5 |
| | | Difference in layer thickness of minute portion in layer A (μm) | 0.2 | 0.12 | 0.1 | 0.3 |
| | | Difference in average layer thickness between center and both ends in layer B (μm) | 3 | 3 | 3 | 3 |
| | | Difference in layer thickness of minute portion in layer B (μm) | 0.55 | 0.4 | 0.4 | 0.6 |

TABLE 11D

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 3 |

TABLE 11D-continued

| Layer constitution | | Starting gas | Gas flow rate (SCCM) | Discharging power (W) | Deposition rate (Å/sec) | Layer thickness (μm) |
|---|---|---|---|---|---|---|
| | | GeH$_4$ | 50 → 0 | | | |
| | | SiH$_4$ | 50 → 100 | | | |
| | | | GeH$_4$ + SiH$_4$ = 100 | | | |
| Second layer | Layer A | H$_2$ | 300 | 100 | 8 | 5 |
| | | SiH$_4$ | 100 | | | |
| | | B$_2$H$_6$/H$_2$ (= 3000 vol ppm) | 100 | | | |
| | Layer B | H$_2$ | 300 | 300 | 24 | 20 |
| | | SiH$_4$ | 300 | | | |
| Surface layer | | MgF$_2$ target | | 300 | 1 | 0.424 |
| | | Ar | 30 | | | |

TABLE 12D

| | Sample No. | 1201D | 1202D | 1203D | 1204D |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.12 | 0.12 | 0.12 | 0.12 |
| | Difference in layer thickness of minute portion in first layer (μm) | 0.1> | 0.1> | 0.1> | 0.1> |
| | Second layer — Difference in average layer thickness between center and both ends in layer A (μm) | 1.5 | 1.5 | 1.5 | 1.5 |
| | Difference in layer thickness of minute portion in layer A (μm) | 0.2 | 0.12 | 0.1 | 0.3 |
| | Difference in average layer thickness between center and both ends in layer B (μm) | 3 | 3 | 3 | 3 |
| | Difference in layer thickness of minute portion in layer B (μm) | 0.55 | 0.4 | 0.39 | 0.6 |

TABLE 13D

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | H$_2$ | 300 | 100 | 10 | 1.5 |
| | | GeH$_4$ | 100 → 50 | | | |
| | | SiH$_4$ | 0 → 50 | | | |
| | | B$_2$H$_6$/H$_2$ (= 3000 vol ppm) | 100 | | | |
| | Layer B | H$_2$ | 300 | 100 | 10 | 1.5 |
| | | GeH$_4$ | 50 → 0 | | | |
| | | SiH$_4$ | 50 → 100 | | | |
| Second layer | | H$_2$ | 300 | 300 | 24 | 20 |
| | | SiH$_4$ | 300 | | | |
| Surface layer | | Al$_2$O$_3$ target | | 300 | 1 | 0.36 |
| | | Ar | 30 | | | |

TABLE 14D

| | | Sample No. | 1401D | 1402D | 1403D | 1404D |
|---|---|---|---|---|---|---|
| Surface structure of Al substrate | | Pitch (μm) | 50 | 40 | 25 | 10 |
| | | Depth (μm) | 2.1 | 1.7 | 0.8 | 0.6 |
| | | Angle (degree) | 5.0 | 4.8 | 3.7 | 6.8 |
| Thickness of light receiving layer | First layer | Difference in average layer thickness between center and both ends in layer A (μm) | 0.2 | 0.2 | 0.2 | 0.2 |
| | | Difference in layer thickness of minute portion in layer A (μm) | 0.1 | 0.1 | 0.1 | 0.12 |
| | | Difference in average layer thickness between center and both ends in layer B (μm) | 0.22 | 0.22 | 0.22 | 0.22 |
| | | Difference in layer thickness of minute portion in layer B (μm) | 0.11 | 0.1 | 0.1 | 0.13 |
| | | Difference in average layer thickness between center and both ends in layer B (μm) | 3 | 3 | 3 | 3 |

TABLE 14D-continued

| Sample No. | 1401D | 1402D | 1403D | 1404D |
|---|---|---|---|---|
| Difference in layer thickness of minute portion in second layer (μm) | 0.55 | 0.4 | 0.39 | 0.6 |

TABLE 15D

| Condition No. | 1501D | 1502D | 1503D | 1504D | 1505D | 1506D | 1507D | 1508D | 1509D | 1510D | 1511D | 1512D |
|---|---|---|---|---|---|---|---|---|---|---|---|---|
| Material for surface layer | $ZrO_2$ | | $TiO_2$ | | $ZrO_2/TiO_2 =$ 6/1 | | $TiO_2/ZrO_2 =$ 3/1 | | $CeO_2$ | | ZnS | |
| Index of refraction | 2.00 | | 2.26 | | 2.09 | | 2.20 | | 2.23 | | 2.24 | |
| Layer thickness (μm) | 0.0975 | 0.293 | 0.0863 | 0.259 | 0.0933 | 0.280 | 0.0886 | 0.266 | 0.0874 | 0.262 | 0.0871 | 0.261 |

| Condition No. | 1513D | 1514D | 1515D | 1516D | 1517D | 1518D | 1519D | 1520D | 1521D | 1522D |
|---|---|---|---|---|---|---|---|---|---|---|
| Material for surface layer | $Al_2O_3$ | | $CeF_3$ | | $Al_2O_3/ZrO_2 =$ 1/1 | | $MgF_2$ | | $SiO_2$ | |
| Index or refraction | 1.63 | | 1.60 | | 1.68 | | 1.38 | | 1.49 | |
| Layer thickness (μm) | 0.120 | 0.359 | 0.123 | 0.366 | 0.116 | 0.348 | 0.141 | 0.424 | 0.131 | 0.393 |

TABLE 1E

| Cylinder No. | 101E | 102E | 103E | 104E |
|---|---|---|---|---|
| Pitch (μm) | 50 | 40 | 25 | 10 |
| Depth (μm) | 2.1 | 1.7 | 0.8 | 0.6 |

TABLE 1E-continued

| Cylinder No. | 101E | 102E | 103E | 104E |
|---|---|---|---|---|
| Angle (degree) | 5.0 | 4.8 | 3.7 | 6.8 |

TABLE 2E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 10 | 1 |
| | $GeH_4$ | 100 | | | |
| | $SiH_4$ | 100 | | | |
| | $B_2H_6/H_2$ (= 3000 vol ppm) | $B_2H_6/(GeH_4 + SiH_4) =$ 3/100 → 0 | | | |
| Second layer | $H_2$ | 300 | 300 | 24 | 20 |
| | $SiH_4$ | 300 | | | |
| Surface layer | $Al_2O_3$ target Ar | 30 | 300 | 1 | 0.36 |

TABLE 3E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 14 | 3 |
| | $SiH_4$ | 50 | | | |
| | $GeH_4$ | 100 | | | |
| | $B_2H_6/H_2$ (= 3000 vol ppm) | $B_2H_6/(GeH_4 + SiH_4) =$ 5/100 → 0 | | | |
| Second layer | $H_2$ | 300 | 300 | 24 | 20 |
| | $SiH_4$ | 300 | | | |
| Surface layer | $MgF_2$ target Ar | 30 | 300 | 1 | 0.39 |

TABLE 4E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 12 | 5 |
| | $SiH_4$ | 100 | | | |
| | $GeH_4$ | 50 | | | |
| | $B_2H_6/H_2$ (= 3000 vol ppm) | $B_2H_6/(GeH_4 + SiH_4) =$ 1/100 → 0 | | | |
| Second layer | $H_2$ | 300 | 300 | 24 | 20 |
| | $SiH_4$ | 300 | | | |
| Surface layer | $CeO_2$ target Ar | 30 | 300 | 1 | 0.44 |

TABLE 5E

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 8 | 7 |
| | $SiH_4$ | 135 | | | |
| | $GeH_4$ | 15 | | | |
| | $B_2H_6/H_2$ | $B_2H_6/(GeH_4 + SiH_4) =$ | | | |
| | (= 3000 vol ppm) | $1/100 \rightarrow 0$ | | | |
| Second layer | $H_2$ | 300 | 300 | 24 | 20 |
| | $SiH_4$ | 300 | | | |
| Surface layer | $TiO_2$ target | 30 | 300 | 1 | 0.259 |
| | Ar | | | | |

TABLE 6E

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 | | | |
| | | $SiH_4$ | 50 | | | |
| | | $B_2H_6/H_2$ | $150 \rightarrow 110$ | | | |
| | | (= 3000 vol ppm) | | | | |
| Second layer | Layer A | $H_2$ | 300 | 100 | 10 | 3 |
| | | $SiH_4$ | 100 | | | |
| | | $B_2H_6/H_2$ | $110 \rightarrow 0$ | | | |
| | | (3000 vol ppm) | | | | |
| | Layer B | $H_2$ | 300 | 300 | 24 | 20 |
| | | $SiH_4$ | 300 | | | |
| Surface layer | | $SiO_2$ target | 30 | 300 | 1 | 0.393 |
| | | Ar | | | | |

TABLE 7E

| | | Sample No. | | | |
|---|---|---|---|---|---|
| | | 701E | 702E | 703E | 704E |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| | Second layer  Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 8E

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 | | | |
| | | $SiH_4$ | 50 | | | |
| | | $B_2H_6/H_2$ | 100 | | | |
| | | (= 3000 vol ppm) | | | | |
| | Layer B | $H_2$ | 300 | 100 | 10 | 2 |
| | | $GeH_4$ | 50 | | | |
| | | $SiH_4$ | 50 | | | |
| Second layer | | $H_2$ | 300 | 300 | 24 | 20 |
| | | $SiH_4$ | 300 | | | |
| Surface layer | | $Al_2O_3/ZrO_2 =$ | 30 | 300 | 1 | 0.348 |
| | | 1/1 | | | | |
| | | Ar | | | | |

TABLE 9E

|  |  | Sample No. | | | |
| --- | --- | --- | --- | --- | --- |
|  |  | 901E | 902E | 903E | 904E |
| Surface structure of Al substrate | Pitch (μm) | 50 | 40 | 25 | 10 |
|  | Depth (μm) | 2.1 | 1.7 | 0.8 | 0.6 |
|  | Angle (degree) | 5.0 | 4.8 | 3.7 | 6.8 |
| Thickness of light receiving layer | First layer Difference in average layer thickness between center and both ends in layer A (μm) | 0.2 | 0.2 | 0.2 | 0.2 |
|  | Difference in layer thickness of minute portion in layer A (μm) | 0.13 | 0.11 | 0.1 | 0.15 |
|  | Difference in average layer thickness between center and both ends in layer B (μm) | 0.2 | 0.2 | 0.2 | 0.2 |
|  | Difference in layer thickness of minute portion in layer B (μm) | 0.13 | 0.12 | 0.11 | 0.14 |
|  | Difference in average layer thickness between center and both ends in second layer (μm) | 3 | 3 | 3 | 3 |
|  | Difference in layer thickness of minute portion in second layer (μm) | 0.5 | 0.44 | 0.4 | 0.6 |

TABLE 10E

| Layer constitution | | Starting gas | Gas flow rate (SCCM) | Discharging power (W) | Deposition rate (Å/sec) | Layer thickness (μm) |
| --- | --- | --- | --- | --- | --- | --- |
| First layer | Layer A | $H_2$ | 300 | 100 | 10 | 2 |
|  |  | $GeH_4$ | 50 |  |  |  |
|  |  | $SiH_4$ | 50 |  |  |  |
|  | Layer B | $H_2$ | 300 | 100 | 10 | 2 |
|  |  | $GeH_4$ | 50 |  |  |  |
|  |  | $SiH_4$ | 50 |  |  |  |
|  |  | $B_2H_6/H_2$ (= 3000 vol ppm) | 100 |  |  |  |
| Second layer |  | $H_2$ | 300 | 300 | 24 | 20 |
|  |  | $SiH_4$ | 300 |  |  |  |
| Surface layer |  | $SiO_2$ target Ar | 30 | 300 | 1 | 0.393 |

TABLE 11E

|  |  | Sample No. | | | |
| --- | --- | --- | --- | --- | --- |
|  |  | 1101F | 1102F | 1103F | 1104F |
| Surface structure of Al substrate | Pitch (μm) | 50 | 40 | 25 | 10 |
|  | Depth (μm) | 2.1 | 1.7 | 0.8 | 0.6 |
|  | Angle (degree) | 5.0 | 4.8 | 3.7 | 6.8 |
| Thickness of light receiving layer | First layer Difference in average layer thickness between center and both ends in layer A (μm) | 0.2 | 0.2 | 0.2 | 0.2 |
|  | Difference in layer thickness of minute portion in layer A (μm) | 0.11 | 0.11 | 0.1 | 0.13 |
|  | Difference in average layer thickness between center and both ends in layer B (μm) | 0.21 | 0.21 | 0.21 | 0.21 |
|  | Difference in layer thickness of minute portion in layer B (μm) | 0.13 | 0.12 | 0.11 | 0.14 |
|  | Difference in average layer thickness between center and both ends in second layer (μm) | 3 | 3 | 3 | 3 |
|  | Difference in layer thickness of minute portion in second layer (μm) | 0.4 | 0.35 | 0.3 | 0.5 |

TABLE 12E

| Layer constitution | Starting gas | Gas flow rate (SCCM) | Discharging power (W) | Deposition rate (Å/sec) | Layer thickness (μm) |
| --- | --- | --- | --- | --- | --- |
| First layer | $H_2$ | 300 | 100 | 10 | 2 |
|  | $GeH_4$ | 50 |  |  |  |
|  | $SiH_4$ | 50 |  |  |  |
|  | $B_2H_6/H_2$ (= 3000 vol ppm) | 100 |  |  |  |
| Second Layer A | $H_2$ | 300 | 100 | 8 | 3 |

TABLE 12E-continued

| Layer constitution | Starting gas | Gas flow rate (SCCM) | Discharging power (W) | Deposition rate (Å/sec) | Layer thickness (μm) |
|---|---|---|---|---|---|
| layer | $GeH_4$ | 50 | | | |
| | $SiH_4$ | 50 | | | |
| | $B_2H_6/H_2$ | 100 | | | |
| | (= 3000 vol ppm) | | | | |
| Layer B | $H_2$ | 300 | 300 | 24 | 20 |
| | $SiH_4$ | 300 | | | |
| Surface layer | $Al_2O_3$ target | 30 | 300 | 1 | 0.359 |
| | Ar | | | | |

TABLE 13E

| | | Sample No. | | | |
|---|---|---|---|---|---|
| | | 1301E | 1302E | 1303E | 1304E |
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.12 | 0.11 | 0.1 | 0.14 |
| Second layer | Difference in average layer thickness between center and both ends in layer A (μm) | 0.4 | 0.4 | 0.4 | 0.4 |
| | Difference in layer thickness of minute portion in layer A (μm) | 0.17 | 0.15 | 0.13 | 0.18 |
| | Difference in average layer thickness between center and both ends in layer B (μm) | 3.2 | 3.2 | 3.2 | 3.2 |
| | Difference in layer thickness of minute portion in layer B (μm) | 0.6 | 0.55 | 0.5 | 0.7 |

TABLE 14E

| Condition No. | 1401E | 1402E | 1403E | 1404E | 1405E | 1406E | 1407E | 1408E | 1409E | 1410E | 1411E | 1412E |
|---|---|---|---|---|---|---|---|---|---|---|---|---|
| Material for surface layer | $ZrO_2$ | | $TiO_2$ | | $ZrO_2/TiO_2 =$ 6/1 | | $TiO_2/ZrO_2 =$ 3/1 | | $CeO_2$ | | ZnS | |
| Index of refraction | 2.00 | | 2.26 | | 2.09 | | 2.20 | | 2.23 | | 2.24 | |
| Layer thickness (μm) | 0.0975 | 0.293 | 0.0863 | 0.259 | 0.0933 | 0.280 | 0.0886 | 0.266 | 0.0874 | 0.262 | 0.0871 | 0.261 |

| Condition No. | 1413E | 1414E | 1415E | 1416E | 1417E | 1418E | 1419E | 1420E | 1421E | 1422E |
|---|---|---|---|---|---|---|---|---|---|---|
| Material for surface layer | $Al_2O_3$ | | $CeF_3$ | | $Al_2O_3/ZrO_2 =$ 1/1 | | $MgF_2$ | | $SiO_2$ | |
| Index of refraction | 1.63 | | 1.60 | | 1.68 | | 1.38 | | 1.49 | |
| Layer thickness (μm) | 0.120 | 0.359 | 0.123 | 0.366 | 0.116 | 0.348 | 0.141 | 0.424 | 0.131 | 0.393 |

TABLE 1F

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 100 → 0 | | | |
| | $SiH_4$ | 0 → 100 | | | |
| | $B_2H_6/H_2$ | $GeH_4 + SiH_4 = 100$ | | | |
| | (= 3000 vol ppm) | 150 → 0 | | | |
| Second layer | $H_2$ | 300 | 300 | 24 | 20 |
| | $SiH_4$ | 300 | | | |
| Surface layer | $Al_2O_3$ target | | 300 | 1 | 0.6 |
| | Ar | 30 | | | |

TABLE 2F

| | Sample No. | 201F | 202F | 203F | 204F |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.51 | 0.44 | 0.41 | 0.61 |

TABLE 3F

| | Sample No. | 301F | 302F | 303F | 304F |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.45 | 0.42 | 0.39 | 0.50 |

TABLE 5F

| | Sample No. | 501F | 502F | 503F | 504F |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.42 | 0.40 | 0.38 | 0.48 |

TABLE 6F

| | Sample No. | 601F | 602F | 603F | 604F |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends (μm) | 3.2 | 3.2 | 3.2 | 3.2 |
| | Difference in layer thickness of minute portion (μm) | 0.40 | 0.38 | 0.36 | 0.45 |

TABLE 4F

| Layer constitution | Starting gas | Gas flow rate (SCCM) | Discharging power (W) | Deposition rate (Å/sec) | Layer thickness (μm) |
|---|---|---|---|---|---|
| First layer | $H_2$ | 300 | 100 | 9 | 3 |
| | $GeH_4$ | 50 → 0 | | | |
| | $SiH_4$ | 50 → 100 | | | |
| | $B_2H_6/H_2$ (= 3000 vol ppm) | $GeH_4 + SiH_4 = 100$ 50 → 0 | | | |
| Second layer | $H_2$ | 300 | 300 | 24 | 20 |
| | $SiH_4$ | 300 | | | |
| Surface layer | $SiO_2$ target | | 300 | 1 | 0.655 |
| | Ar | 30 | | | |

TABLE 7F

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 100 → 0 | | | |
| | Layer B | $H_2$ | 300 | 300 | 24 | 20 |
| | | $SiH_4$ | 300 | | | |
| Surface layer | | $CeO_2$ target | | 300 | 1 | 0.437 |
| | | Ar | 30 | | | |

TABLE 8F

| | Sample No. | 801F | 802F | 803F | 804F |
|---|---|---|---|---|---|
| Surface structure of Al substrate | Pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.13 | 0.11 | 0.1 | 0.2 |
| Second layer | Difference in average layer thickness between center and both ends in layer A (μm) | 0.4 | 0.4 | 0.4 | 0.4 |
| | Difference in layer thickness of minute portion in layer A (μm) | 0.13 | 0.12 | 0.11 | 0.2 |
| | Difference in average layer thickness between center and | 3 | 3 | 3 | 3 |

TABLE 8F-continued

| Sample No. | 801F | 802F | 803F | 804F |
|---|---|---|---|---|
| both ends in layer B (μm) Difference in layer thickness of minute portion in layer B (μm) | 0.6 | 0.5 | 0.4 | 0.7 |

TABLE 9F

| Layer constitution | | Starting gas | Gas flow rate (SCCM) | Discharging power (W) | Deposition rate (Å/sec) | Layer thickness (μm) |
|---|---|---|---|---|---|---|
| First layer | | $H_2$ | 300 | 100 | 10 | 2 |
| | | $GeH_4$ | 50 → 0 | | | |
| | | $SiH_4$ | 50 → 100 | | | |
| | | $B_2H_6/H_2$ (= 3000 vol ppm) | 100 | | | |
| Second layer | Layer A | $H_2$ | 300 | 100 | 10 | 3 |
| | | $SiH_4$ | 100 | | | |
| | | $B_2H_6/H_2$ (= 3000 vol ppm) | 100 → 0 | | | |
| | Layer B | $H_2$ | 300 | 300 | 24 | 20 |
| | | $SiH_4$ | 300 | | | |
| Surface layer | | $CeF_3$ target | | 300 | 1 | 0.615 |
| | | Ar | 30 | | | |

TABLE 10F

| | Sample No. | 1001F | 1002F | 1003F | 1004F |
|---|---|---|---|---|---|
| Surface structure of Al substrate | pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | Difference in average layer thickness between center and both ends in first layer (μm) | 0.2 | 0.2 | 0.2 | 0.2 |
| | Difference in layer thickness of minute portion in first layer (μm) | 0.14 | 0.12 | 0.1 | 0.16 |
| | Second layer — Difference in average layer thickness between center and both ends in layer A (μm) | 0.3 | 0.3 | 0.3 | 0.3 |
| | Difference in layer thickness of minute portion in layer A (μm) | 0.2 | 0.14 | 0.13 | 0.21 |
| | Difference in average layer thickness between center and both ends in layer B (μm) | 3 | 3 | 3 | 3 |
| | Difference in layer thickness of minute portion in layer B (μm) | 0.57 | 0.4 | 0.3 | 0.6 |

TABLE 11F

| Layer constitution | | Starting gas | Gas flow rate (SCCM) | Discharging power (W) | Deposition rate (Å/sec) | Layer thickness (μm) |
|---|---|---|---|---|---|---|
| First layer | Layer A | $H_2$ | 300 | 100 | 10 | 2 |
| | | $GeH_4$ | 50 → 25 | | | |
| | | $SiH_4$ | 50 → 75 | | | |
| | | $B_2H_6/H_2$ (= 3000 vol ppm) | 100 → 0 | | | |
| | Layer B | $H_2$ | 300 | 100 | 10 | 2 |
| | | $GeH_4$ | 25 → 0 | | | |
| | | $SiH_4$ | 75 → 100 | | | |
| Second layer | | $H_2$ | 300 | 300 | 24 | 20 |
| | | $SiH_4$ | 300 | | | |
| Surface layer | | $ZrO_2$ target | | 300 | 1 | 0.488 |
| | | Ar | 30 | | | |

TABLE 12F

| | Sample No. | 1201F | 1202F | 1203F | 1204F |
|---|---|---|---|---|---|
| Surface structure of Al substrate | pitch (μm) | 50 | 40 | 25 | 10 |
| | Depth (μm) | 2.1 | 1.7 | 0.8 | 0.6 |
| | Angle (degree) | 5.0 | 4.8 | 3.7 | 6.8 |
| Thickness of light receiving layer | First layer — Difference in average layer thickness between center and both ends in layer A (μm) | 0.2 | 0.2 | 0.2 | 0.2 |
| | Difference in layer thickness | 0.1 | 0.1 | 0.1 | 0.12 |

TABLE 12F-continued

| Sample No. | 1201F | 1202F | 1203F | 1204F |
| --- | --- | --- | --- | --- |
| of minute portion in layer A ($\mu$m) | | | | |
| Difference in average layer thickness between center and both ends in layer B ($\mu$m) | 0.22 | 0.22 | 0.22 | 0.22 |
| Difference in layer thickness of minute portion in layer B ($\mu$m) | 0.11 | 0.1 | 0.1 | 0.13 |
| Difference in average layer thickness between center and both ends in second layer ($\mu$m) | 3 | 3 | 3 | 3 |
| Difference in layer thickness of minute portion in second layer ($\mu$m) | 0.55 | 0.4 | 0.39 | 0.6 |

TABLE 13F

| Condition No. | 1301F | 1302F | 1303F | 1304F | 1305F | 1306F | 1307F | 1308F | 1309F | 1310F | 1311F | 1312F |
| --- | --- | --- | --- | --- | --- | --- | --- | --- | --- | --- | --- | --- |
| Material for surface layer | $ZrO_2$ | | $TiO_2$ | | $ZrO_2/TiO_2 =$ 6/1 | | $TiO_2/ZrO_2 =$ 3/1 | | $CeO_2$ | | $ZnS$ | |
| Index of refraction | 2.00 | | 2.26 | | 2.09 | | 2.20 | | 2.23 | | 2.24 | |
| Layer thickness ($\mu$m) | 0.0975 | 0.293 | 0.0863 | 0.259 | 0.0933 | 0.280 | 0.0886 | 0.266 | 0.0874 | 0.262 | 0.0871 | 0.261 |

| Condition No. | 1313F | 1314F | 1315F | 1316F | 1317F | 1318F | 1319F | 1320F | 1321F | 1322F |
| --- | --- | --- | --- | --- | --- | --- | --- | --- | --- | --- |
| Material for surface layer | $Al_2O_3$ | | $CeF_3$ | | $Al_2O_3/ZrO_2 =$ 1/1 | | $MgF_2$ | | $SiO_2$ | |
| Index or refraction | 1.63 | | 1.60 | | 1.68 | | 1.38 | | 1.49 | |
| Layer thickness ($\mu$m) | 0.120 | 0.359 | 0.123 | 0.366 | 0.116 | 0.348 | 0.141 | 0.424 | 0.131 | 0.393 |

What we claim is:

1. A light receiving member comprising a light receiving layer of a multi-layer structure having a first layer comprising an amorphous material containing silicon atoms and germanium atoms, a second layer comprising an amorphous material containing silicon atoms having reflection preventive function provided on a substrate successively from the substrate side, said light receiving layer having at least one pair of non-parallel interfaces within a short range and said non-parallel interfaces being arranged in a large number in at least one direction within the plane perpendicular to the layer thickness direction.

2. An electrophotographic system comprising a light receiving member comprising a light receiving layer of a multi-layer structure having a first layer comprising an amorphous material containing silicon atoms and germanium atoms a second layer comprising an amorphous material containing silicon atoms and exhibiting photoconductivity and a surface layer having reflection preventive function provided on a substrate successively from the substrate side, said light receiving layer having at least one pair of non-parallel interfaces within a short range and said non-parallel interfaces being arrangeed in a large number in at least one direction within the plane perpendicular to the layer thickness direction.

3. The invention according to claim 1 or 2, wherein the non-parallel interfaces are arranged regularly.

4. The invention according to claim 1 or 2, wherein the non-parallel interfaces are arranged in cycles.

5. The invention according to claim, 1 or 2, wherein the short range is 0.3$\mu$ to 500$\mu$.

6. The invention according to claim 1 or 2, wherein the non-parallel interfaces are formed on the basis of the unevenness arranged regularly provided on the surface of said substrate.

7. The invention according to claim 6, wherein the said unevenness is formed by reverse V-shaped linear projections.

8. The invention according to claim 7, wherein the longitudinal section of said reverse V-Shaped linear projection is substantially an isosceles triangle.

9. The invention according to claim 7, wherein the longitudinal section of said reverse-V-shaped linear projection is substantially a right triangle.

10. The invention according to claim 7, wherein the longitudinal section of said reverse-V-shaped linear projection is substantially a scalene triangle.

11. The invention according to claim 1 or 2, wherein the substrate is cylindrical.

12. The invention according to claim 11, wherein the reverse-V-shaped linear projection has a spiral structure within the plane of said substrate.

13. The invention according to claim 12, wherein the spiral structure is a multiple spiral structure.

14. The invention according to claim 7, wherein the reverse-V-shaped linear projection is divided in its edge line direction.

15. The invention according to claim 11, wherein the edge line direction of the reverse-V-shaped linear projection is along the center axis of the cylindrical substrate.

16. The invention according to claim 6, wherein the unevenness has slanted planes.

17. The invention according to claim 6, wherein the slanted planes are mirror finished.

18. The invention according to claim 6, wherein on the free surface of the light-receiving layer is formed an unevenness arranged with the same pitch as the unevenness provided on the substrate surface.

19. The invention according to claim 2, wherein the distribution state of germanium atoms in the first layer is ununiform in the layer thickness direction.

20. The invention according to claim 19, the ununiform distribution state of germanium atoms is more enriched toward the substrate side.

21. The invention according to claim 1 or 2, wherein a substance for controlling conductivity is contained in the first layer.

22. The invention according to claim 21, wherein the substance for controlling conductivity is an atom belonging to the group III or the group V of the periodic table.

23. The invention according to claim 2, wherein a substance for controlling conductivity is contained in the second layer.

24. The invention according to claim 23, wherein the substance for controlling conductivity is an atom belonging to the group III or the group V of the periodic table.

25. The invention according to claim 1 or 2, wherein the light-receiving layer has a layer region (PN) containing a substance for controlling conductivity.

26. The invention according to claim 1 or 25, wherein the distribution state of the substance for controlling conductivity in the layer region (PN) is ununiform in the layer thickness direction.

27. The invention according to claim 25, wherein the distribution state of the substance for controlling conductivity in the layer region (PN) is uniform in the layer thickness direction.

28. The invention according to claim 1 or 25, wherein the substance for controlling conductivity is an atom belonging to the group III or the group V of the periodic table.

29. The invention according to claim 25, wherein the layer region (PN) is provided in the first layer.

30. The invention according to claim 1 or 25, wherein the layer region (PN) is provided in the second layer.

31. The invention according to claim 25, wherein the layer region (PN) is provided at the end portion on the substrate side of the light-receiving layer.

32. The invention according to claim 1 or 25, wherein the layer region (PN) is provided over both the first layer and the second layer.

33. The invention according to claim 25, wherein the layer region (PN) occupies a layer region in the light-receiving layer.

34. The invention according to claim 1 or 33, wherein the content of the substance for controlling conductivity in the layer region (PN) is 0.01 to $5 \times 10^4$ atomic ppm.

35. The invention according to claim 2, wherein at least one of hydrogen atoms and halogen atoms are contained in the first layer.

36. The invention according to claim 1 or 2, wherein 0.01 to 40 atomic % of hydrogen atoms are contained in the first layer.

37. The invention according to claim 1 or 2, wherein 0.01 to 40 atomic % of halogen atoms are contained in the first layer.

38. The invention according to claim 2, wherein 0.01 to 40 atomic % as a total of hydrogen atoms and halogen atoms are contained in the first layer.

39. The invention according to claim 2, wherein 1 to 40 atomic % of hydrogen atoms are contained in the second layer.

40. The invention according to claim 2, wherein 1 to 40 atomic % of halogen atoms are contained in the second layer.

41. The invention according to claim 2, wherein 1 to 40 atomic % as a total of hydrogen atoms and halogen atoms are contained in the second layer.

42. The invention according to claim 2, wherein at least one of hydrogen atoms and halogen atoms are contained in the second layer.

43. The invention according to claim 1 or 2, wherein the first layer has a layer thickness of 30 Å to 50μ.

44. The invention according to claim 1 or 2, wherein the second layer has a layer thickness of 0.5 to 90μ.

45. The invention according to claim 1 or 2, wherein the light receiving layer has a layer thickness of 1 to 100μ.

46. The invention according to claim 1 or 2, wherein the layer thickness $T_B$ of the first layer and the layer thickness T of the second layer satisfy the relationship of $TB/T \leq 1$.

47. An electrophotographic image forming process comprising:
  (a) applying a charging treatment of the light receiving member of claim 1;
  (b) irradiating the light receiving member with a laser beam carrying information to form an electrostatic latent image; and
  (c) developing said electrostatic latent image.

48. An electrophotographic image forming process according to claim 47, wherein the non-parallel interfaces are arranged regularly.

49. An electrophotographic image forming process according to claim 47, wherein the non-parallel interfaces are arranged in cycles.

50. An electrophotographic image forming process according to claim 47, wherein the short range is 0.3 to 500μ.

51. An electrophotographic image forming process according to claim 47, wherein the non-parallel interfaces are formed on the basis of the unevenness arranged regularly provided on the surface of said substrate.

52. An electrophotographic image forming process according to claim 51, wherein the said uneveness is formed by reverse-V-shaped linear projections.

53. An electrophotographic image forming process according to claim 52, wherein the longitudinal section of said reverse-V-shaped linear projection is substantially an isosceles triangle.

54. An electrophotographic image forming process according to claim 52, wherein the longitudinal section of said reverse V-shaped linear projection is substantially a right triangle.

55. An electrophotographic image forming process according to claim 52, wherein the longitudinal section of said reverse-V-shaped linear projection is substantially a scalene triangle.

56. An electrophotographic image forming process according to claim 47, wherein the substrate is cylindrical.

57. An electrophotographic image forming process according to claim 56, wherein the reverse-V-shaped linear projection has a spiral structure within the plane of said substrate.

58. An electrophotographic image forming process according to claim 57, wherein the spiral structure is a multiple spiral structure.

59. An electrophotographic image forming process according to claim 52, wherein the reverse-V-shaped linear projection is divided in its edge line direction.

60. An electrophotographic image forming process according to claim 56, wherein the edge line direction of the reverse-V-shaped linear projection is along the center axis of the cylindrical substrate.

61. An electrophotographic image forming process according to claim 51, wherein the unevenness has slanted planes.

62. An electrophotographic image forming process according to claim 61, wherein the slanted planes are mirror finished.

63. An electrophotographic image forming process according to claim 51, wherein on the free surface of the light-receiving layer is formed an unevenness arranged with the same pitch as the unevenness provided on the substrate surface.

64. An electrophotographic image forming process according to claim 47, wherein the distribution state of germanium atoms in the first layer is ununiform in the layer thickness direction.

65. An electrophotographic image forming process according to claim 64, the ununiform distribution state of germanium atoms is more enriched toward the substrate side.

66. An electrophotographic image forming process according to claim 47, wherein a substance for controlling conductivity is contained in the first layer.

67. An electrophotographic image forming process according to claim 66 wherein the substance for controlling conductivity is an atom belonging to the group III or the Group V of the periodic table.

68. An electrophotographic image forming process member according to claim 47, wherein a substance for controlling conductivity is contained in the second layer.

69. An electrophotographic image forming process according to claim 68, wherein the substance for controlling conductivity is an atom belonging to the group III or the group V of the periodic table.

70. An electrophotographic image forming process according to claim 47, wherein the light receiving layer has a layer region (PN) containing a substance for controlling conductivity.

71. An electrophotographic image forming process according to claim 70, wherein the distribution state of the substance for controlling conductivity in the layer region (PN) in ununiform in the layer thickness direction.

72. An electrophotographic image forming process according to claim 70 wherein the distribution state of the substance for controlling conductivity in the layer region (PN) is uniform in the layer thickness direction.

73. An electrophotographic image forming process according to claim 70, wherein the substance for controlling conductivity is an atom belonging to the group III or the group V of the periodic table.

74. An electrophotographic image forming process according to claim 70, wherein the layer region (PN) is provided in the first layer.

75. An electrophotographic image forming process according to claim 70, wherein the layer region (PN) is provided in the second layer.

76. An electrophotographic image forming process according to claim 70, wherein the layer region (PN) is provided at the end portion on the substrate side of the light-receiving layer.

77. An electrophotographic image forming process according to claim 70, wherein the layer region (PN) is provided over both the first layer and the second layer.

78. An electrophotographic image forming process according to claim 70, wherein the layer region (PN) occupies a layer region in the light-receiving layer.

79. An electrophotographic image forming process according to claim 78, wherein the content of the substance for controlling conductivity in the layer region (PN) is 0.01 to $5 \times 10^4$ atomic ppm.

80. An electrophotographic image forming process according to claim 47, wherein at least one of hydrogen atoms and halogen atoms are contained in the first layer.

81. An electrophotographic image forming process according to claim 47, wherein 0.01 to 40 atomic % of hydrogen atoms are contained in the first layer.

82. An electrophotographic image forming process according to claim 47, wherein 0.01 to 40 atomic % of halogen atoms are contained in the first layer.

83. An electrophotographic image forming process according to claim 47, wherein 0.01 to 40 atomic % as a total of hydrogen atoms and halogen atoms are contained in the first layer.

84. An electrophotographic image forming process according to claim 47, wherein 1 to 40 atomic % of hydrogen atoms are contained in the second layer.

85. An electrophotographic image forming process according to claim 47, wherein 1 to 40 atomic % of halogen atoms are contained in the second layer.

86. An electrophotographic image forming process according to claim 47, wherein 1 to 40 atomic % as a total of hydrogen atoms and halogen atoms are contained in the second layer.

87. An electrophotographic image forming process according to claim 47, wherein at least one of hydrogen atoms and halogen atoms are contained in the second layer.

88. An electrophotographic image forming process according to claim 47, wherein the first layer has a layer thickness of 30 A to 50μ.

89. An electrophotographic image forming process according to claim 47, wherein the second layer has a layer thickness of 0.5 to 90μ.

90. An electrophotographic image forming process according to claim 47, wherein the light receiving layer has a layer thickness of 1 to 100μ.

91. An electrophotographic image forming process according to claim 47, wherein the layer thickness $T_B$ of the first layer and the layer thickness T of the second layer satisfy the relationship of $T_B/T \leq 1$.

* * * * *

UNITED STATES PATENT AND TRADEMARK OFFICE
CERTIFICATE OF CORRECTION

PATENT NO. : 4,701,393
DATED : October 20, 1987
INVENTOR(S) : KEISHI SAITOH, ET AL.

It is certified that error appears in the above-identified patent and that said Letters Patent is hereby corrected as shown below:

COLUMN 1

Line 11, "726,768," should read --726,768;--.
Line 11, "739,867," should read --739,867;--.

COLUMN 2

Line 9, "easiness" should read --ease--.
Line 17, "an" should read --a--.
Line 28, "iamge." should read --image.--.

COLUMN 3

Line 14, "sized" should read --sizes--.

COLUMN 4

Line 5, "so much" should read --greatly--.
Line 38, "interferance" should read --interference--.

COLUMN 5

Line 65, "accompnaying" should read --accompanying--.

COLUMN 6

Line 38, "exsit" should read --exist--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 7

Line 24, "bite" should read --bit--.
    Line 44, "reverse-V-shape" should read
         --reverse-V-shaped--.

COLUMN 8

Line 5, "earlier." should read --easily.--.
    Line 6, "is layer" should read --in layer--.

COLUMN 9

Line 25, "the all" should read --all the--.
    Line 30, "now the" should read --now to the--.
    Line 45, "A-SiGe(H,X)," should read --A-SiGe(H,X)),--.

COLUMN 10

Line 14, "as hereinafter," should read --hereinafter,--.
    Line 16, "great," should read --greatly,--.

COLUMN 12

Line 61, "thicknesses" should read --thickness--.
    Line 67, "bormine" should read --bromine--.

COLUMN 13

Line 34, "easiness" should read --ease--.
    Line 42, "easiness" should read --ease--.
    Line 63, "so called" should read --so-called--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 14

Line 11, "and gas" should read --and a gas--.
Line 25, "of the ion plating" should read --or the ion plating--.
Line 60, "siH$_2$I$_2$," should read --SiH$_2$I$_2$,--.

COLUMN 16

Line 33, "depending on" should be deleted.
Line 64, "so called" should read --so-called--.
Lines 67-68, "and/or" should be deleted.

COLUMN 17

Line 5, "(Group" should read --(group--.
Line 14, "may be" should read --may--.

COLUMN 18

Line 6, "so called" should read --so-called--.
Lines 11-12, "so called" should read --so-called--.

COLUMN 19

Line 7, "the t$_4$" should read --the position t$_4$--.
Line 21, "substance C" should read --substance (C)--.
Line 38, "in Figure," should read --in the Figure,--.
Line 43, "shown FIGS." should read --shown in FIGS.--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 20

Line 15, "Typical" should read --As typical--.

COLUMN 21

Line 41, "to be" should read --being--.
Line 43, "to be" should read --being--.
Line 54, "2008 2010" should read --2008, 2010--.
Line 61, "2023" should read --2032--.

COLUMN 22

Line 50, "twenty two" should read --twenty-two--.

COLUMN 23

Line 33, "an" should read --any--.
Line 56, "was prepared" should read --as prepared--.
Line 4, "789 nm," should read --780 nm,--.

COLUMN 24

Line 26, "outerdiameter" should read --outer diameter--.
Line 35, "1236 and 1232" should read --2008 and 2007--.
Line 54, "outerdiameter" should read --outer diameter--.
Line 63, "1236 and 1232" should read --2008 and 2007--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 25

Line 14, "outerdiameter" should read --outer diameter--.
Line 23, "1236 and 1232" should read --2008 and 2007--.
Line 43, "outerdiameter" should read --outer diameter--.
Line 52, "1236 and 1232" should read --2008 and 2007--.

COLUMN 26

Line 3, "Twenty two" should read --Twenty-two--.
Lines 7-8, "Table 29B (Condition No. 2901B-2922B)." should read --Table 7B (Condition No. 701B-722B).--.
Line 64, "outerdiameter" should read --outer diameter--.

COLUMN 27

Line 18, "outerdiameter" should read --outer diameter--.
Line 40, "outerdiameter" should read --outer diameter--.
Line 47, "Table 7C" should read --Table 9C--.
Line 65, "outerdiameter" should read --outer diameter--.

COLUMN 28

Line 21, "outerdiameter" should read --outer diameter--.
Line 44, "outerdiameter" should read --outer diameter--.
Line 59, "780 mm," should read --780 nm,--.
Line 67, "outerdiameter" should read --outer diameter--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 29

Line 23, "outerdiameter" should read --outer diameter--.
Line 30, "19A" should read --19C--.
Line 48, "outerdiameter" should read --outer diameter--.

COLUMN 30

Line 4, "outerdiameter" should read --outer diameter--.
Line 28, "outerdiameter" should read --outer diameter--.
Line 29, "FIG. 11" should read --FIG. 21--.
Line 52, "outerdiameter" should read --outer diameter--.
Line 60, "2802C-2804C" should read --2801C-2804C--.

COLUMN 31

Line 6, "examples" should read --Examples--.
Line 22, "Twenty two" should read --Twenty-two--.
Line 38, "outerdiameter" should read --outer diameter--.
Line 46, "A-Si Ge:H:B" should read --A-SiGe:H:B--.
Line 47, "1236 and 1232" should read --2008 and 2007--.
Line 66, "outerdiameter" should read --outer diameter--.

COLUMN 32

Line 6, "A-Si Ge:H:B" should read --A-SiGe:H:B--.
Line 7, "1236 and 1232" should read --2008 and 2007--.
Line 25, "outerdiameter" should read --outer diameter--.
Line 33, "A-Si Ge:H:B" should read --A-SiGe:H:B--.
Line 34, "1236 and 1232" should read --2008 and 2007--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 32 (continued)

Line 46, "501D-405D," should read --501D-504D,--.
Line 53, "outerdiameter" should read --outer diameter--.
Line 61, "A-Si Ge:H:B" should read --A-SiGe:H:B--.
Line 62, "1236 and 1232" should read --2008 and 2007--.

COLUMN 33

Line 12, "outerdiameter" should read --outer diameter--.
Line 19, "A-Si Ge:H:B" should read --A-SiGe:H:B--.
Line 20, "1236 and 1232" should read --2008 and 2007--.
Line 25, "electrion" should read --electron--.
Line 37, "outerdiameter" should read --outer diameter--.
Line 44, "A-Si Ge:H:B" should read --A-SiGe:H:B--.
Line 45, "1236 and 1232" should read --2008 and 2007--.
Line 62, "outerdiameter" should read --outer diameter--.

COLUMN 34

Line 1, "A-Si Ge:H:B" should read --A-SiGe:H:B--.
Line 2, "1236 and 1232" should read --2008 and 2007--.
Line 19, "outerdiameter" should read --outer diameter--.
Line 26, "A-Si Ge:H:B" should read --A-SiGe:H:B--.
Line 27, "1236 and 1232" should read --2008 and 2007--.
Line 43, "examples" should read --Examples--.
Line 47, "2001D-2032D)." should read --201D-304D).--.

COLUMN 36

Line 48, "outerdiameter" should read --outer diameter--.

UNITED STATES PATENT AND TRADEMARK OFFICE
CERTIFICATE OF CORRECTION

PATENT NO. : 4,701,393
DATED : October 20, 1987
INVENTOR(S) : KEISHI SAITOH, ET AL.

It is certified that error appears in the above-identified patent and that said Letters Patent is hereby corrected as shown below:

COLUMN 37

Line 4, "outerdiameter" should read --outer diameter--.
Line 28, "outerdiameter" should read --outer diameter--.
Line 52, "outerdiameter" should read --outer diameter--.

COLUMN 38

Line 37, "outerdiameter" should read --outer diameter--.
Lines 40-41, "electrophotographic" should read
        --electrophotography--.
Line 52, "electrophotographic" should read
        --electrophotography--.
Line 63, "outerdiameter" should read --outer diameter--.

COLUMN 39

Line 22, "outerdiameter" should read --outer diameter--.
Line 49, "outerdiameter" should read --outer diameter--.
Line 53, "A-Si" should read --of A-Si--.

COLUMN 40

Line 8, "outerdiameter" should read --outer diameter--.
Line 34, "outerdiameter" should read --outer diameter--.
Line 59, "outerdiameter" should read --outer diameter--.

UNITED STATES PATENT AND TRADEMARK OFFICE
CERTIFICATE OF CORRECTION

PATENT NO. : 4,701,393
DATED : October 20, 1987
INVENTOR(S) : KEISHI SAITOH, ET AL.

It is certified that error appears in the above-identified patent and that said Letters Patent is hereby corrected as shown below:

COLUMN 43

Table 4B,
"$SiH_4$     50 → 100" should read --$SiH_4$     50 → 100--.
$GeH_4$ +                                                           $GeH_4$ +
$SiH_4$ =                                                           $SiH_4$ =
100                                                                     100
$H_2$                300                                   $H_2$       300

COLUMN 44

Table 7B,
"717B       718B" should read --717B       718B--.
$Al_2O_3/ZrO_2$ =                             $Al_2O_3/ZrO_2$ =
                                                                  1/1
    1.68                                        1.68

COLUMN 49

Table 11C,
"Second layer     $H_2$" should read --Second layer     $H_2$ --.
                        SiH                                            $SiH_4$

COLUMN 51

Table 13C, "Layer     $H_2$" should read --Layer     $H_2$ --.
                     A       GeH                          A       $GeH_4$
Table 13C, "(μm)" should read --(μm)--.
                        2                                       2
                       22                                    2

UNITED STATES PATENT AND TRADEMARK OFFICE
CERTIFICATE OF CORRECTION

PATENT NO. : 4,701,393
DATED : October 20, 1987
INVENTOR(S) : KEISHI SAITOH, ET AL.

It is certified that error appears in the above-identified patent and that said Letters Patent is hereby corrected as shown below:

COLUMNS 61-62

Table 29C, "2917C   2918C" $Al_2O_3/ZrO_2 = 1.68$" should read --2917C   2918C  $Al_2O_3/ZrO_2 = 1/1$  1.68--.

COLUMN 64

Table 4D, "Deposition rate ($Å/sec$) ($\mu m$)   Layer thickness" should read --Deposition rate ($Å/sec$)   Layer thickness ($\mu m$)--.

COLUMN 79

Table 10F, "pitch ($\mu m$)" should read --Pitch ($\mu m$)--.
Table 12F, "pitch ($\mu m$)" should read --Pitch ($\mu m$)--.

COLUMN 81

Line 40, "atoms having" should read --atoms and exhibiting photoconductivity and a surface layer having--.
Line 58, "arrangeed" should read --arranged--.
Line 65, "claim, 1" should read --claim 1--.

UNITED STATES PATENT AND TRADEMARK OFFICE
CERTIFICATE OF CORRECTION

PATENT NO. : 4,701,393
DATED : October 20, 1987
INVENTOR(S) : KEISHI SAITOH, ET AL.

It is certified that error appears in the above-identified patent and that said Letters Patent is hereby corrected as shown below:

COLUMN 82

Line 38, "reverse V-shaped" should read
        --reverse-V-shaped--.
    Line 41, "reverse V-shaped" should read
        --reverse-V-shaped--.
    Line 65, "claim 6," should read --claim 16,--.

COLUMN 83

Line 6, "claim 19, the" should read --claim 19, wherein
        the--.
    Line 16, "claim 2," should read --claim 1 or 2,--.

COLUMN 84

Line 14, "30 Åto" should read --30 Å to--.
    Line 23, "$T_B/T \leq 1$." should read --$T_B/T \leq 1$.--.
    Line 26, "of" should read --to--.
    Line 47, "uneveness" should read --unevenness--.
    Line 56, "reverse V-shaped" should read
        --reverse-V-shaped--.

COLUMN 85

Line 27, "claim 64, the" should read --claim 64, wherein
        the--.
    Line 34, "claim 66" should read --claim 66,--.
    Line 36, "Group V" should read --group V--.
    Line 38, "member" should be deleted.
    Line 52, "(PN) in" should read --(PN) is--.
    Line 55, "claim 70" should read --claim 70,--.

UNITED STATES PATENT AND TRADEMARK OFFICE
CERTIFICATE OF CORRECTION

PATENT NO. : 4,701,393

DATED : October 20, 1987

INVENTOR(S) : KEISHI SAITOH, ET AL.

It is certified that error appears in the above-identified patent and that said Letters Patent is hereby corrected as shown below:

COLUMN 86

Line 50, "30 A" should read --30 Å--.
Line 50, "TB/T≤1." should read --$T_B/T \leq 1$.--.

Signed and Sealed this

Seventeenth Day of January, 1989

Attest:

DONALD J. QUIGG

Attesting Officer

Commissioner of Patents and Trademarks